(12) United States Patent
Yamazaki et al.

(10) Patent No.: US 10,741,590 B2
(45) Date of Patent: Aug. 11, 2020

(54) PEELING METHOD AND MANUFACTURING METHOD OF FLEXIBLE DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masataka Sato, Tochigi (JP); Masakatsu Ohno, Utsunomiya (JP); Seiji Yasumoto, Tochigi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/087,811

(22) PCT Filed: Apr. 3, 2017

(86) PCT No.: PCT/IB2017/051883
§ 371 (c)(1),
(2) Date: Sep. 24, 2018

(87) PCT Pub. No.: WO2017/178919
PCT Pub. Date: Oct. 19, 2017

(65) Prior Publication Data
US 2019/0333942 A1   Oct. 31, 2019

(30) Foreign Application Priority Data

Apr. 12, 2016 (JP) ................................. 2016-079822
Apr. 19, 2016 (JP) ................................. 2016-083656

(51) Int. Cl.
*H01L 21/00* (2006.01)
*H01L 27/12* (2006.01)
(Continued)

(52) U.S. Cl.
CPC ........ *H01L 27/1262* (2013.01); *B23K 26/351* (2015.10); *H01L 27/127* (2013.01);
(Continued)

(58) Field of Classification Search
CPC ... H01L 27/1262; H01L 27/127; H01L 51/56; H01L 51/009; H01L 2021/775; B23K 26/351
See application file for complete search history.

(56) References Cited

U.S. PATENT DOCUMENTS 5,492,843 A * 2/1996 Adachi ............... H01L 27/1214
                                                          438/479
6,521,511 B1   2/2003 Inoue et al.
(Continued)

FOREIGN PATENT DOCUMENTS

CN   001925187 A   3/2007
EP     1575085 A   9/2005
(Continued)

OTHER PUBLICATIONS

International Search Report (Application No. PCT/IB2017/051883) dated Jun. 27, 2017.
(Continued)

*Primary Examiner* — Richard A Booth
(74) *Attorney, Agent, or Firm* — Robinson Intellectual Property Law Office; Eric J. Robinson

(57) ABSTRACT

A peeling method at low cost with high mass productivity is provided. A silicon layer having a function of releasing hydrogen by irradiation with light is formed over a formation substrate, a first layer is formed using a photosensitive material over the silicon layer, an opening is formed in a portion of the first layer that overlaps with the silicon layer by a photolithography method and the first layer is heated to form a resin layer having an opening, a transistor including
(Continued)

an oxide semiconductor in a channel formation region is formed over the resin layer, a conductive layer is formed to overlap with the opening of the resin layer and the silicon layer, the silicon layer is irradiated with light using a laser, and the transistor and the formation substrate are separated from each other.

26 Claims, 27 Drawing Sheets

(51) Int. Cl.
  *B23K 26/351* (2014.01)
  *H01L 51/00* (2006.01)
  *H01L 51/56* (2006.01)
  *H01L 21/77* (2017.01)

(52) U.S. Cl.
  CPC .......... *H01L 51/0097* (2013.01); *H01L 51/56* (2013.01); *H01L 2021/775* (2013.01)

(56) References Cited

U.S. PATENT DOCUMENTS

| | | | |
|---|---|---|---|
| 6,878,607 | B2 | 4/2005 | Inoue et al. |
| 7,105,422 | B2 | 9/2006 | Utsunomiya |
| 7,262,088 | B2 | 8/2007 | Kodaira et al. |
| 7,456,059 | B2 | 11/2008 | Kodaira et al. |
| 7,745,252 | B2 | 6/2010 | Suzuki et al. |
| 8,222,666 | B2 | 7/2012 | Hatano et al. |
| 8,450,769 | B2 | 5/2013 | Hatano et al. |
| 8,664,658 | B2 | 3/2014 | Yoneda |
| 8,766,314 | B2 | 7/2014 | Hatano et al. |
| 8,956,891 | B2 | 2/2015 | Chida |
| 9,425,371 | B2 | 8/2016 | Hatano et al. |
| 9,799,716 | B2 | 10/2017 | Hatano et al. |
| 2004/0099926 | A1* | 5/2004 | Yamazaki ............ G02F 1/1362 257/632 |
| 2005/0006647 | A1 | 1/2005 | Utsunomiya |
| 2007/0048970 | A1 | 3/2007 | Suzuki et al. |
| 2007/0254456 | A1* | 11/2007 | Maruyama ....... G06K 19/07749 438/458 |
| 2010/0148209 | A1 | 6/2010 | Hatano et al. |
| 2014/0234532 | A1 | 8/2014 | Umeda et al. |
| 2014/0339517 | A1 | 11/2014 | Park et al. |
| 2014/0346473 | A1 | 11/2014 | Park et al. |
| 2017/0294463 | A1 | 10/2017 | Yamazaki et al. |

FOREIGN PATENT DOCUMENTS

| | | |
|---|---|---|
| EP | 1760798 A | 3/2007 |
| JP | 11-026733 A | 1/1999 |
| JP | 2004-349513 A | 12/2004 |
| JP | 2007-096277 A | 4/2007 |
| JP | 2008-159935 A | 7/2008 |
| JP | 2009-260166 A | 11/2009 |
| JP | 2010-165673 A | 7/2010 |
| JP | 2010-206040 A | 9/2010 |
| JP | 2012-156523 A | 8/2012 |
| JP | 2015-072361 A | 4/2015 |
| JP | 2015-223823 A | 12/2015 |
| KR | 2008-0004231 A | 1/2008 |
| KR | 2011-0106370 A | 9/2011 |
| WO | WO-2010/071089 | 6/2010 |
| WO | WO-2014/126210 | 8/2014 |

OTHER PUBLICATIONS

Written Opinion (Application No. PCT/IB2017/051883) dated Jun. 27, 2017.

* cited by examiner

FIG. 7A
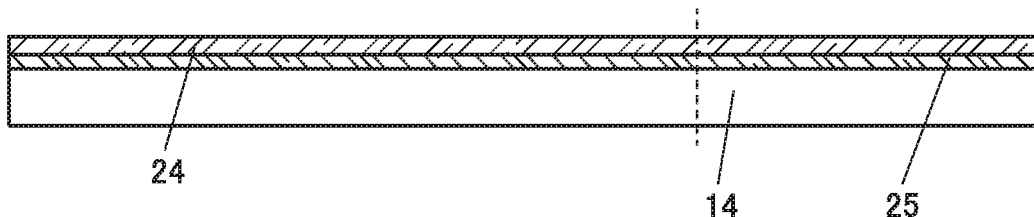
FIG. 7B
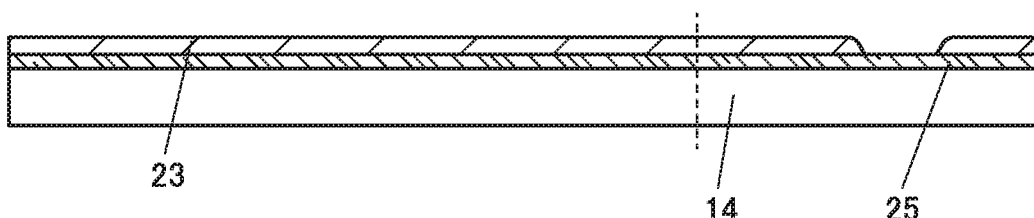
FIG. 7C
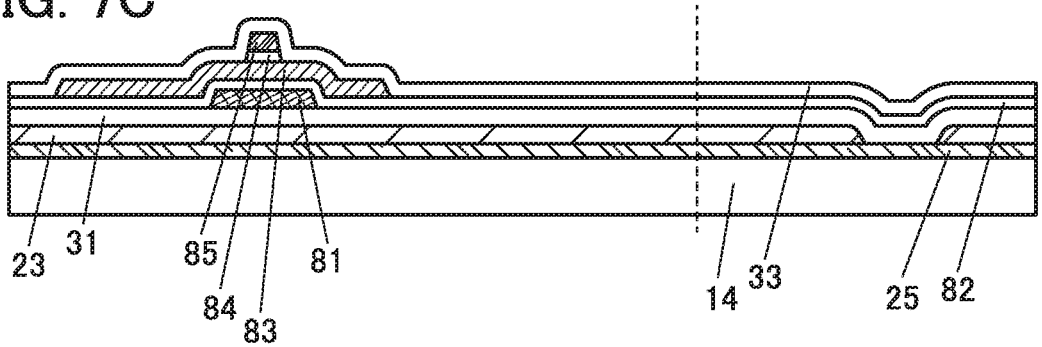
FIG. 7D
FIG. 7E
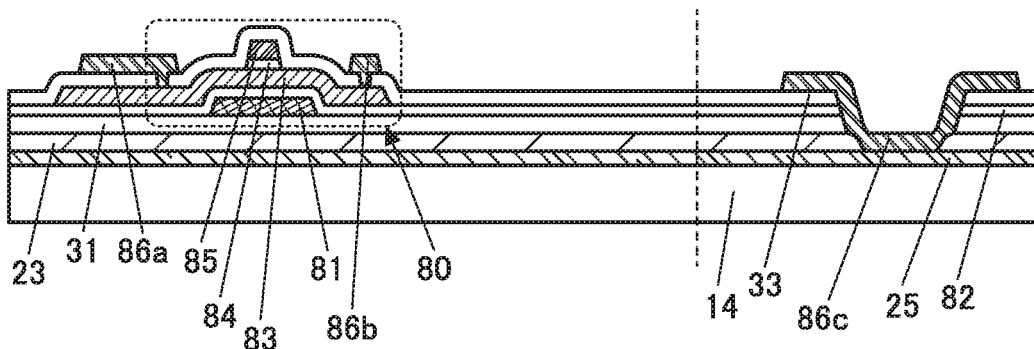

PEELING METHOD AND MANUFACTURING METHOD OF FLEXIBLE DEVICE

TECHNICAL FIELD

One embodiment of the present invention relates to a peeling method and a manufacturing method of a flexible device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

Note that in this specification and the like, a semiconductor device generally means a device that carries out its function by utilizing semiconductor characteristics. A transistor, a semiconductor circuit, an arithmetic device, a memory device, and the like are embodiments of the semiconductor device. In addition, an imaging device, an electro-optical device, a power generation device (including a thin film solar cell, an organic thin film solar cell, and the like), and an electronic device each may include a semiconductor device.

BACKGROUND ART

Display devices using organic EL (Electro Luminescence) elements or liquid crystal elements have been known. Examples of the display device also include a light-emitting device provided with a light-emitting element such as a light-emitting diode (LED: Light Emitting Diode), and electronic paper performing display with an electrophoretic method or the like.

The organic EL element generally has a structure in which a layer containing a light-emitting organic compound is provided between a pair of electrodes. When voltage is applied to the element, light emission from the light-emitting organic compound can be obtained. With the use of such an organic EL element, a thin, lightweight, high-contrast, and low-power-consumption display device can be achieved.

In addition, when a semiconductor element such as a transistor and a display element such as the organic EL element are formed over a substrate (film) having flexibility, a flexible display device can be achieved.

Disclosed in Patent Document 1 is a method for manufacturing a flexible display device in which a supporting substrate provided with a heat-resistant resin layer and electronic elements with a sacrificial layer therebetween is irradiated with laser light to peel the heat-resistant resin layer from a glass substrate.

PRIOR ART DOCUMENT

Patent Document

[Patent Document 1] Japanese Published Patent Application No. 2015-223823

SUMMARY OF THE INVENTION

Problems to be Solved by the Invention

An object of one embodiment of the present invention is to provide a novel peeling method. An object of one embodiment of the present invention is to provide a peeling method at low cost with high mass productivity. An object of one embodiment of the present invention is to perform peeling using a large-sized substrate.

An object of one embodiment of the present invention is to provide a manufacturing method of a novel flexible device. An object of one embodiment of the present invention is to provide a highly reliable flexible device. An object of one embodiment of the present invention is to manufacture a flexible device at low temperatures. An object of one embodiment of the present invention is to provide a manufacturing method of a flexible device with a simplified manufacturing process. An object of one embodiment of the present invention is to provide a manufacturing method of a flexible device at low cost with high mass productivity. An object of one embodiment of the present invention is to manufacture a flexible device using a large-sized substrate.

Note that the description of the objects does not disturb the existence of other objects. One embodiment of the present invention does not necessarily achieve all the objects. Other objects can be derived from the description of the specification, the drawings, and the claims.

Means for Solving the Problems (1) One embodiment of the present invention is a peeling method including forming a silicon layer over a formation substrate, forming a first layer over the silicon layer with use of a photosensitive material, forming an opening in a portion of the first layer that overlaps with the silicon layer by a photolithography method to form a resin layer having the opening, forming, over the resin layer, a transistor including an oxide semiconductor in a channel formation region, forming a conductive layer to overlap with the opening of the resin layer and the silicon layer, irradiating the silicon layer with light using a laser, and separating the transistor and the formation substrate from each other.

(2) An embodiment of the present invention is a peeling method including forming an island-shaped silicon layer over a formation substrate, forming a first layer over the formation substrate and the silicon layer with use of a photosensitive material, forming an opening in a portion of the first layer that overlaps with the silicon layer by a photolithography method to form a resin layer having the opening, forming, over the resin layer, a transistor including an oxide semiconductor in a channel formation region, forming a conductive layer to overlap with the opening of the resin layer and the silicon layer, irradiating the silicon layer and the resin layer with light using a laser, and separating the transistor and the formation substrate from each other.

In each of the above (1) and (2), the silicon layer has a function of releasing hydrogen. Specifically, the silicon layer has a function of releasing hydrogen when irradiated with light.

In each of the above (1) and (2), the first layer is preferably formed using a thermosetting material.

In each of the above (1) and (2), the first layer is preferably formed to have a thickness greater than or equal to 0.1 µm and less than or equal to 3 µm. In the above (2), the resin layer is preferably formed to have a thickness greater than a thickness of the silicon layer and less than or equal to 3 µm.

In each of the above (1) and (2), a hydrogenated amorphous silicon layer is preferably formed as the silicon layer.

In each of the above (1) and (2), a linear laser is preferably used as the laser.

In each of the above (1) and (2), the conductive layer is preferably formed using the same material and the same fabrication process as an electrode included in the transistor.

In each of the above (1) and (2), the first layer is preferably formed using a solution having a viscosity greater than or equal to 5 cP and less than 100 cP.

In each of the above (1) and (2), the first layer is preferably formed with a spin coater.

In each of the above (1) and (2), it is preferable that the resin layer be formed by heating the first layer at a first temperature and the transistor be formed at a temperature lower than the first temperature.

In each of the above (1) and (2), the silicon layer is preferably irradiated with light from the formation substrate side using the laser.

An embodiment of the present invention is a method for manufacturing a flexible device including separating the transistor and the formation substrate from each other using the peeling method of (1) or (2) to expose the conductive layer, and electrically connecting the conductive layer and a circuit board to each other through the opening of the resin layer.

An embodiment of the present invention is a method for manufacturing a flexible device including separating the transistor and the formation substrate from each other using the peeling method of (1) to expose the silicon layer, removing the silicon layer by etching to expose the conductive layer, and electrically connecting the conductive layer and a circuit board to each other through the opening of the resin layer.

An embodiment of the present invention is a method for manufacturing a flexible device including separating the transistor and the formation substrate from each other using the peeling method of (2) to expose the silicon layer, and electrically connecting the silicon layer and a circuit board to each other.

Effects of the Invention

One embodiment of the present invention can provide a novel peeling method. One embodiment of the present invention can provide a peeling method at low cost with high mass productivity. One embodiment of the present invention can perform peeling using a large-sized substrate.

One embodiment of the present invention can provide a manufacturing method of a novel flexible device. One embodiment of the present invention can provide a highly reliable flexible device. One embodiment of the present invention can manufacture a flexible device at low temperatures. One embodiment of the present invention can provide a manufacturing method of a flexible device with a simplified manufacturing process. One embodiment of the present invention can provide a manufacturing method of a flexible device at low cost with high mass productivity. One embodiment of the present invention can manufacture a flexible device using a large-sized substrate.

Note that the description of the effects does not disturb the existence of other effects. One embodiment of the present invention does not necessarily achieve all the effects. Other effects can be derived from the description of the specification, drawings, and claims.

BRIEF DESCRIPTION OF THE DRAWINGS

FIG. 7 Drawings illustrating an example of a manufacturing method of a flexible device.

EMBODIMENTS FOR CARRYING OUT THE INVENTION

Figure 1A:
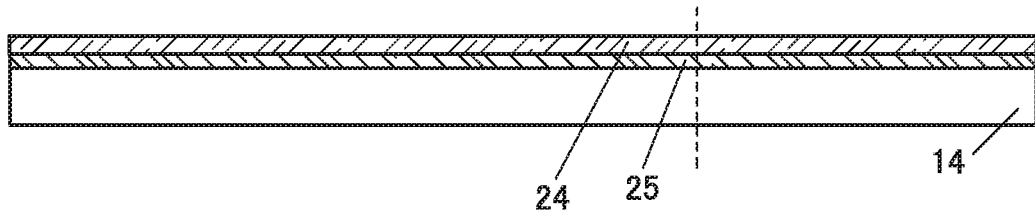
FIG. 1 Drawings illustrating an example of a manufacturing method of a flexible device.

Embodiments will be described in detail with reference to the drawings. Note that the present invention is not limited to the following description, and it will be easily understood by those skilled in the art that the modes and details can be changed in various ways without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings and are not repeatedly described. Furthermore, the same hatch pattern is used for portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". For another example, the term "insulating film" can be changed into the term "insulating layer".

Embodiment 1

In this embodiment, a peeling method and a manufacturing method of a flexible device of embodiments of the present invention will be described.

One embodiment of the present invention is a peeling method including forming a silicon layer having a function of releasing hydrogen over a formation substrate, forming a first layer having a thickness greater than or equal to 0.1 μm and less than or equal to 3 μm over the silicon layer with use of a photosensitive and thermosetting material, forming an opening in a portion of the first layer that overlaps with the silicon layer by a photolithography method and heating the first layer to form a resin layer having the opening, forming, over the resin layer, a transistor including an oxide semiconductor in a channel formation region, forming a conductive layer to overlap with the opening of the resin layer and the silicon layer, irradiating the silicon layer with light using a laser, and separating the transistor and the formation substrate from each other.

In one embodiment of the present invention, the silicon layer is irradiated with light using a laser. When the silicon layer is heated by absorbing light, hydrogen is released. For example, hydrogen is released in a gaseous state. Hydrogen in the gaseous state might form a foam-like region (or a brittle region or a region with a void) in the silicon layer or on the surface of the silicon layer.

The silicon layer is irradiated with light to release hydrogen from the silicon layer. This reduces the adhesion between the silicon layer and the layer in contact with the silicon layer, and separation can be performed at the interface between the two layers. Alternatively, by releasing hydrogen from the silicon layer, the silicon layer itself is damaged so that separation can be performed in the silicon layer.

In one embodiment of the present invention, an oxide semiconductor is used for the channel formation region of the transistor. With the use of an oxide semiconductor, the maximum process temperature can be lower than that in the case of using low-temperature polysilicon (LTPS (Low Temperature Poly-Silicon)).

In the case of using LTPS for the channel formation region of the transistor, the resin layer is required to have heat resistance because a temperature of approximately 500° C. to 550° C. needs to be applied. The resin layer is also required to have a larger thickness to relieve the damage in a laser crystallization step.

In contrast, the transistor using an oxide semiconductor can be formed at a temperature lower than or equal to 350° C., or even lower than or equal to 300° C. Thus, the resin layer is not required to have high heat resistance. Accordingly, the heat resistant temperature of the resin layer can be low, offering a wide choice of materials. Furthermore, the transistor using an oxide semiconductor does not need a laser crystallization step; thus, the resin layer can be thinned. Since the resin layer is not required to have high heat resistance and can be thinned, the manufacturing cost of a device can be expected to significantly fall. In addition, as compared with the case of using LTPS, the steps can be simplified, which is preferable.

In one embodiment of the present invention, the transistor and the like are formed at temperatures lower than or equal to the allowable temperature limit of the resin layer. Here, the heat resistance of the resin layer can be measured by, for example, a weight loss percentage due to heating, specifically, the 5% weight loss temperature or the like. The 5% weight loss temperature of the resin layer can be lower than or equal to 450° C., lower than or equal to 400° C., lower than 400° C., or lower than 350° C., for example. For example, the transistor is manufactured at a temperature lower than or equal to 350° C., or even lower than or equal to 300° C.

In one embodiment of the present invention, irradiation with laser light is performed with a linear laser. Laser apparatuses for the manufacturing lines for LTPS and the like can be used, which enables effective use of the apparatuses. The linear laser condenses laser light in a long rectangular shape (the laser light is shaped into a linear laser beam) so that the silicon layer is irradiated with light.

In one embodiment of the present invention, the resin layer is manufactured using a photosensitive material. With use of the photosensitive material, a resin layer with a desired shape can be easily formed. For example, an opening can be easily formed in the resin layer.

For example, the opening is formed in the resin layer, a conductive layer is provided to cover the opening, and the conductive layer is separated from the formation substrate, so that an electrode part of which is exposed (also referred to as a rear electrode or a through electrode) can be formed. The electrode can also be used as an external connection terminal.

In this embodiment, an example in which the external connection terminal is electrically connected to a circuit board, such as a flexible printed circuit (FPC), through the opening formed in the resin layer is shown.

A flexible device can be manufactured using the peeling method of one embodiment of the present invention. A flexible device of one embodiment of the present invention and a manufacturing method thereof will be specifically described below with reference to FIG. 1-FIG. 6. In the example shown here, a display device including a transistor and an organic EL element (also referred to as an active matrix organic EL display device) is manufactured as the flexible device. By using a flexible material for a substrate, the display device can be a foldable (Foldable) organic EL display device.

Note that thin films included in the display device (e.g., insulating films, semiconductor films, or conductive films) can be formed by a sputtering method, a chemical vapor deposition (CVD: Chemical Vapor Deposition) method, a vacuum evaporation method, a pulsed laser deposition (PLD: Pulsed Laser Deposition) method, an atomic layer deposition (ALD: Atomic Layer Deposition) method, or the like. As the CVD method, a plasma-enhanced chemical vapor deposition (PECVD: Plasma Enhanced Chemical Vapor Deposition) method or a thermal CVD method may be used. As the thermal CVD method, for example, a metal organic chemical vapor deposition (MOCVD: Metal Organic CVD) method may be used.

Thin films included in the display device (e.g., insulating films, semiconductor films, or conductive films) can be formed by a method such as spin coating, dipping, spray coating, ink-jetting, dispensing, screen printing, offset printing, a doctor knife, slit coating, roll coating, curtain coating, or knife coating.

Thin films included in the display device can be processed by a lithography method or the like. Alternatively, island-shaped thin films may be formed by a film formation method using a blocking mask. A nanoimprinting method, a sand-blasting method, a lift-off method, or the like may also be used for the processing of thin films. Examples of a photolithography method include a method in which a resist mask is formed over a thin film to be processed, the thin film is processed by etching or the like, and the resist mask is removed; and a method in which a photosensitive thin film is formed, exposed to light, and developed to be processed into a desired shape.

In the case of using light for exposure in a lithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV: Extreme Ultra-violet) or X-rays may be used. Instead of the light for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Manufacturing Method Example 1A]

First, a silicon layer 25 is formed over a formation substrate 14 (FIG. 1(A)).

The formation substrate 14 has rigidity high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

The silicon layer 25 has a function of absorbing light to generate heat, thereby releasing hydrogen.

As the silicon layer 25, a silicon layer from which hydrogen is released by heating can be used, for example. In particular, a hydrogenated amorphous silicon (a-Si:H) layer is preferably used. The hydrogenated amorphous silicon layer can be formed by, for example, a plasma CVD method using a deposition gas containing $SiH_4$. A silicon layer having crystallinity may also be used as the silicon layer 25. After the silicon layer 25 is formed, heat treatment may be performed under an atmosphere containing hydrogen in order that the silicon layer 25 can contain a large amount of hydrogen.

The thickness of the silicon layer 25 is preferably greater than or equal to 1 nm and less than or equal to 200 nm and further preferably greater than or equal to 5 nm and less than or equal to 100 nm.

Next, a first layer 24 is formed using a photosensitive and thermosetting material (FIG. 1(A)).

Specifically, the photosensitive and thermosetting material is deposited to a thickness greater than or equal to 0.1 μm and less than or equal to 3 μm.

Figure 1B:
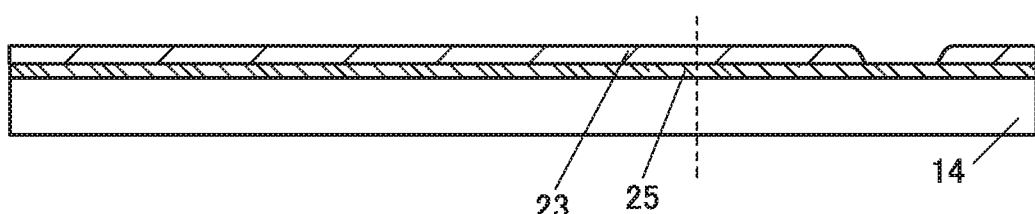

Since the first layer 24 is formed using the photosensitive material in one embodiment of the present invention, part of the first layer 24 can be removed by a lithography method using light. Specifically, after the material is deposited, heat treatment (also referred to as pre-baking) for removing a solvent is performed, and then light exposure is performed using a photomask. Next, development is performed, whereby an unnecessary portion can be removed. Then, the first layer 24 processed into a desired shape is heated (heating is also referred to as post-baking), so that a resin layer 23 is formed (FIG. 1(B)). FIG. 1(B) illustrates an example in which an opening that reaches the silicon layer 25 is provided in the resin layer 23.

By heating, released gas components (e.g., hydrogen, water) in the resin layer 23 can be reduced. It is particularly preferable that heating be performed at a temperature higher than or equal to the formation temperature of each layer formed over the resin layer 23. For example, in the case where the formation temperature of the transistor is below 350° C., the film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 23 in the manufacturing process of the transistor can be significantly reduced.

In the post-baking, heating is preferably performed at a temperature at which hydrogen is less likely to be released from the silicon layer 25. Accordingly, a defect such as peeling of the silicon layer 25 before irradiation with laser light can be prevented and a decrease in yield can be suppressed. Note that the steps performed before the silicon layer 25 is irradiated with laser light, which will be described later, are also preferably performed at a temperature at which hydrogen is less likely to be released from the silicon layer 25.

The resin layer 23 has flexibility. The formation substrate 14 has lower flexibility than the resin layer 23 does.

The resin layer 23 (the first layer 24) is preferably formed using a photosensitive polyimide resin (also referred to as photo sensitive polyimide, PSPI).

Other examples of the photosensitive and thermosetting material which can be used to form the resin layer 23 (the first layer 24) include an acrylic resin, an epoxy resin, a polyamide resin, a polyimide-amide resin, a siloxane resin, a benzocyclobutene-based resin, and a phenol resin.

The resin layer 23 (the first layer 24) is preferably formed with a spin coater. By a spin coating method, a thin film can be uniformly formed over a large-sized substrate.

The resin layer 23 (first layer 24) is preferably formed using a solution having a viscosity greater than or equal to 5 cP and less than 500 cP, further preferably greater than or equal to 5 cP and less than 100 cP, and still further preferably greater than or equal to 10 cP and less than or equal to 50 cP. As the viscosity of the solution is lower, application is performed more easily. In addition, as the viscosity of the solution is lower, inclusion of air bubbles can be reduced more; thus, a high-quality film can be formed.

The resin layer 23 preferably has a thickness greater than or equal to 0.01 μm and less than 10 μm, further preferably greater than or equal to 0.1 μm and less than or equal to 5 μm, still further preferably greater than or equal to 0.1 μm and less than or equal to 3 µm, and yet still further preferably greater than or equal to 0.5 µm and less than or equal to 1 µm. With a solution having low viscosity, the resin layer 23 having a small thickness can be easily formed. When the resin layer 23 is formed to be thin, the display device can be manufactured at low cost. In addition, the display device can be light-weight and thin. The display device can also have higher flexibility. Note that the thickness of the resin layer 23 is not limited thereto, and may be greater than or equal to 10 µm. For example, the resin layer 23 may have a thickness greater than or equal to 10 µm and less than or equal to 200 µm. The resin layer 23 having a thickness greater than or equal to 10 µm is favorable because the rigidity of the display device can be increased.

The resin layer 23 (the first layer 24) can also be formed by a method such as dip coating, spray coating, ink jetting, dispensing, screen printing, offset printing, a doctor knife, slit coating, roll coating, curtain coating, or knife coating.

The resin layer 23 preferably has a thermal expansion coefficient greater than or equal to 0.1 ppm/° C. and less than or equal to 20 ppm/° C. and further preferably greater than or equal to 0.1 ppm/° C. and less than or equal to 10 ppm/° C. As the resin layer 23 has a lower thermal expansion coefficient, breakage of a transistor or the like which is caused by the heating can be further suppressed.

In the case where the resin layer 23 is positioned on the display surface side of the display device, the resin layer 23 preferably has a high visible-light transmitting property.

Figure 1C:
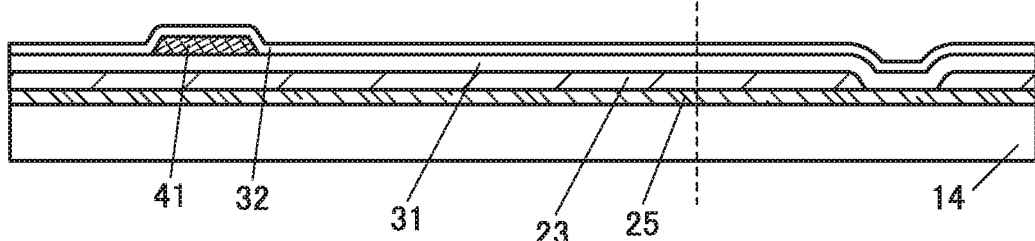

Next, an insulating layer 31 is formed over the resin layer 23 (FIG. 1(C)).

The insulating layer 31 is formed at a temperature lower than or equal to the allowable temperature limit of the resin layer 23. The insulating layer 31 is preferably formed at a temperature lower than or equal to the heating temperature in the above-described post-baking.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have a higher density and a higher barrier property as the deposition temperature becomes higher.

In the case of using an inorganic insulating film for the insulating layer 31, the substrate temperature at the deposition is preferably higher than or equal to room temperature (25° C.) and lower than or equal to 350° C. and further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. For example, it is preferable to use a stack including an organic insulating material and an inorganic insulating material for the insulating layer 31. As the organic insulating material, the resin that can be used for the resin layer 23 can be used.

In the case of using an organic insulating film for the insulating layer 31, a temperature applied to the resin layer 23 at the formation of the insulating layer 31 is preferably higher than or equal to room temperature and lower than or equal to 350° C. and further preferably higher than or equal to room temperature and lower than or equal to 300° C.

Figure 1D:
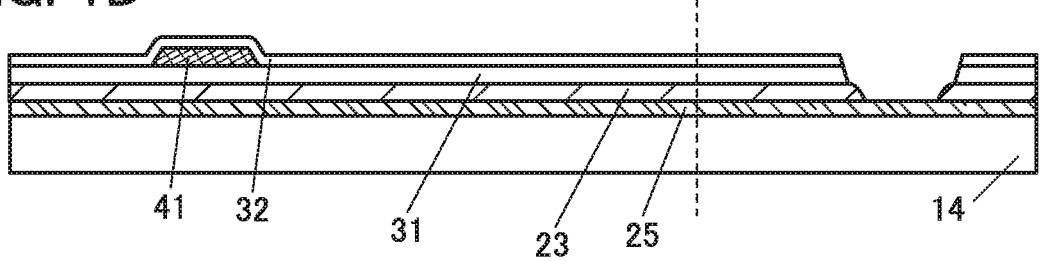
Figure 1E:
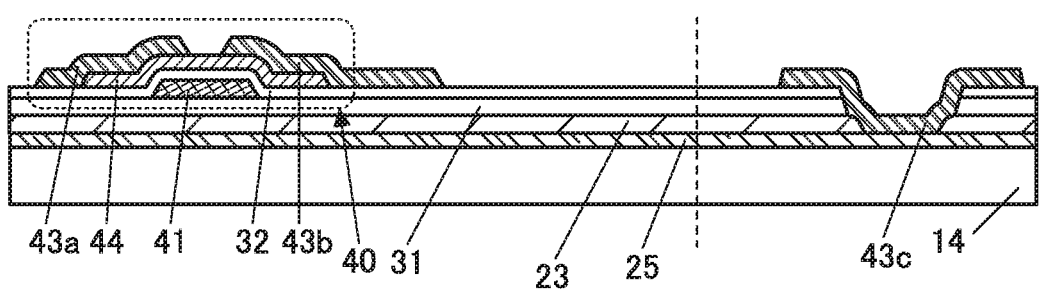

Next, a transistor 40 is formed over the insulating layer 31 (FIGS. 1(C) to (E)).

There is no particular limitation on the structure of the transistor included in the display device. For example, a planar transistor, a staggered transistor, or an inverted staggered transistor may be used. In addition, a top-gate transistor or a bottom-gate transistor may be used. Alternatively, gate electrodes may be provided above and below a channel.

Here, the case where a bottom-gate transistor including an oxide semiconductor layer 44 is manufactured as the transistor 40 is shown.

In one embodiment of the present invention, an oxide semiconductor is used as a semiconductor of a transistor. A semiconductor material having a wider bandgap and a lower carrier density than silicon is preferably used because an off-state current of the transistor can be reduced.

The transistor 40 is formed at a temperature lower than or equal to the allowable temperature limit of the resin layer 23. In addition, the transistor 40 is preferably formed at a temperature lower than or equal to the heating temperature in the above-described post-baking.

Specifically, first, a conductive layer 41 is formed over the insulating layer 31 (FIG. 1(C)). The conductive layer 41 can be formed in the following manner: a conductive film is formed, a resist mask is formed, the conductive film is etched, and then the resist mask is removed.

The substrate temperature at the deposition of the conductive film is preferably higher than or equal to room temperature and lower than or equal to 350° C. and further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or indium tin oxide containing silicon may be used. Alternatively, a semiconductor such as an oxide semiconductor or polycrystalline silicon whose resistance is lowered by containing an impurity element, for example, or silicide such as nickel silicide may be used. A film including graphene may be used as well. The film including graphene can be formed, for example, by reducing a film containing a graphene oxide formed into a film. A semiconductor such as an oxide semiconductor containing an impurity element may also be used. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

Next, an insulating layer 32 is formed (FIG. 1(C)). For the insulating layer 32, the inorganic insulating film that can be used for the insulating layer 31 can be referred to.

Next, openings are provided in parts of the insulating layer 31 and the insulating layer 32 that overlap with the opening of the resin layer 23 (FIG. 1(D)). Here, an example in which the openings are formed at a time in the insulating layer 31 and the insulating layer 32 is shown. The openings may be formed in separate steps in the insulating layer 31 and the insulating layer 32. For example, the opening of the insulating layer 31 may be formed before the conductive layer 41 is formed. The silicon layer 25 is exposed when the openings are provided.

Then, the oxide semiconductor layer 44 is formed (FIG. 1(E)). The oxide semiconductor layer 44 can be formed in the following manner: an oxide semiconductor film is formed, a resist mask is formed, the oxide semiconductor film is etched, and then the resist mask is removed.

The substrate temperature at the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the deposition of the oxide semiconductor film. To fabricate a transistor having high field-effect mobility, however, the percentage of oxygen flow rate (partial pressure of oxygen) at the deposition of the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor film preferably contains a stabilizer in addition to them.

Examples of the stabilizer are, in addition to the above-described metals for M, lanthanoids such as lanthanum, cerium, praseodymium, neodymium, samarium, europium, gadolinium, terbium, dysprosium, holmium, erbium, thulium, ytterbium, and lutetium.

As an oxide semiconductor, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an In—Ga—Zn-based oxide means an oxide containing In, Ga, and Zn as its main components and there is no limitation on the ratio of In to Ga and Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor is preferably 2 eV or more, further preferably 2.5 eV or more, and still further preferably 3 eV or more. The use of such an oxide semiconductor having a wide energy gap leads to a reduction in the off-state current of a transistor.

In the case where the oxide semiconductor is an In-M-Zn-based oxide, it is preferable that the atomic ratio of metal elements of a sputtering target used to deposit a film of the In-M-Zn-based oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed semiconductor layer varies from the above atomic ratios of metal elements of the sputtering targets in a range of ±40%.

The oxide semiconductor film can be formed by a sputtering method. Alternatively, for example, a PLD method, a PECVD method, a thermal CVD method, an ALD method, a vacuum evaporation method, or the like may be used.

Next, a conductive layer 43a, a conductive layer 43b, and a conductive layer 43c are formed (FIG. 1(E)). The conductive layer 43a, the conductive layer 43b, and the conductive layer 43c can be formed in the following manner: a conductive film is formed, a resist mask is formed, the conductive film is etched, and then the resist mask is removed. The conductive layer 43a and the conductive layer 43b are connected to the oxide semiconductor layer 44. The conductive layer 43c is connected to the silicon layer 25 through the openings provided in the resin layer 23, the insulating layer 31, and the insulating layer 32.

Note that during the processing of the conductive layer 43a and the conductive layer 43b, part of the oxide semiconductor layer 44 that is not covered by the resist mask might be etched to be thin.

The substrate temperature at the deposition of the conductive film is preferably higher than or equal to room temperature and lower than or equal to 350° C. and further preferably higher than or equal to room temperature and lower than or equal to 300° C.

In the above manner, the transistor 40 can be manufactured (FIG. 1(E)). In the transistor 40, part of the conductive layer 41 functions as a gate, part of the insulating layer 32 functions as a gate insulating layer, and the conductive layer 43a and the conductive layer 43b each function as any one of a source and a drain.

Figure 2A:
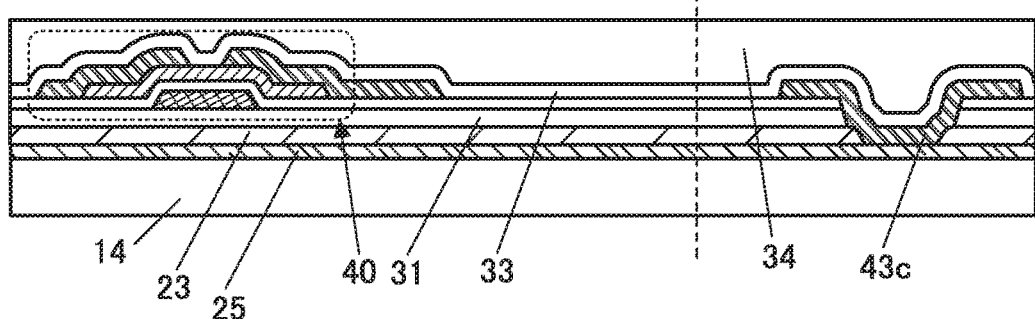
FIG. 2 Drawings illustrating an example of a manufacturing method of a flexible device.

Next, an insulating layer 33 that covers the transistor 40 is formed (FIG. 2(A)). The insulating layer 33 can be formed in a manner similar to that of the insulating layer 31.

For the insulating layer 33, it is preferable to use an oxide insulating film, such as a silicon oxide film or a silicon oxynitride film, formed at a low temperature in the above range in an atmosphere containing oxygen. Furthermore, an insulating film with low oxygen diffusibility and oxygen permeability, such as a silicon nitride film, is preferably stacked over the silicon oxide film or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, an extremely highly reliable flexible device can be achieved.

Through the above steps, the insulating layer 31, the transistor 40, and the insulating layer 33 can be formed over the resin layer 23 (FIG. 2(A)).

At this stage, by separating the formation substrate 14 and the transistor 40 using a method described later, a flexible device including no display element can be manufactured. For example, by forming the transistor 40, or a capacitor, a resistor, a wiring, and the like in addition to the transistor 40, and separating the formation substrate 14 and the transistor 40 by the method described later, a flexible device including a semiconductor circuit can be manufactured.

Then, an insulating layer 34 is formed over the insulating layer 33 (FIG. 2(A)). Since the insulating layer 34 is a layer having a surface on which a display element is formed later, it preferably functions as a planarization layer. As the insulating layer 34, the organic insulating film or the inorganic insulating film that can be used as the insulating layer 31 can be used.

The insulating layer 34 is formed at a temperature lower than or equal to the allowable temperature limit of the resin layer 23. In addition, the insulating layer 34 is preferably formed at the same temperature as or a temperature lower than the heating temperature in the above-described post-baking.

In the case of using an organic insulating film as the insulating layer 34, the temperature applied to the resin layer 23 at the formation of the insulating layer 34 is preferably higher than or equal to room temperature and lower than or equal to 350° C., further preferably higher than or equal to room temperature and lower than or equal to 300° C.

In the case of using an inorganic insulating film as the insulating layer 34, the substrate temperature at the deposition is preferably higher than or equal to room temperature and lower than or equal to 350° C., further preferably higher than or equal to 100° C. and lower than or equal to 300° C.

Next, an opening that reaches the conductive layer 43b is formed in the insulating layer 34 and the insulating layer 33.

Figure 2B:
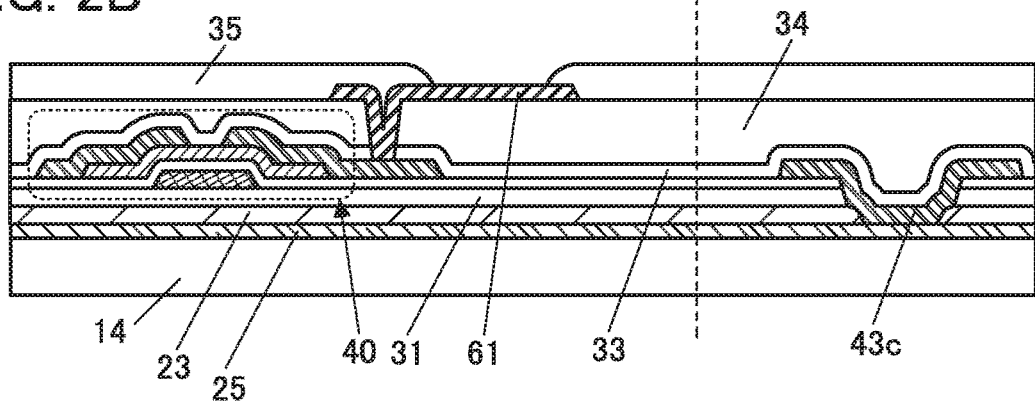

After that, a conductive layer 61 is formed (FIG. 2(B)). Part of the conductive layer 61 functions as a pixel electrode of a display element 60. The conductive layer 61 can be formed by forming a conductive film, forming a resist mask, etching the conductive film, and removing the resist mask.

The conductive layer 61 is formed at a temperature lower than or equal to the allowable temperature limit of the resin layer 23. The conductive layer 61 is preferably formed at a temperature lower than or equal to the heating temperature in the above-described post-baking.

The substrate temperature at the deposition of the conductive film is preferably higher than or equal to room temperature and lower than or equal to 350° C., further preferably higher than or equal to room temperature and lower than or equal to 300° C.

Subsequently, an insulating layer 35 that covers an end portion of the conductive layer 61 is formed (FIG. 2(B)). As the insulating layer 35, the organic insulating film or the inorganic insulating film that can be used as the insulating layer 31 can be used.

The insulating layer 35 is formed at a temperature lower than or equal to the allowable temperature limit of the resin layer 23. The insulating layer 35 is preferably formed at the same temperature as or a temperature lower than the heating temperature in the above-described post-baking.

In the case of using an organic insulating film for the insulating layer 35, a temperature applied to the resin layer 23 at the formation of the insulating layer 35 is preferably higher than or equal to room temperature and lower than or equal to 350° C., further preferably higher than or equal to room temperature and lower than or equal to 300° C.

In the case of using an inorganic insulating film as the insulating layer 35, the substrate temperature at the deposition is preferably higher than or equal to room temperature and lower than or equal to 350° C., further preferably higher than or equal to 100° C. and lower than or equal to 300° C.

Figure 2C:
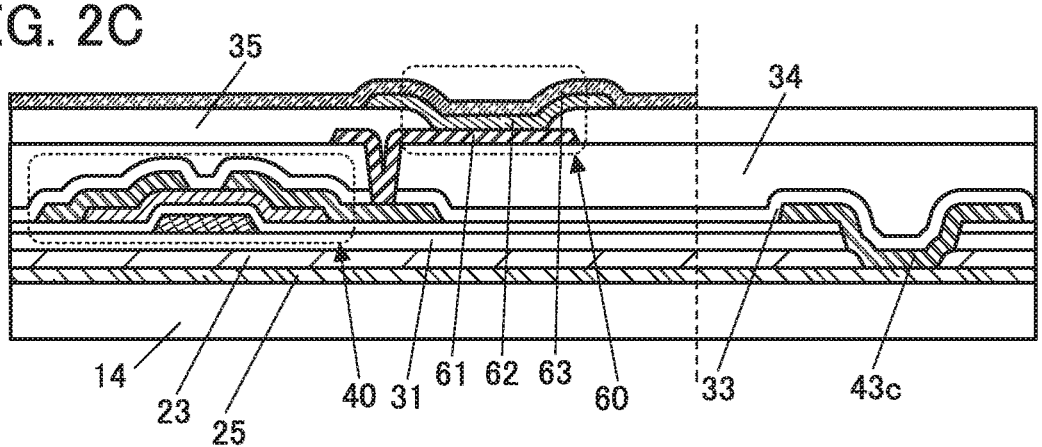

Then, an EL layer 62 and a conductive layer 63 are formed (FIG. 2(C)). Part of the conductive layer 63 functions as a common electrode of the display element 60.

The EL layer 62 can be formed by an evaporation method, a coating method, a printing method, a discharge method, or the like. In the case where the EL layer 62 is separately formed for each individual pixel, an evaporation method using a blocking mask such as a metal mask, an ink-jet method, or the like can be used. In the case of not separately forming the EL layer 62 for each individual pixel, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The EL layer 62 and the conductive layer 63 are each formed at a temperature lower than or equal to the allowable temperature limit of the resin layer 23. The EL layer 62 and the conductive layer 63 are each preferably formed at the same temperature as or a temperature lower than the heating temperature in the above-described post-baking. The conductive layer 63 is formed at a temperature lower than or equal to the allowable temperature limit of the EL layer 62.

Specifically, the temperatures in the formation of the EL layer 62 and the conductive layer 63 are each preferably higher than or equal to room temperature and lower than or equal to 350° C., further preferably higher than or equal to room temperature and lower than or equal to 300° C.

In the above manner, the display element 60 can be formed (FIG. 2(C)). The display element 60 has a structure in which the conductive layer 61 part of which functions as a pixel electrode, the EL layer 62, and the conductive layer 63 part of which functions as a common electrode are stacked.

Although an example in which a top-emission light-emitting element is manufactured as the display element 60 has been described here, one embodiment of the present invention is not limited thereto.

The light-emitting element may be of a top-emission type, bottom-emission type, or dual-emission type. A conductive film that transmits visible light is used as the electrode through which light is extracted. A conductive film that reflects visible light is preferably used as the electrode through which light is not extracted.

Figure 2D:
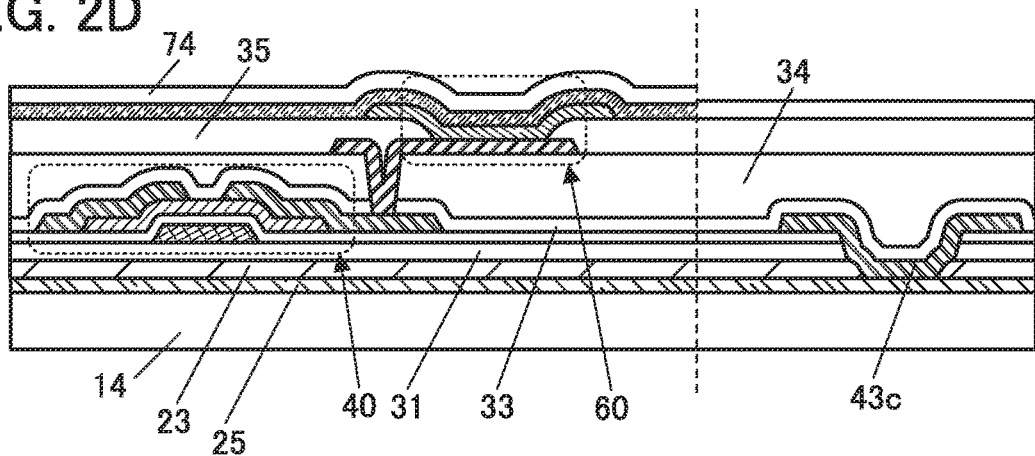

Next, an insulating layer 74 is formed so as to cover the conductive layer 63 (FIG. 2(D)). The insulating layer 74 functions as a protective layer that suppresses diffusion of impurities such as water into the display element 60. The display element 60 is sealed with the insulating layer 74.

The insulating layer 74 is formed at a temperature which is lower than or equal to the allowable temperature limit of the resin layer 23 and lower than or equal to the allowable temperature limit of the display element 60. The insulating layer 74 is preferably formed at a temperature lower than or equal to the heating temperature in the above-described post-baking.

For example, the insulating layer 74 preferably has a structure including an inorganic insulating film with a high barrier property that can be used as the insulating layer 31. A stack including an inorganic insulating film and an organic insulating film can also be used.

Figure 3A:
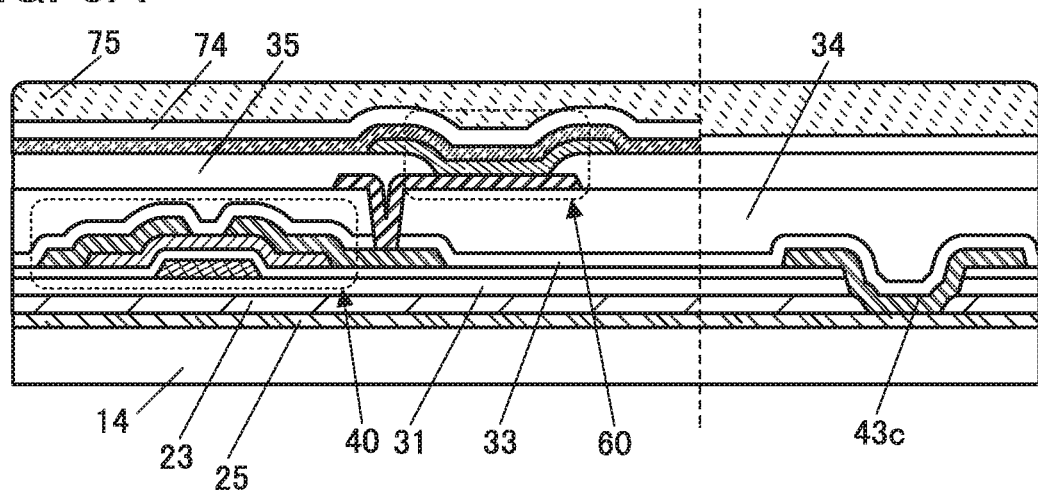
FIG. 3 Drawings illustrating an example of a manufacturing method of a flexible device.

Then, a protective layer 75 is formed over the insulating layer 74 (FIG. 3(A)). The protective layer 75 can be used as a layer positioned on the outermost surface of a display device 10. The protective layer 75 preferably has a high visible-light transmitting property.

The above-described organic insulating film that can be used as the insulating layer 31 is preferably used as the protective layer 75 because damage or a crack on a surface of the display device can be suppressed. The protective layer 75 may have a structure in which the organic insulating film, a hard coat layer (e.g., a silicon nitride layer) for protecting the surface from damage or the like, a layer made of a material that can disperse pressure (e.g., an aramid resin layer), and the like are stacked.

Figure 3B:
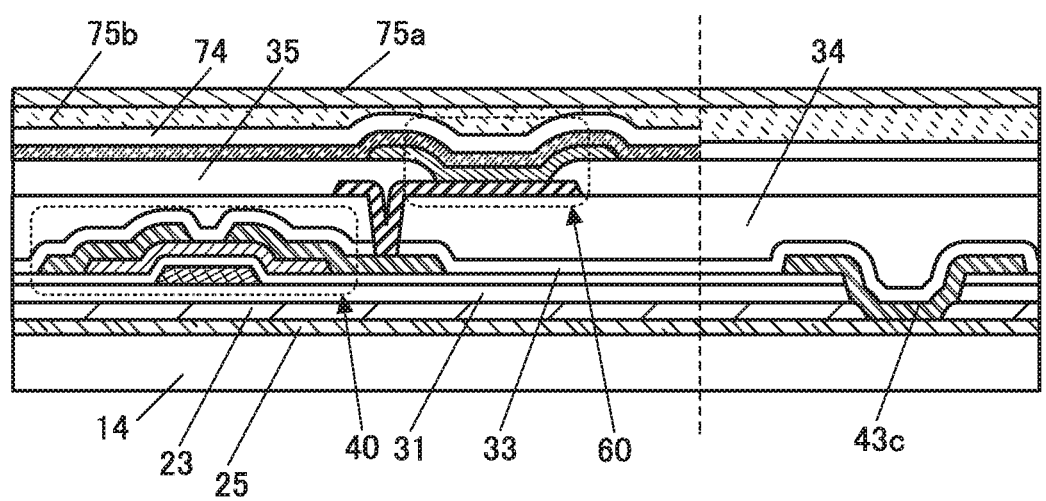

FIG. 3(B) illustrates an example in which a substrate 75a is attached to the insulating layer 74 with a bonding layer 75b. As the substrate 75a, a resin and the like can be given. The substrate 75a preferably has flexibility.

As the bonding layer 75b, a variety of curable adhesives such as a reactive curable adhesive, a thermosetting adhesive, an anaerobic adhesive, and a photocurable adhesive such as an ultraviolet curable adhesive can be used. An adhesive sheet or the like may be used.

For the substrate 75a, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used.

Figure 4A:
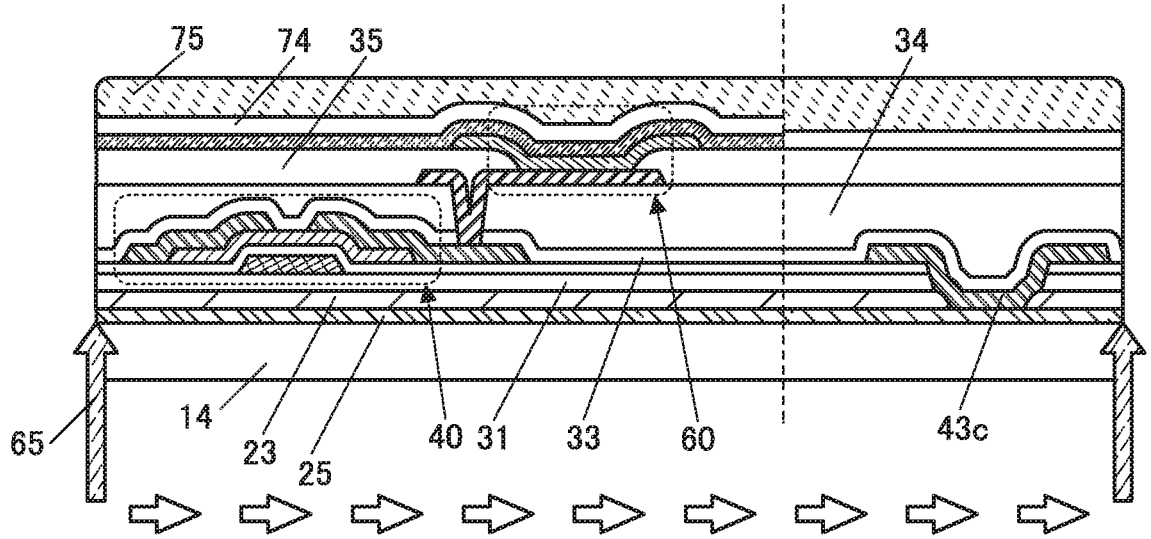
FIG. 4 Drawings illustrating examples of a manufacturing method of a flexible device.

Next, the silicon layer 25 is irradiated with laser light 65 through the formation substrate 14 (FIG. 4(A)). The laser light 65 is, for example, a linear laser beam with which scanning is performed from the left side to the right side in FIG. 4(A), and the long axis is perpendicular to the scanning direction and the incident direction (from bottom to top).

By irradiation with the laser light 65, the silicon layer 25 is heated and hydrogen is released from the silicon layer 25. The hydrogen released at this time is in a gaseous state, for example. The released gas remains near the interface between the silicon layer 25 and the resin layer 23 (the conductive layer 43c in the opening of the resin layer 23) or near the interface between the silicon layer 25 and the formation substrate 14; thus, the force of peeling them is generated. Consequently, the adhesion between the silicon layer 25 and the resin layer 23 (the conductive layer 43c in the opening of the resin layer 23) or the adhesion between the silicon layer 25 and the formation substrate 14 is reduced and a state where peeling is easily performed can be formed.

Part of the hydrogen released from the silicon layer 25 remains in the silicon layer 25 in some cases. Thus, the silicon layer 25 is embrittled and separation is likely to occur inside the silicon layer 25 in some cases.

As the laser light 65, light having a wavelength at least part of which passes through the formation substrate 14 and is absorbed by the silicon layer 25 is selected and used. The laser light 65 is preferably light having a wavelength which is absorbed by the resin layer 23. The laser light 65 is preferably light having a wavelength range from visible light to ultraviolet light. For example, light having a wavelength of greater than or equal to 200 nm and less than or equal to 400 nm, preferably greater than or equal to 250 nm and less than or equal to 350 nm, can be used. In particular, an excimer laser having a wavelength of 308 nm is preferably used because the productivity is excellent. The excimer laser is preferable because it can be used also for laser crystallization of LTPS, so that the existing LTPS production line device can be used and new capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because it does not use a gas and thus the running cost can be reduced to approximately ⅓ of that of an excimer laser. Further alternatively, a pulsed laser such as a picosecond laser may be used.

In the case where linear laser light is used as the laser light 65, the formation substrate 14 and a light source are relatively moved to perform scanning with the laser light 65; in this way, a region that is to be peeled is irradiated with the laser light 65.

The resin layer 23 might absorb part of the laser light 65. Thus, an element such as a transistor is irradiated with the laser light 65 which has passed through the silicon layer 25 and the influence on the characteristics of the element can be suppressed.

Figure 4B:
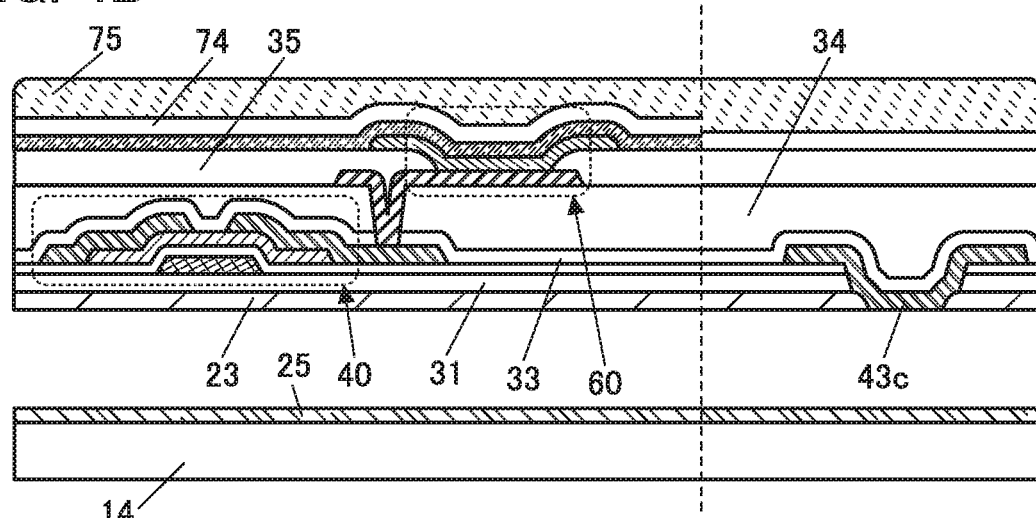
Figure 4C:
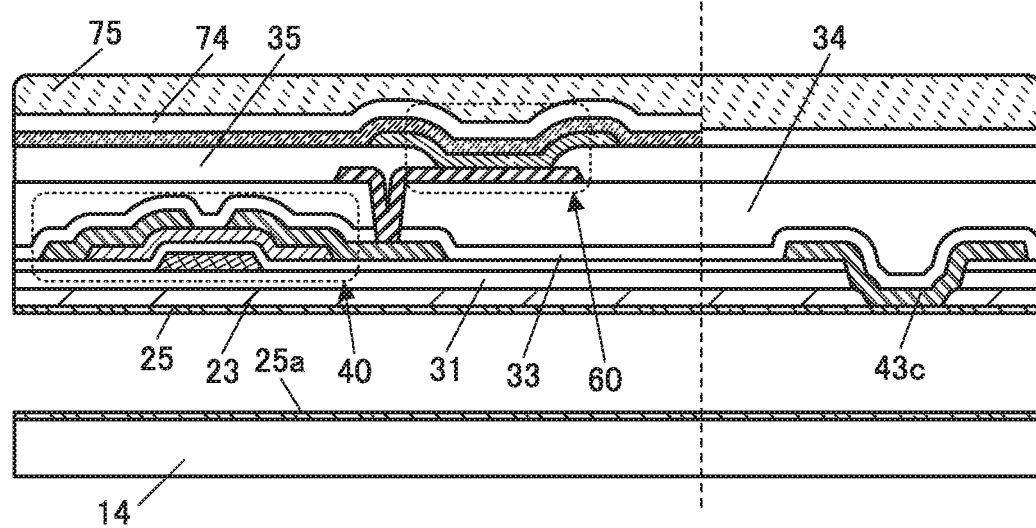

Next, the formation substrate 14 and the transistor 40 are separated from each other (FIG. 4(B) or FIG. 4(C)).

FIG. 4(B) illustrates an example in which separation occurs at the interface between the silicon layer 25 and the resin layer 23 and the interface between the silicon layer 25 and the conductive layer 43c.

FIG. 4(C) illustrates an example in which separation occurs in the silicon layer 25. Part of the silicon layer (a silicon layer 25a) remains over the formation substrate 14. The thickness of the silicon layer 25 remaining on the resin layer 23 side and the conductive layer 43c side is reduced as compared with that in FIG. 4(A).

The silicon layer 25 that remains on the resin layer 23 side and the conductive layer 43c side is preferably removed. For example, the silicon layer 25 can be removed by etching such as plasma etching or wet etching.

The formation substrate 14 can be reused by removing the silicon layer 25a remaining on the formation substrate 14 side.

The formation substrate 14 can be peeled by applying a perpendicular tensile force to the silicon layer 25, for example. Specifically, the formation substrate 14 can be peeled by attaching a mechanism to part of the top surface of the protective layer 75 and pulling up the protective layer 75.

A separation trigger is preferably formed by inserting a sharp instrument such as a knife between the formation substrate 14 and the insulating layer 31.

Figure 5:
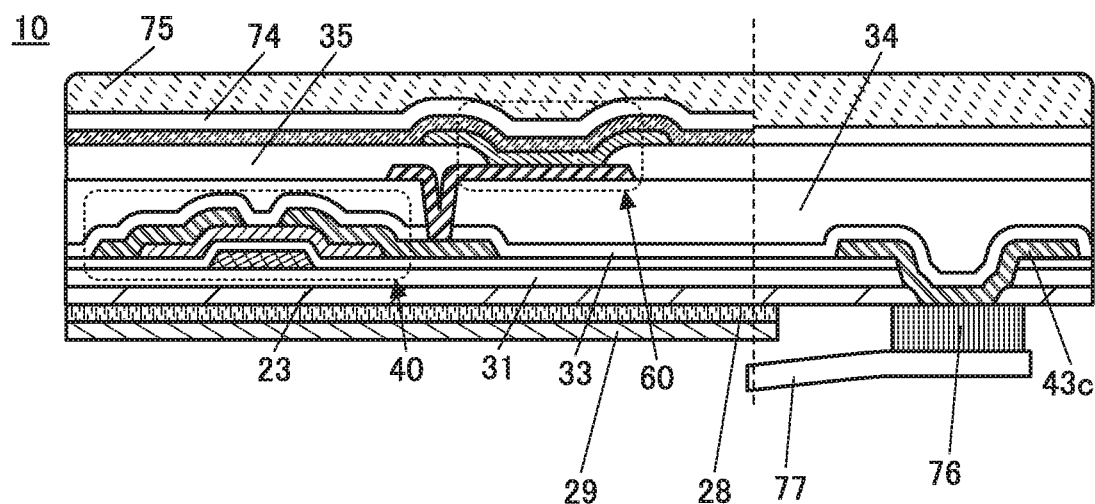
FIG. 5 A drawing illustrating an example of a flexible device.

The separation of the formation substrate 14 and the transistor 40 can manufacture the display device 10 (FIG. 5). The display device 10 can remain being bent or can be bent repeatedly, for example.

As illustrated in FIG. 5, a substrate 29 may be attached to the surface of the resin layer 23 that is exposed by the separation, with a bonding layer 28. Note that the substrate 29 and the bonding layer 28 are provided in a position that does not overlap with the conductive layer 43c. The substrate 29 can function as a supporting substrate of the flexible device. FIG. 5 illustrates an example in which the substrate 29 is attached to the resin layer 23 with the bonding layer 28.

The material that can be used for the substrate 75a can be used for the substrate 29.

Then, the conductive layer 43c and an FPC 77 are electrically connected to each other through a connector 76 (FIG. 5).

As the connector 76, various anisotropic conductive films (ACF: Anisotropic Conductive Film), anisotropic conductive pastes (ACP: Anisotropic Conductive Paste), and the like can be used.

In this embodiment, an example using a top-emission light-emitting element is described. In the case where the conductive layer 43c is exposed from the protective layer 75 side and electrically connected to the FPC 77, a display region cannot overlap with the FPC 77 because the protective layer 75 is on the display surface side, and thus there is a limit to a region where the FPC 77 overlaps with the display device. In contrast, in one embodiment of the present invention, the photosensitive material is used for the resin layer 23, so that the conductive layer 43c can be exposed from the side opposite to the display surface. Therefore, the conductive layer 43c and the FPC 77 can be electrically connected to each other through the opening provided in the resin layer 23. With such a structure, the FPC 77 can be positioned on the side opposite to the display surface. Thus, a space for bending the FPC 77 for incorporating the display device in an electronic device can be saved, which enables the electronic device to be smaller.

Through the above steps, the display device using an oxide semiconductor for the transistor and employing a separate coloring method for an EL element can be manufactured (FIG. 5).

[Manufacturing Method Example 2A]

Figure 6A:
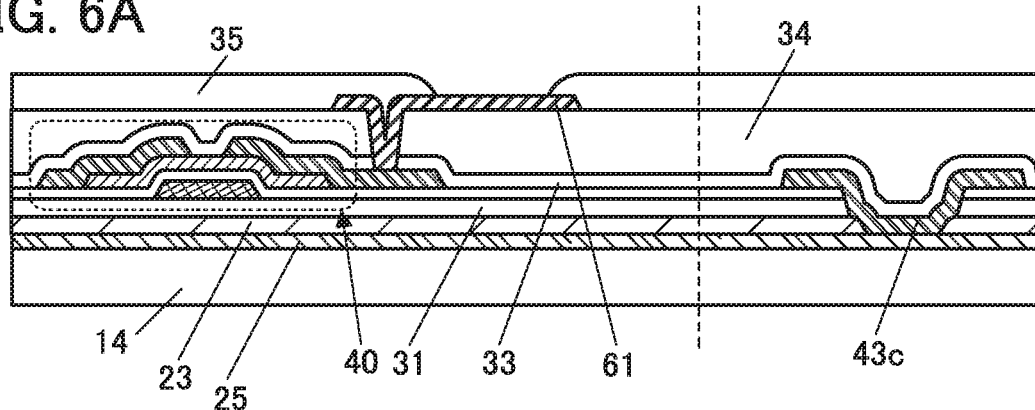
FIG. 6 Drawings illustrating an example of a manufacturing method of a flexible device.

First, components from the silicon layer 25 to the insulating layer 35 are formed in this order over the formation substrate 14 in a manner similar to that in the manufacturing method example 1A (FIG. 6(A)).

Figure 6B:
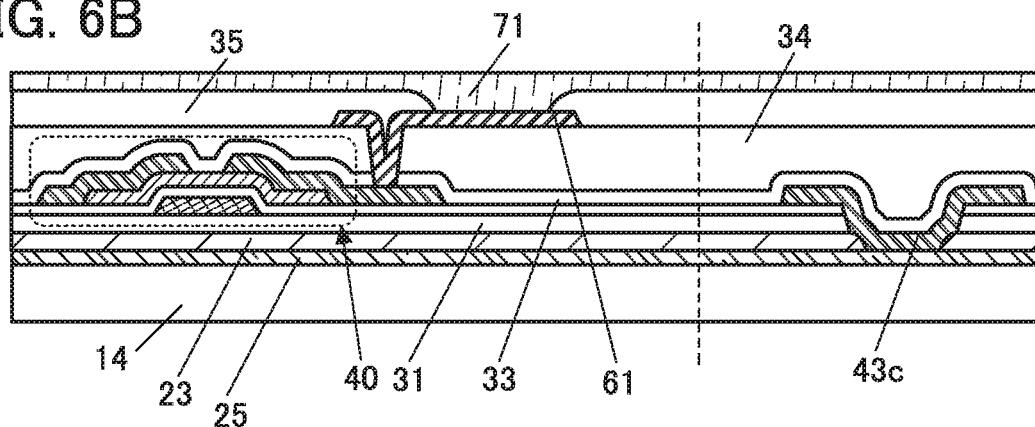

Then, a protective layer 71 is formed as illustrated in FIG. 6(B).

The protective layer 71 has a function of protecting surfaces of the insulating layer 35 and the conductive layer 61 in a peeling step. The protective layer 71 can be formed using a material that can be easily removed.

For the protective layer 71 that can be removed, a water-soluble resin can be given as the example. A water-soluble resin applied covers an uneven surface, which facilitates the protection of the surface. As the protective layer 71 that can be removed, a stack of an adhesive that can be peeled by light or heat and a water-soluble resin may be used.

As the protective layer 71 that can be removed, a base material having a property in which adhesion is strong in the normal state but is weakened when heated or irradiated with light may be used. For example, a thermal peeling tape whose adhesion is weakened by heat, a UV-peeling tape whose adhesion is weakened by ultraviolet irradiation, or the like may be used. Alternatively, a weak adhesion tape with weak adhesion in the normal state, or the like can be used.

Figure 6C:
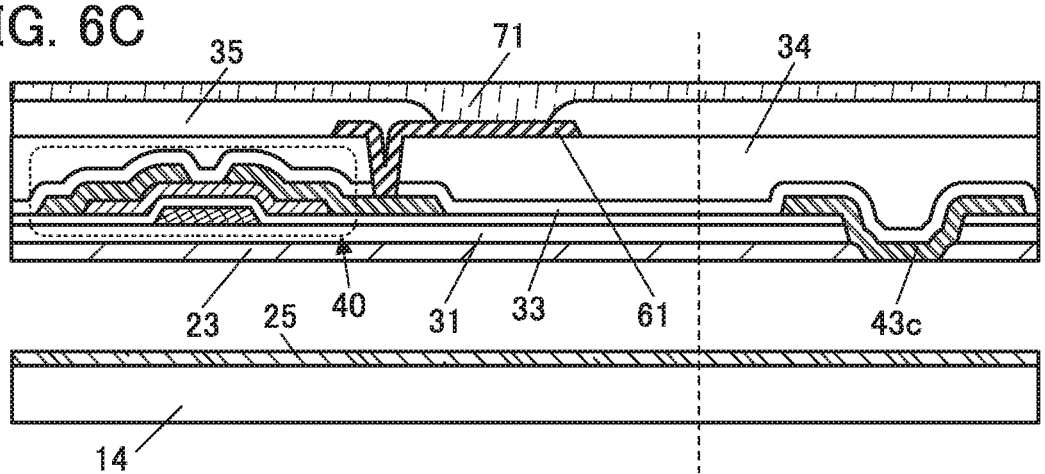

Next, the formation substrate 14 and the transistor 40 are separated from each other in a manner similar to that in the manufacturing method example 1A (FIG. 6(C)). FIG. 6(C) illustrates an example in which separation occurs at the interface between the silicon layer 25 and the resin layer 23 and at the interface between the silicon layer 25 and the conductive layer 43c. The resin layer 23 and the conductive layer 43c are exposed by the separation.

After the formation substrate 14 and transistor 40 are separated from each other, the protective layer 71 is removed.

Then, the EL layer 62 and the conductive layer 63 are formed so that the display element 60 is manufactured, and by sealing the display element 60, the display device 10 can be manufactured. For sealing of the display element 60, one or more kinds of the insulating layer 74, the protective layer 75, the substrate 75a, the bonding layer 75b, and the like can be used.

The EL layer 62 and the conductive layer 63 may be formed while the resin layer 23 and the conductive layer 43c are fixed to a stage of a deposition apparatus, but are preferably formed while the resin layer 23 and the conductive layer 43c are fixed to a supporting substrate by a tape or the like and the supporting substrate is placed on the stage. Fixing the resin layer 23 and the conductive layer 43c to the supporting substrate facilitates the transfer of the stacked-layer structure including the resin layer 23.

In the manufacturing method example 2A, after a layer is peeled from the formation substrate 14, the EL layer 62 and the conductive layer 63 can be formed over the peeled layer. In the case where a region having low adhesion is included in a stacked-layer structure including the EL layer 62 and the like, these layers are formed after peeling so that a decrease in the yield of peeling can be suppressed. With the use of the manufacturing method example 2A, a material can be selected more freely, leading to fabrication of a highly reliable display device at lower cost.

[Manufacturing Method Example 3A]

Next, the case of manufacturing a display device with a color filter method that uses an oxide semiconductor for a transistor will be described as an example. A flexible device of one embodiment of the present invention and a manufacturing method thereof will be specifically described below with reference to FIG. 7-FIG. 13.

First, the silicon layer 25 is formed over the formation substrate 14 in a manner similar to that in the manufacturing method example 1A (FIG. 7(A)).

Next, the first layer 24 is formed using a photosensitive and thermosetting material in a manner similar to that in the manufacturing method example 1A (FIG. 7(A)).

Next, the film processed into a desired shape is heated in a manner similar to that in the manufacturing method example 1A, whereby the resin layer 23 is formed (FIG. 7(B)). FIG. 7(B) illustrates an example in which the opening that reaches the silicon layer 25 is provided in the resin layer 23.

Next, the insulating layer 31 is formed over the resin layer 23 in a manner similar to that in the manufacturing method example 1A (FIG. 7(C)).

Next, a transistor 80 is formed over the insulating layer 31 (FIGS. 7(C) to (E)).

Here, the case where a transistor including an oxide semiconductor layer 83 and two gates is manufactured as the transistor 80 is shown.

The transistor 80 is formed at a temperature lower than or equal to the allowable temperature limit of the resin layer 23. The transistor 80 is preferably formed at a temperature lower than or equal to the heating temperature in the above-described post-baking.

Specifically, first, a conductive layer 81 is formed over the insulating layer 31 (FIG. 7(C)). The conductive layer 81 can be formed by forming a conductive film, forming a resist mask, etching the conductive film, and removing the resist mask.

Next, an insulating layer 82 is formed (FIG. 7(C)). As the insulating layer 82, the inorganic insulating film that can be used as the insulating layer 31 can be used.

Then, the oxide semiconductor layer 83 is formed (FIG. 7(C)). The oxide semiconductor layer 83 can be formed by forming an oxide semiconductor film, forming a resist mask, etching the oxide semiconductor film, and removing the resist mask. For the oxide semiconductor layer 83, the material that can be used for the oxide semiconductor layer 44 can be used.

Then, an insulating layer 84 and a conductive layer 85 are formed (FIG. 7(C)). As the insulating layer 84, the inorganic insulating film that can be used as the insulating layer 31 can be used. The insulating layer 84 and the conductive layer 85 can be formed by forming an insulating film to be the insulating layer 84 and a conductive film to be the conductive layer 85, forming a resist mask, etching the insulating film and the conductive film, and removing the resist mask.

Next, the insulating layer 33 that covers the oxide semiconductor layer 83, the insulating layer 84, and the conductive layer 85 is formed (FIG. 7(C)). The insulating layer 33 can be formed in a manner similar to that of the insulating layer 31.

An opening of the insulating layer 31, an opening of the insulating layer 82, and an opening of the insulating layer 33 are provided in a region overlapping with the opening of the resin layer 23 (FIG. 7(D)). The silicon layer 25 is exposed by providing the openings. In an example shown here, the openings are formed at a time in the insulating layer 31, the insulating layer 82, and the insulating layer 33. The openings of the insulating layer 31, the insulating layer 82, and the insulating layer 33 may be formed in separate steps. In addition, the openings may be formed in two or more of the insulating layers at the same time. For example, the opening of the insulating layer 31 may be formed before the conductive layer 81 is formed. For example, the opening of the insulating layer 82 may be formed before the oxide semiconductor layer 83 is formed. For example, the opening of the insulating layer 33 may be provided in the region overlapping with the opening of the resin layer 23 in a step of forming openings that reach the oxide semiconductor layer 83.

Next, a conductive layer 86a, a conductive layer 86b, and a conductive layer 86c are formed (FIG. 7(E)). The conductive layer 86a, the conductive layer 86b, and the conductive layer 86c can be formed by forming a conductive film, forming a resist mask, etching the conductive film, and removing the resist mask. The conductive layer 86a and the conductive layer 86b are electrically connected to the oxide semiconductor layer 83 through the openings of the insulating layer 33. The conductive layer 86c is connected to the silicon layer 25 through the openings provided in the resin layer 23, the insulating layer 31, the insulating layer 82, and the insulating layer 33.

In the above manner, the transistor 80 can be manufactured (FIG. 7(E)). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The oxide semiconductor layer 83 includes a channel region and a low-resistance region. The channel region overlaps with the conductive layer 85 with the insulating layer 84 provided therebetween. The low-resistance region includes a region connected to the conductive layer 86a and a region connected to the conductive layer 86b.

Figure 8A:
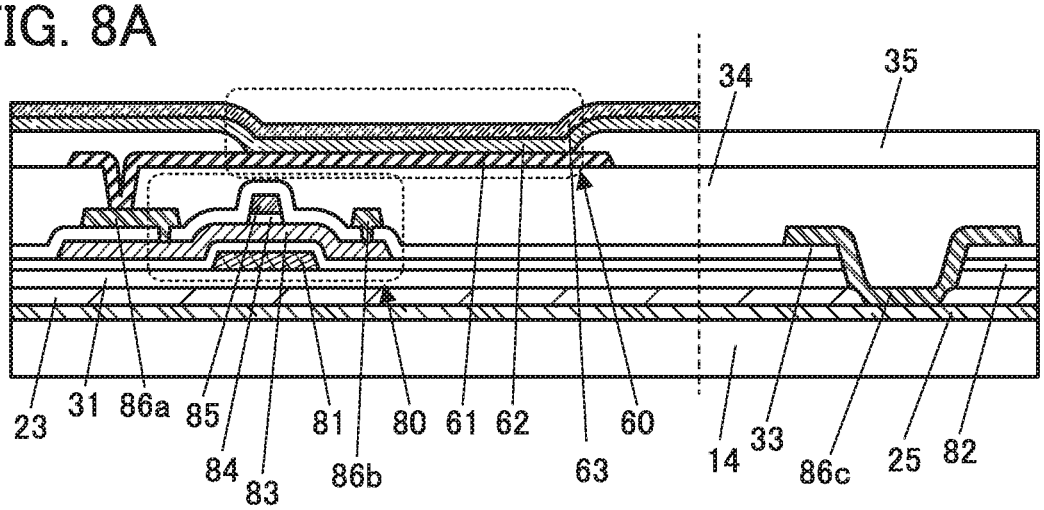
FIG. 8 Drawings illustrating an example of a manufacturing method of a flexible device.

Next, components from the insulating layer 34 to the display element 60 are formed over the insulating layer 33 (FIG. 8(A)). For these steps, the manufacturing method example 1A can be referred to.

Figure 8B:
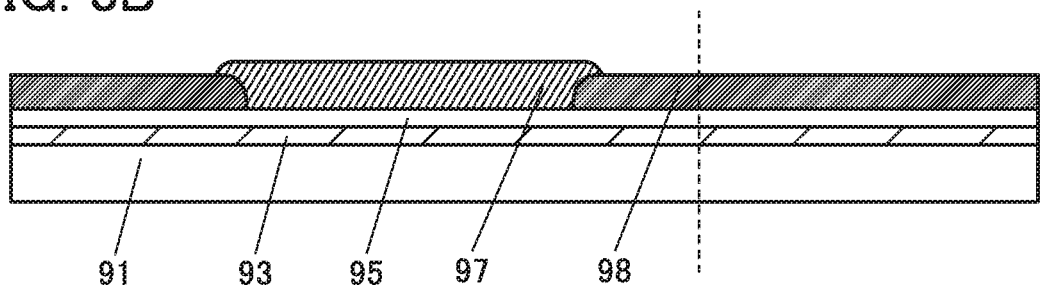

A resin layer 93 is formed over a formation substrate 91 using a photosensitive and thermosetting material (FIG. 8(B)).

The resin layer 93 has flexibility. The formation substrate 91 has lower flexibility than the resin layer 93 does. When the resin layer 93 is formed over the formation substrate 91, the resin layer 93 can be transferred easily.

For the resin layer 93, a polyimide resin is preferably used. For the material and formation method of the resin layer 93, the description of the resin layer 23 can be referred to.

The resin layer 93 has a thickness preferably greater than or equal to 0.01 μm and less than 10 μm, further preferably greater than or equal to 0.1 μm and less than or equal to 5 μm, still further preferably greater than or equal to 0.1 μm and less than or equal to 3 μm, and yet still further preferably greater than or equal to 0.5 μm and less than or equal to 1 μm. With a solution having low viscosity, the resin layer 93 having a small thickness can be easily formed. By forming the resin layer 93 thin, the display device can be fabricated at low cost. In addition, the display device can be lightweight and thin. Furthermore, the display device can have higher flexibility. However, the thickness of the resin layer 93 is not limited thereto, and may be greater than or equal to 10 μm. For example, the thickness of the resin layer 93 may be greater than or equal to 10 μm and less than or equal to 200 μm. The resin layer 93 having a thickness greater than or equal to 10 μm is favorable because the rigidity of the display device can be increased.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 8(B)).

For the insulating layer 95, the description of the insulating layer 31 can be referred to.

A color filter or the like can be used as the coloring layer 97. The coloring layer 97 is provided to overlap with the display region of the display element 60.

A black matrix or the like can be used as the light-blocking layer 98. The light-blocking layer 98 is provided to overlap with the insulating layer 35.

Figure 8C:
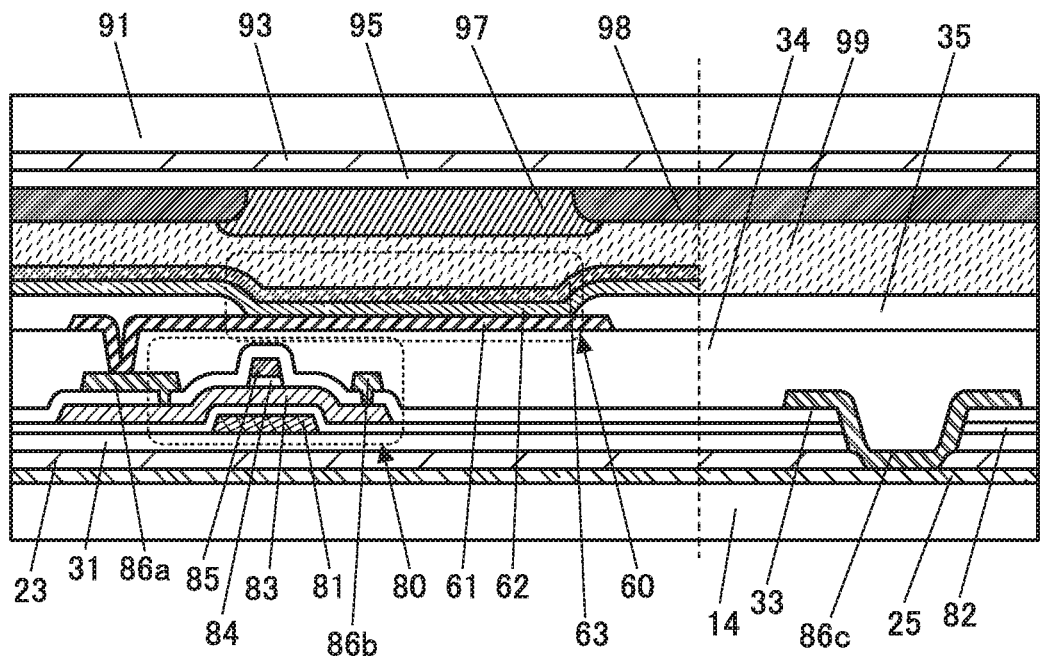

Next, a surface of the formation substrate 14 on which the silicon layer 25 and the like are formed is attached to a surface of the formation substrate 91 on which the resin layer 93 and the like are formed, with a bonding layer 99 (FIG. 8(C)).

Figure 9A:
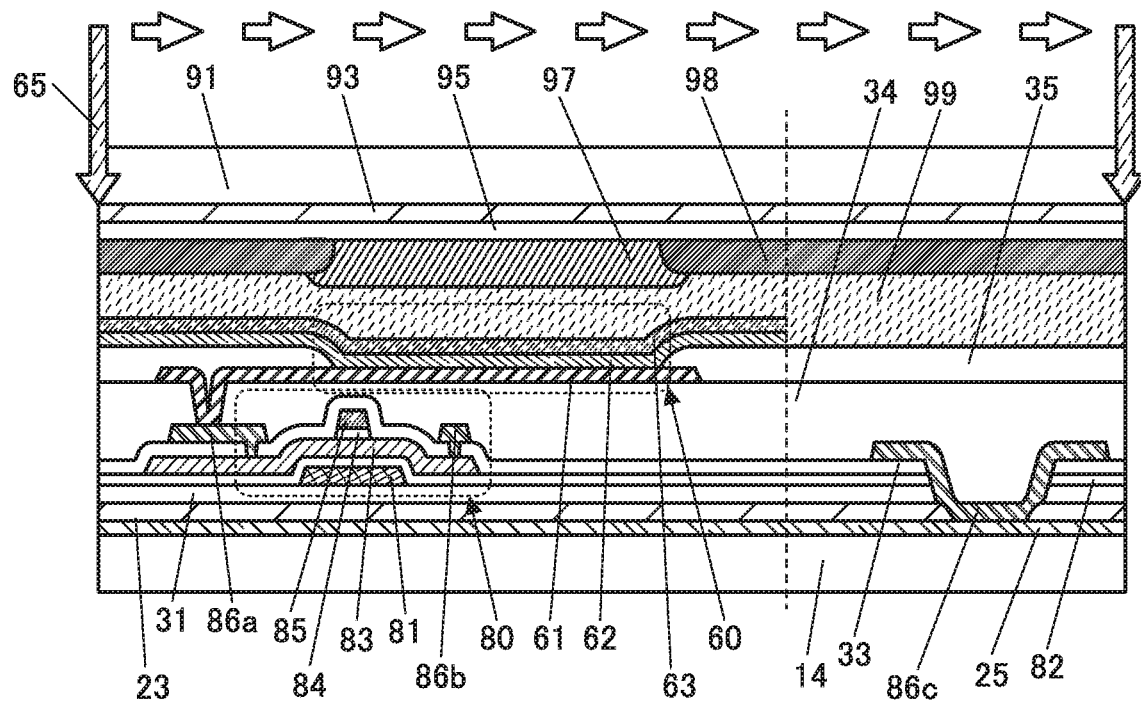
FIG. 9 Drawings illustrating an example of a manufacturing method of a flexible device.

Next, the resin layer 93 is irradiated with the laser light 65 through the formation substrate 91 (FIG. 9(A)). Note that either the formation substrate 14 or the formation substrate 91 may be separated first. Here, an example in which the formation substrate 91 is separated ahead of the formation substrate 14 is shown.

Figure 9B:
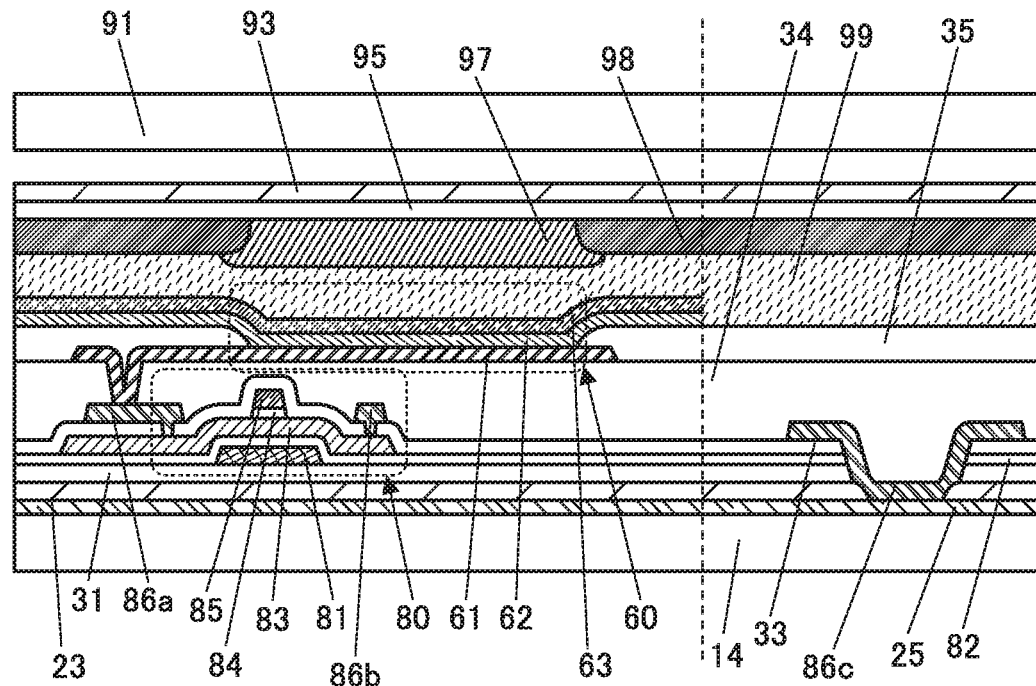

Then, the formation substrate 91 and the insulating layer 95 are separated from each other (FIG. 9(B)). FIG. 9(B) illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 9(A).

Figure 10A:
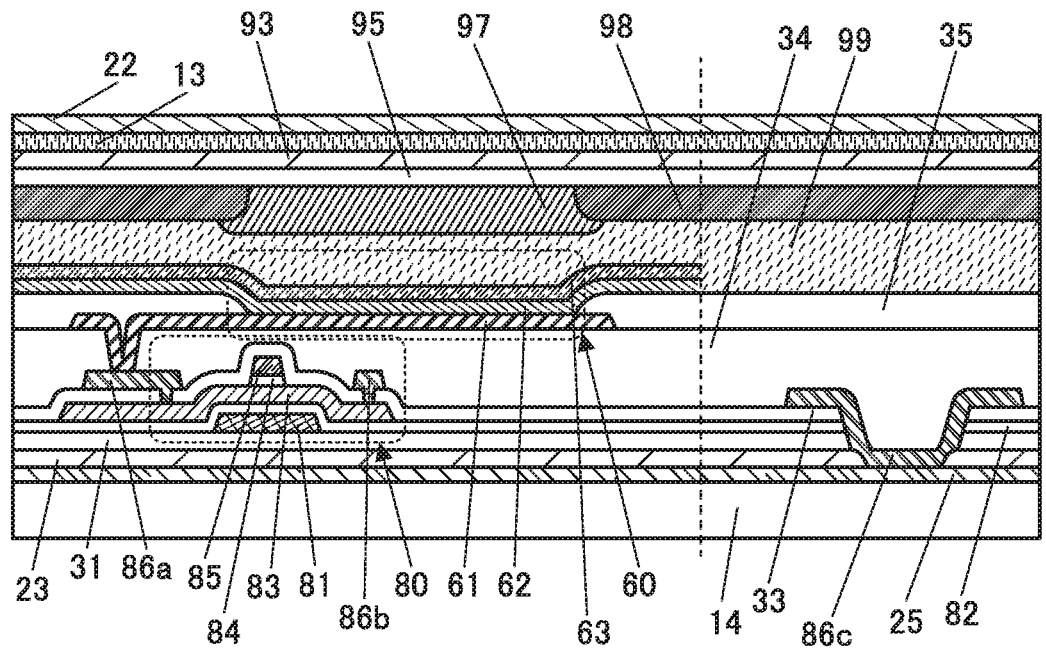
FIG. 10 Drawings illustrating an example of a manufacturing method of a flexible device.

Then, the exposed resin layer 93 (or the insulating layer 95) and the substrate 22 are attached to each other with a bonding layer 13 (FIG. 10(A)).

In FIG. 10(A), light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the bonding layer 13. As a method for removing the resin layer 93, ashing or the like can be used.

The material that can be used for the bonding layer 75b can be used for the bonding layer 13.

The material that can be used for the substrate 75a can be used for the substrate 22.

Figure 10B:
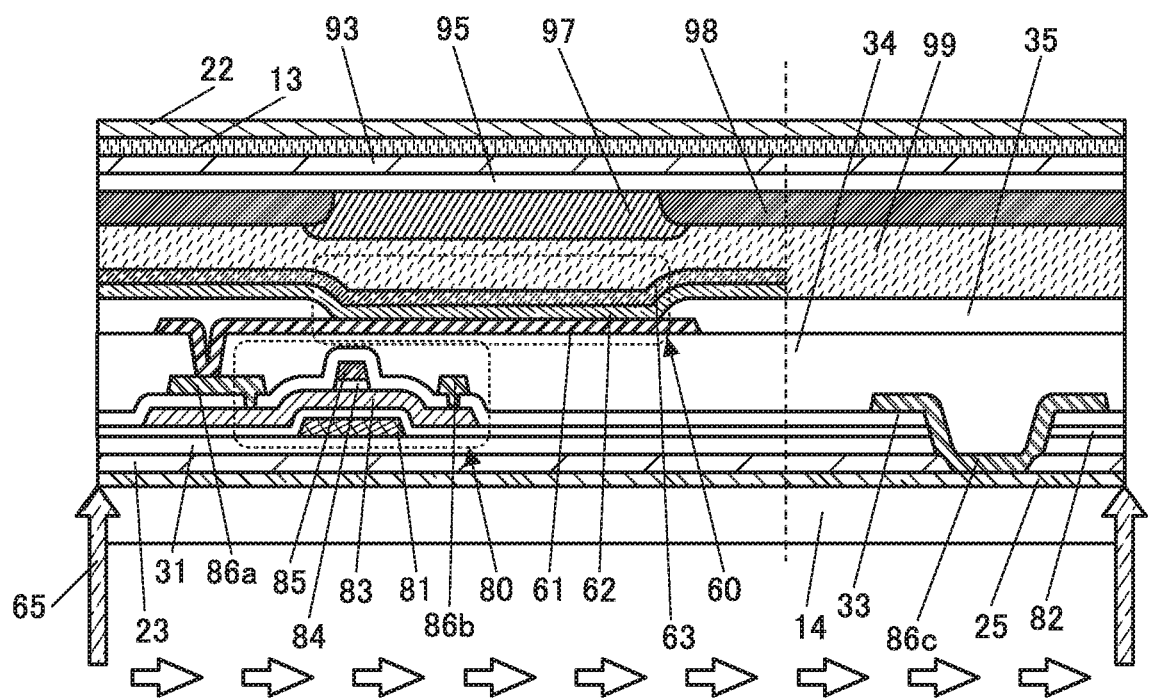

Next, the silicon layer 25 is irradiated with the laser light 65 through the formation substrate 14 (FIG. 10(B)).

By irradiation with the laser light 65, the silicon layer 25 is heated and hydrogen is released from the silicon layer 25.

Figure 11A:
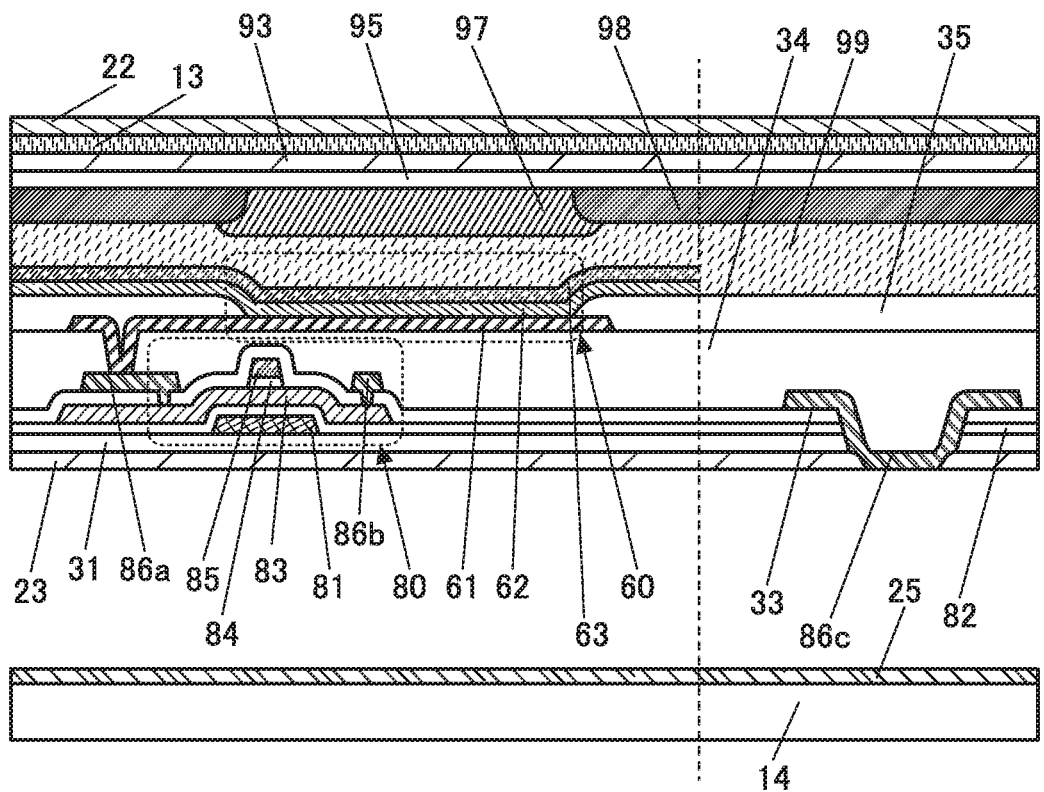
FIG. 11 Drawings illustrating an example of a manufacturing method of a flexible device.
Figure 11B:
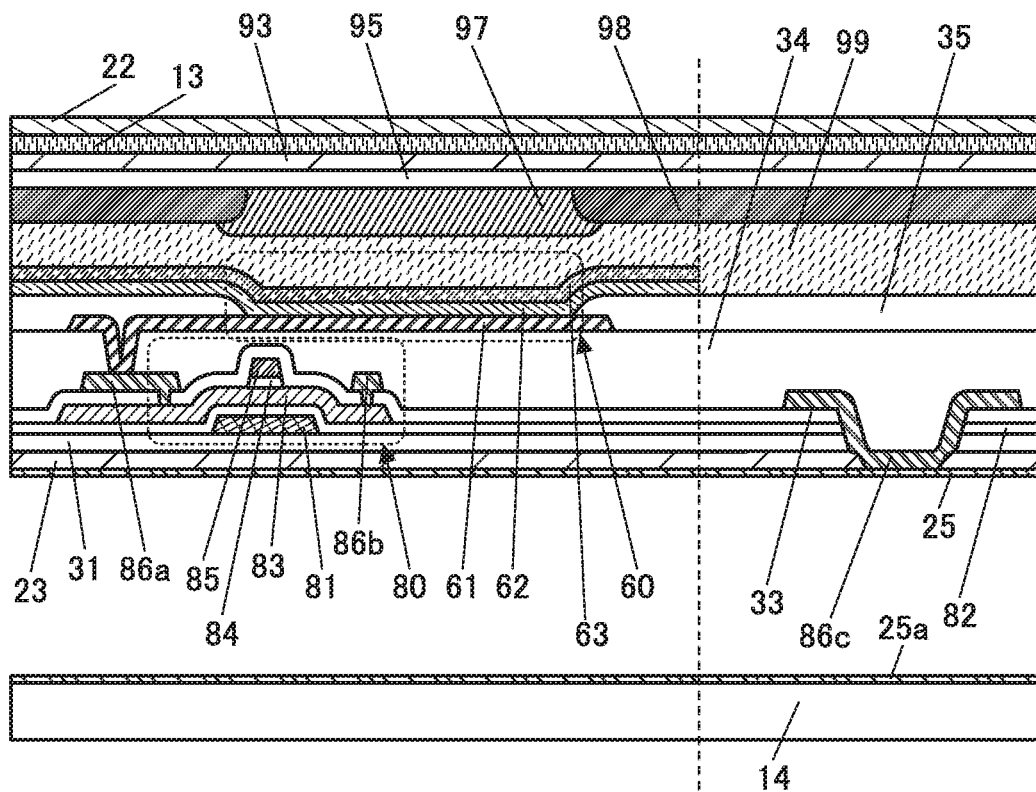

Then, the formation substrate 14 and the insulating layer 31 are separated from each other (FIG. 11(A) or FIG. 11(B)).

FIG. 11(A) illustrates an example in which separation occurs at the interface between the silicon layer 25 and the resin layer 23 and the interface between the silicon layer 25 and the conductive layer 86c.

FIG. 11(B) illustrates an example in which separation occurs in the silicon layer 25. Part of the silicon layer (silicon layer 25a) remains over the formation substrate 14. The thickness of the silicon layer 25 remaining on the resin layer 23 side and the conductive layer 86c side is reduced as compared with that in FIG. 10(B).

In the case where the silicon layer 25 remains on the resin layer 23 side and the conductive layer 86c side, it is preferably removed.

Figure 12A:
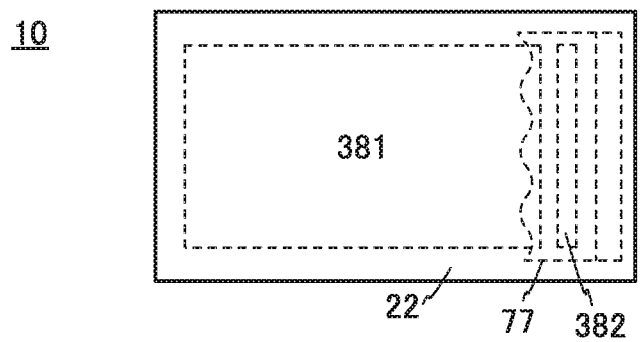
FIG. 12 Drawings illustrating an example of a flexible device.

By the separation of the formation substrate 14 and the transistor 80, the display device 10 can be manufactured (FIGS. 12(A) and (B)). The display device 10 can remain being bent or can be bent repeatedly, for example.

Figure 12B:
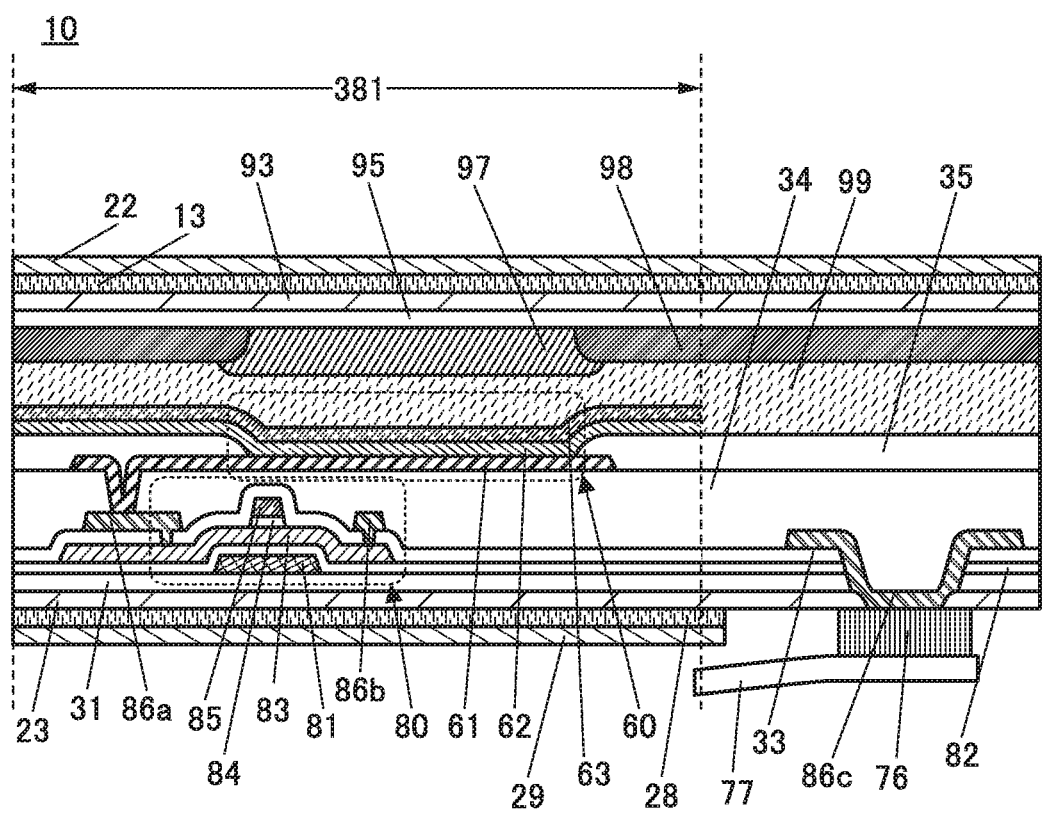

FIG. 12(A) is a top view of the display device 10. FIG. 12(B) is a cross-sectional view of a display portion 381 of the display device 10 and a cross-sectional view of a connection portion for connection to the FPC 77.

The display device 10 illustrated in FIGS. 12(A) and (B) includes a pair of substrates (the substrate 22 and the substrate 29). The substrate 22 side corresponds to a display surface side. The display device includes the display portion 381 and a driver circuit portion 382. The FPC 77 is attached to the display device.

As illustrated in FIG. 12(B), the substrate 29 may be attached to the surface of the resin layer 23 that is exposed by the separation, with the bonding layer 28. Note that the substrate 29 and the bonding layer 28 are provided so as not to overlap with the conductive layer 86c.

Then, the conductive layer 86c and the FPC 77 are electrically connected to each other through the connector 76 (FIG. 12(B)).

In this embodiment, an example using a top-emission light-emitting element is described. In the case where the conductive layer 86c is exposed from the substrate 22 side and electrically connected to the FPC 77, the display region cannot overlap with the FPC 77 because the substrate 22 side is the display surface side, and thus a region of the display device that overlaps with the FPC 77 is limited. In contrast, in one embodiment of the present invention, the conductive layer 86c can be exposed from the side opposite to the display surface using the photosensitive material for the resin layer 23. Therefore, the conductive layer 86c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 3A is an example in which the peeling method of one embodiment of the present invention is performed twice to manufacture a flexible device. In one embodiment of the present invention, the functional elements and the like included in the flexible device are formed over the formation substrate; thus, even in the case where a high-resolution display device is manufactured, high alignment accuracy of the flexible substrate is not required. For this reason, the flexible substrate can be easily attached.

Modification Example 1A

Using one embodiment of the present invention, a bottom-emission display device can be manufactured.

Figure 13A:
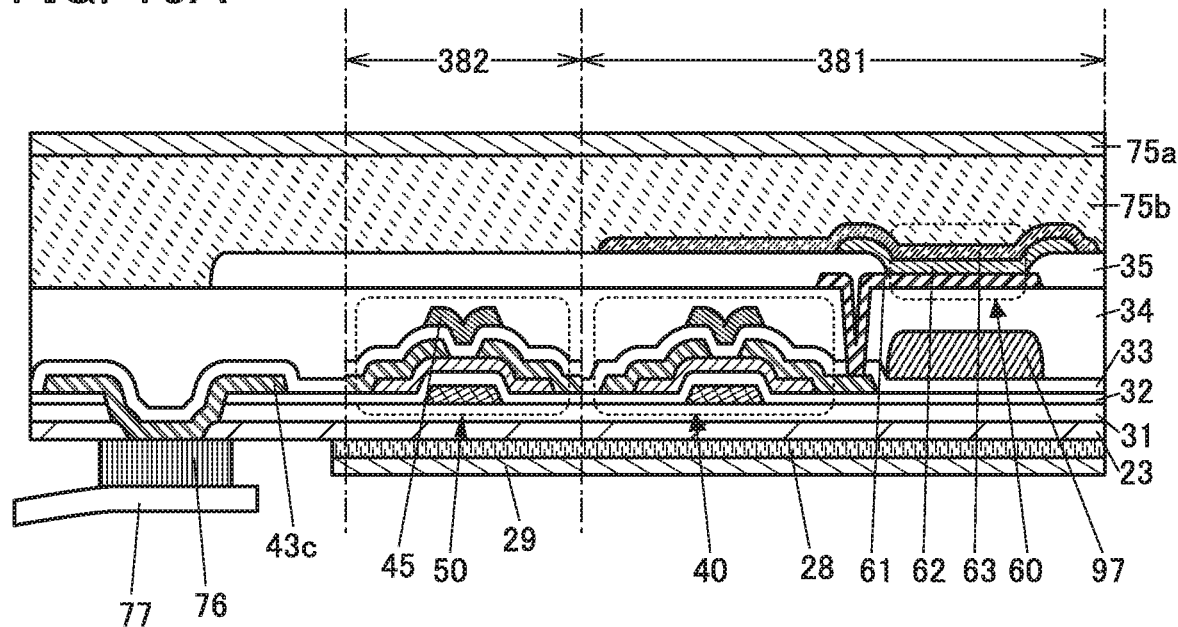
FIG. 13 Drawings illustrating an example of a flexible device.

The display device illustrated in FIG. 13(A) is a bottom-emission display device using a color filter method. FIG. 13(A) is a cross-sectional view of the display portion 381 of the display device, a cross-sectional view of the driver circuit portion 382, and a cross-sectional view of a connection portion for connection to the FPC 77.

The display device illustrated in FIG. 13(A) includes the substrate 29, the bonding layer 28, the resin layer 23, the insulating layer 31, the transistor 40, a transistor 50, the conductive layer 43c, the insulating layer 33, the insulating layer 34, the insulating layer 35, the display element 60, the bonding layer 75b, the substrate 75a, and the coloring layer 97.

FIG. 13(A) is an example in which the transistor 40 and the transistor 50 each include a conductive layer 45 functioning as a gate in addition to the components of the transistor 40 in FIG. 5.

The display element 60 emits light to the coloring layer 97 side.

The FPC 77 and the conductive layer 43c are electrically connected to each other through the connector 76. In the example of the cross-sectional view of a connection portion for connection to the FPC 77, the end portion of the insulating layer 35 is not exposed at the end portion of the display device.

Modification Example 2A

Figure 13B:
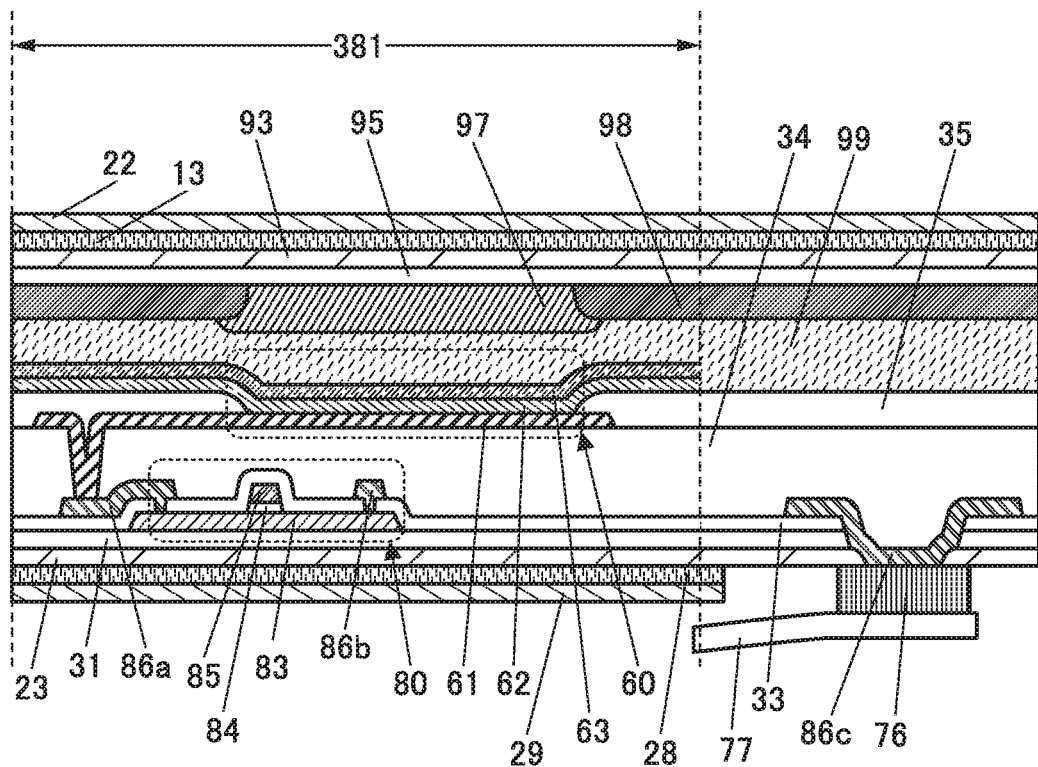

The display device illustrated in FIG. 13(B) is different from the display device illustrated in FIG. 12(B) in that the transistor 80 does not include the conductive layer 81 and the insulating layer 82.

As described above, in one embodiment of the present invention, a flexible device can be manufactured by separating the transistor or the like from the formation substrate using the silicon layer having a function of releasing hydrogen.

In one embodiment of the present invention, the resin layer is manufactured using the photosensitive material, so that the resin layer with a desired shape can be easily formed. Thus, the external connection terminal and the circuit board can be electrically connected to each other on the surface opposite to the display surface. A space for bending the FPC and the like in incorporating the display device in an electronic device can be saved, which enables the electronic device to be smaller.

In one embodiment of the present invention, the manufacturing process of the transistor can be performed at a low temperature with the use of an oxide semiconductor in the channel formation region of the transistor. Furthermore, the resin layer can have a small thickness and low heat resistance. Thus, there are advantages in that a wide choice of materials is offered for the resin layer, high mass productivity can be obtained at low cost, and peeling and manufacturing of a flexible device can be performed using a large-sized substrate, for example.

This embodiment can be combined with the other embodiments as appropriate.

Embodiment 2

In this embodiment, a peeling method and a manufacturing method of a flexible device of one embodiment of the present invention will be described.

In the peeling method of one embodiment of the present invention, first, an island-shaped silicon layer containing hydrogen is formed over a formation substrate. Next, a resin layer having an opening is formed in such a manner that a first layer is formed over the formation substrate and the silicon layer using a photosensitive material and then an opening is formed in a portion of the first layer that overlaps with the silicon layer by a photolithography method. Then, a transistor including an oxide semiconductor in its channel formation region is formed over the resin layer. Then, a conductive layer is formed to overlap with the opening of the resin layer and the silicon layer. After that, the silicon layer and the resin layer are irradiated with light using a laser and then the transistor and the formation substrate are separated from each other.

In one embodiment of the present invention, the resin layer is manufactured using a photosensitive material. With the photosensitive material, a resin layer with a desired shape can be easily formed. For example, an opening can be easily formed in the resin layer.

However, in the case where separation is made to occur at the interface between the resin layer and the formation substrate or in the resin layer, the formation of the opening in the resin layer makes the separation of the formation substrate difficult in some cases.

In view of the above, in one embodiment of the present invention, the island-shaped silicon layer is formed and the opening of the resin layer is formed in a portion overlapping with the silicon layer. Then, the resin layer and the silicon layer are irradiated with light using a laser.

The silicon layer is heated by absorbing light to release hydrogen. When the silicon layer is irradiated with light to release hydrogen, the adhesion between the silicon layer and a layer in contact with the silicon layer is reduced, whereby separation can be made to occur at the interface between the two layers. Alternatively, when the silicon layer releases hydrogen, the silicon layer itself is damaged, whereby separation can be made to occur in the silicon layer.

Accordingly, the formation substrate can be easily separated, so that the resin layer can be exposed in a portion where the resin layer is provided. Also, the silicon layer or a layer having been in contact with the silicon layer can be exposed in the opening of the resin layer.

The silicon layer exposed by the separation from the formation substrate can be used as a rear electrode or a through electrode. The silicon layer can be used as an external connection terminal, for example. The exposed silicon layer can be electrically connected to a circuit board such as an FPC. When the conductive layer electrically connected to the silicon layer through the opening of the resin layer is provided, the conductive layer can be electrically connected to the circuit board through the silicon layer.

Since the silicon layer is used as an electrode in one embodiment of the present invention, the resistivity of the silicon layer is preferably low.

The resistivity of the silicon layer can be lowered by, for example, adding an impurity to the silicon layer at the deposition or after the deposition.

In one embodiment of the present invention, an oxide semiconductor is used for the channel formation region of the transistor. As described in Embodiment 1, with the use of an oxide semiconductor, the maximum temperature in the manufacturing process of the display device can be lowered, the manufacturing cost of the display device can be reduced, and the manufacturing process of the display device can be simplified, as compared with the case of using LTPS. In addition, with the use of an oxide semiconductor, heat resistance of the resin layer can be lowered, a wide choice of materials is offered for the resin layer, and the resin layer can be reduced in thickness, as compared with the case of using LTPS.

In one embodiment of the present invention, the transistor or the like is formed at a temperature lower than or equal to the allowable temperature limit of the resin layer.

In one embodiment of the present invention, irradiation with laser light is performed with a linear laser. A laser apparatus used in a manufacturing line for LTPS or the like can be effectively used. Laser light is condensed in a long rectangular shape (shaped into a linear laser beam) and the silicon layer and the resin layer are irradiated with the linear laser.

A flexible device can be manufactured using a peeling method of one embodiment of the present invention. A flexible device of one embodiment of the present invention and a manufacturing method thereof will be specifically described below with reference to FIG. 14-FIG. 18. Here, an example in which an active matrix organic EL display device is manufactured as the flexible device will be described. Note that descriptions of portions similar to those in Embodiment 1 might be omitted.

[Manufacturing Method Example 1B]

Figure 14A:
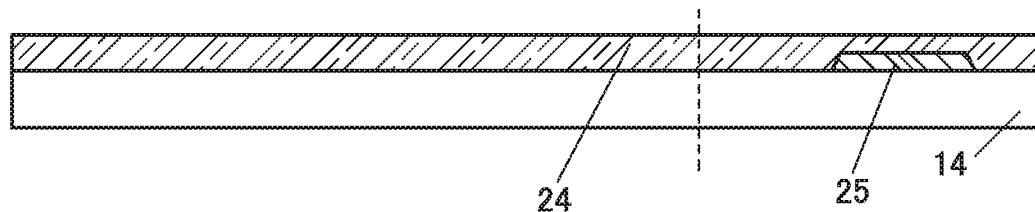
FIG. 14 Drawings illustrating an example of a manufacturing method of a flexible device.

First, an island-shaped silicon layer 25 is formed over the formation substrate 14 (FIG. 14(A)).

For the material that can be used for the formation substrate 14, the manufacturing method example 1A in Embodiment 1 can be referred to.

The silicon layer 25 has a function of releasing hydrogen when generating heat by absorbing light.

As the silicon layer 25, a silicon layer from which hydrogen is released by heating can be used, for example. In particular, a hydrogenated amorphous silicon (a-Si:H) layer is preferably used. The hydrogenated amorphous silicon layer can be formed by, for example, a plasma CVD method using a deposition gas containing $SiH_4$. A silicon layer having crystallinity may be used as the silicon layer 25. After the formation of the silicon layer 25, heating may be performed under an atmosphere containing hydrogen so that the silicon layer 25 contains a large amount of hydrogen.

The thickness of the silicon layer 25 is preferably greater than or equal to 1 nm and less than or equal to 200 nm, further preferably greater than or equal to 5 nm and less than or equal to 100 nm, for example.

The silicon layer 25 preferably has a high conductivity.

For example, an impurity can be contained in the silicon layer 25 at the deposition using the deposition gas containing impurities such as gallium or arsenide. Alternatively, the impurities are added after the silicon layer 25 is formed, whereby the resistance of the silicon layer 25 can be lowered. For the impurity addition, an ion doping method or ion implantation method can be used, for example. Specifically, by adding phosphorus, arsenic, or the like, the silicon layer 25 becomes n-type. By adding boron, aluminum, gallium, or the like, the silicon layer 25 becomes p-type.

Next, the first layer 24 is formed using a photosensitive material (FIG. 14(A)).

In particular, a photosensitive and thermosetting material is preferably used. In this embodiment, an example using the photosensitive and thermosetting material is shown.

Figure 14B:
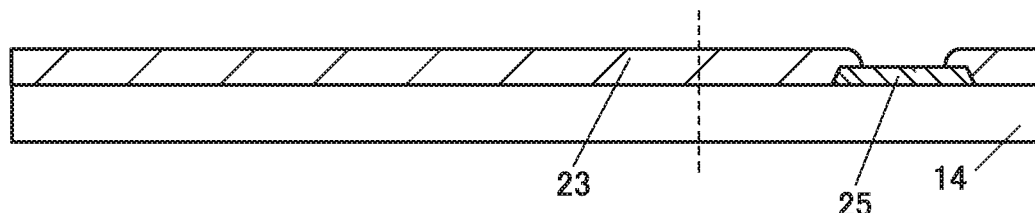

Since the first layer 24 is formed using the photosensitive material in one embodiment of the present invention, part of the first layer 24 can be removed by a lithography method that uses light. Specifically, after the material is deposited, pre-baking is performed, and then light exposure is performed using a photomask. Next, development is performed, whereby an unnecessary portion can be removed. Then, the first layer 24 processed into a desired shape is subjected to post-baking so that the resin layer 23 is formed (FIG. 14(B)). FIG. 14(B) illustrates an example in which an opening that reaches the silicon layer 25 is provided in the resin layer 23.

By the post-baking, released gas components (e.g., hydrogen, water, and the like) in the resin layer 23 can be reduced. It is particularly preferable that heating be performed at a temperature higher than or equal to the formation temperature of each layer formed over the resin layer 23. For example, in the case where the formation temperature of the transistor is below 350° C., the film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 23 in the manufacturing process of the transistor can be significantly reduced.

In the post-baking, heating is preferably performed at a temperature at which hydrogen is less likely to be released from the silicon layer 25. Accordingly, a defect such as peeling of the silicon layer 25 before irradiation with laser light can be prevented and thus a decrease in yield can be inhibited. Note that the steps performed before the silicon layer 25 is irradiated with laser light, which will be described later, are preferably performed at a temperature at which hydrogen is less likely to be released from the silicon layer 25.

For the material and formation method those can be used for the resin layer 23 (first layer 24), the manufacturing method example 1A can be referred to.

The thickness of the resin layer 23 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. It is preferable that the resin layer 23 be formed thicker than the silicon layer 25.

Figure 14C:
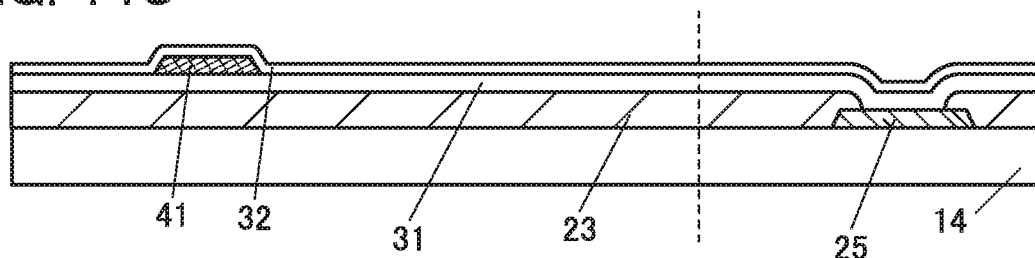

Next, the insulating layer 31 is formed over the resin layer 23 (FIG. 14(C)). For the material and formation method of the insulating layer 31, the manufacturing method example 1A can be referred to.

Figure 14D:
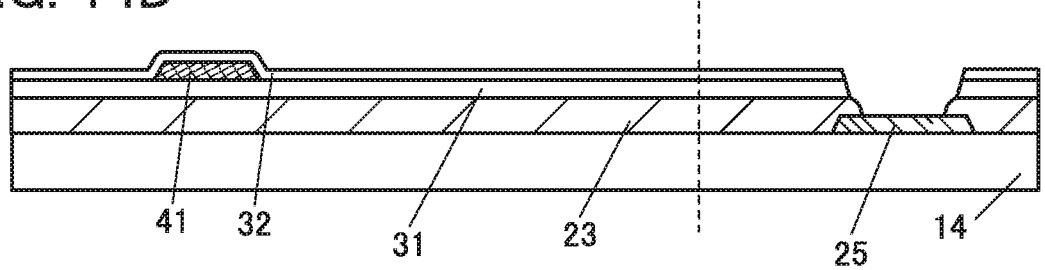
Figure 14E:
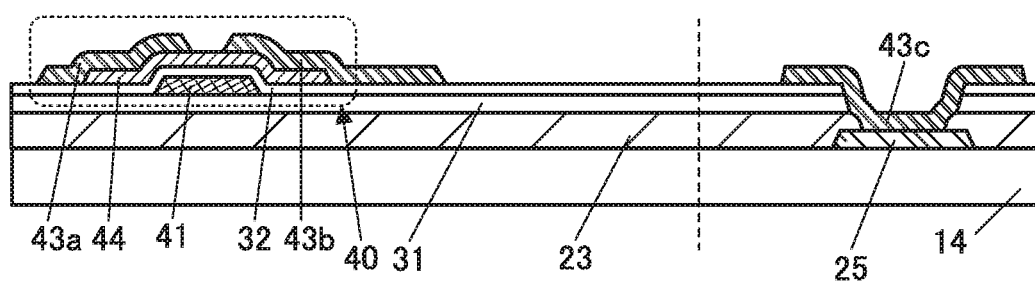

Next, the transistor 40 is formed over the insulating layer 31 (FIGS. 14(C) to (E)). For the material and formation method of the transistor 40, the manufacturing method example 1A can be referred to.

Specifically, first, the conductive layer 41 is formed over the insulating layer 31 (FIG. 14(C)).

Next, the insulating layer 32 is formed (FIG. 14(C)).

Next, an opening of the insulating layer 31 and an opening of the insulating layer 32 are provided in a region overlapping with the opening of the resin layer 23 (FIG. 14(D)). Here, an example in which the openings of the insulating layer 31 and the insulating layer 32 are formed at a time is shown. The silicon layer 25 is exposed by providing the openings.

Then, the oxide semiconductor layer 44 is formed (FIG. 14(E)).

Next, the conductive layer 43a, the conductive layer 43b, and the conductive layer 43c are formed (FIG. 14(E)). The conductive layer 43a and the conductive layer 43b are connected to the oxide semiconductor layer 44. The conductive layer 43c is connected to the silicon layer 25 through the openings provided in the resin layer 23, the insulating layer 31, and the insulating layer 32.

In the above manner, the transistor 40 can be manufactured (FIG. 14(E)).

Figure 15A:
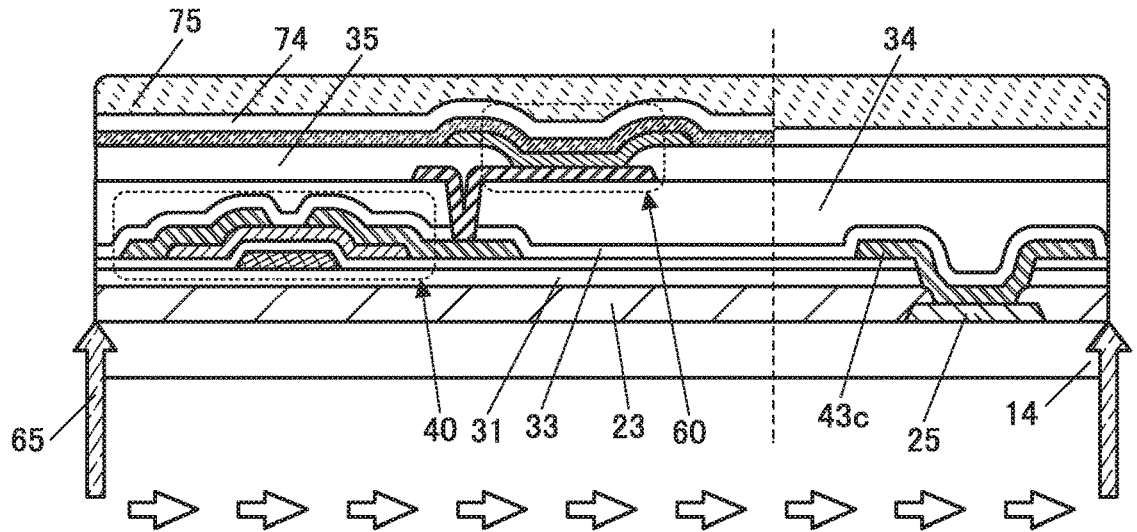
FIG. 15 Drawings illustrating examples of a manufacturing method of a flexible device.

Next, components from the insulating layer 33 to the protective layer 75 are formed in this order in a manner similar to that in the manufacturing method example 1A (FIG. 15(A)).

Next, the resin layer 23 and the silicon layer 25 are irradiated with the laser light 65 through the formation substrate 14 (FIG. 15(A)). The laser light 65 is, for example, a linear laser beam with which scanning is performed from the left side to the right side in FIG. 15(A), and the major axis is perpendicular to the scanning direction and the incident direction (from bottom to top).

The resin layer 23 and the silicon layer 25 absorb the laser light 65.

With irradiation with the laser light 65, the resin layer 23 is embrittled. Alternatively, with irradiation with the laser light 65, the adhesion between the resin layer 23 and the formation substrate 14 is decreased.

With irradiation with the laser light 65, the silicon layer 25 is embrittled. Alternatively, with irradiation with the laser light 65, the adhesion between the silicon layer 25 and the conductive layer 43c or the adhesion between the silicon layer 25 and the formation substrate 14 is decreased.

With irradiation with the laser light 65, the crystallinity of the silicon layer 25 might be increased. The conductivity of the silicon layer 25 might be increased in accordance with the increase in crystallinity of the silicon layer 25. Note that there is no limitation on the crystallinity of the silicon layer 25. For example, the silicon layer 25 may have any of various structures such as amorphous, polycrystalline, single crystalline, or the like. The silicon layer 25 may include microcrystals in amorphous.

With irradiation with the laser light 65, the silicon layer 25 is heated and hydrogen is released from the silicon layer 25. At this time, hydrogen is released in a gaseous state, for example. The released gas remains near the interface between the silicon layer 25 and the conductive layer 43c or near the interface between the silicon layer 25 and the formation substrate 14; thus, the force of peeling them is generated. Consequently, adhesion between the silicon layer 25 and the conductive layer 43c or adhesion between the silicon layer 25 and the formation substrate 14 is reduced to make a state where peeling can be easily performed.

Part of the hydrogen released from the silicon layer 25 remains in the silicon layer 25 in some cases. Thus, the silicon layer 25 is embrittled and separation is likely to occur inside the silicon layer 25 in some cases.

As the laser light 65, light having a wavelength that is transmitted through the formation substrate 14 at least part of the laser light 65 and absorbed by the resin layer 23 and the silicon layer 25 is selected. The laser light 65 is preferably light having a wavelength which is absorbed by the resin layer 23. The laser light 65 is preferably light having a wavelength range from visible light to ultraviolet light. For example, light having a wavelength greater than or equal to 200 nm and less than or equal to 400 nm, preferably greater than or equal to 250 nm and less than or equal to 350 nm, can be used. In particular, an excimer laser having a wavelength of 308 nm is preferably used because the productivity is increased. The excimer laser is preferable because the excimer laser can be used also for laser crystallization of LTPS, so that the existing LTPS production line device can be used and new capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running cost can be reduced to approximately ⅓ of the case of an excimer laser. Further alternatively, a pulsed laser such as a picosecond laser may be used.

In the case where linear laser light is used as the laser light 65, the laser light 65 is scanned and a region to be peeled is entirely irradiated with the laser light 65 by relatively moving the formation substrate 14 and a light source.

Next, the formation substrate 14 and the transistor 40 are separated from each other (FIG. 15(B), FIG. 15(C), FIG. 16(A), or FIG. 16(B)).

The position of the separation surface may vary depending on materials and the formation methods of the silicon layer 25, the resin layer 23, the conductive layer 43c, the formation substrate 14, and the like, and conditions of light irradiation, and the like.

Figure 15B:
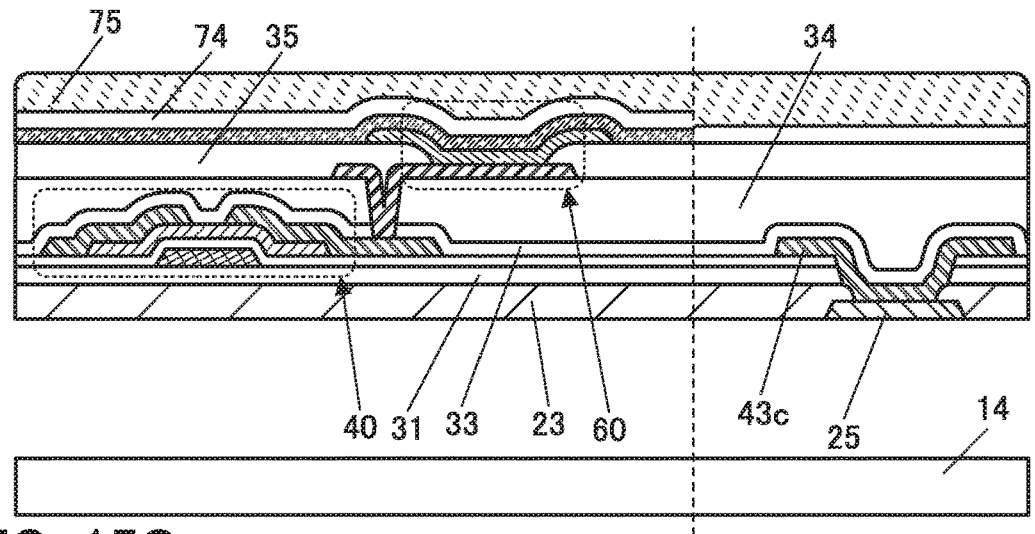

FIG. 15(B) illustrates an example in which separation occurs at the interface between the formation substrate 14 and the silicon layer 25 and the interface between the formation substrate 14 and the resin layer 23. The resin layer 23 and the silicon layer 25 are exposed by the separation.

Figure 15C:
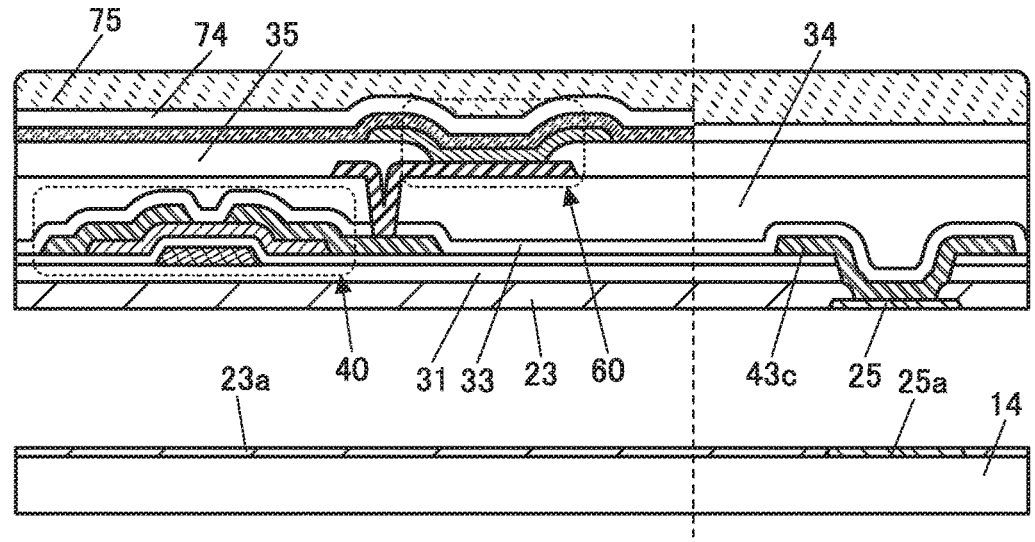

FIG. 15(C) illustrates an example in which separation occurs in the resin layer 23 and the silicon layer 25. Part of the resin layer (a resin layer 23a) and part of the silicon layer (a silicon layer 25a) remain over the formation substrate 14. The thicknesses of the resin layer 23 and the silicon layer 25 remaining on the insulating layer 31 side are reduced as compared with those in FIG. 15(A).

Figure 16A:
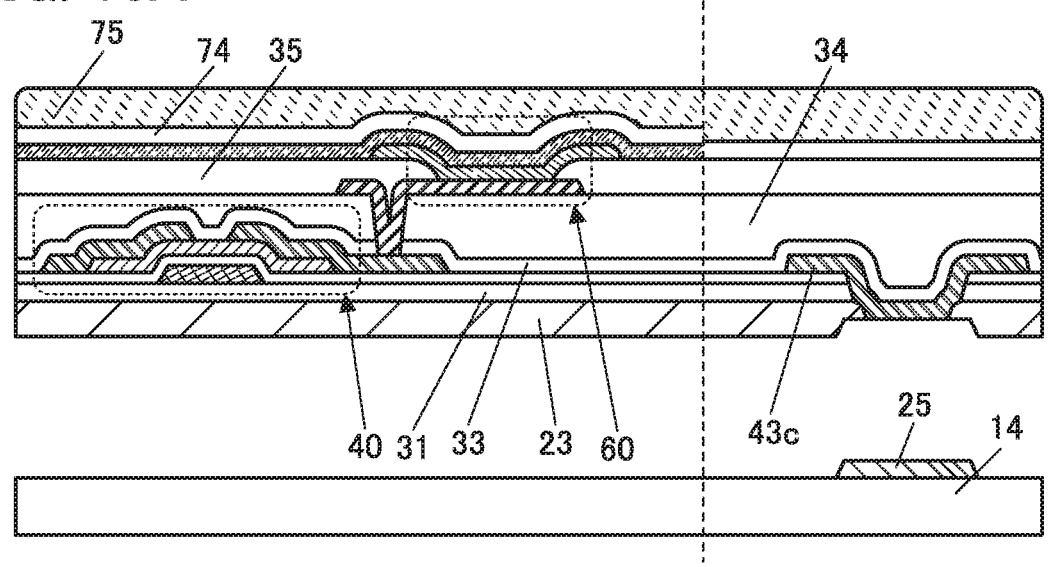
FIG. 16 Drawings illustrating examples of a manufacturing method of a flexible device.
Figure 16B:
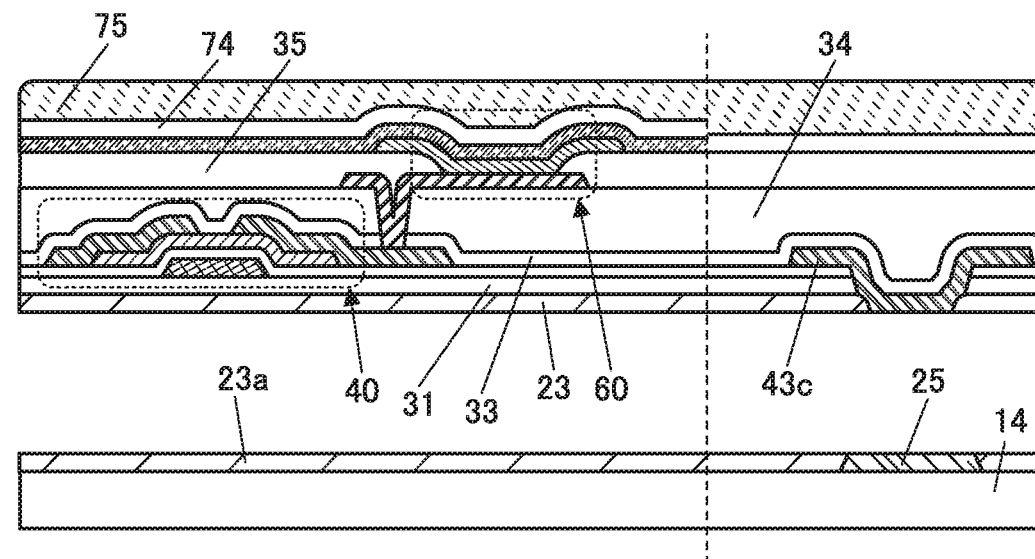

FIGS. 16(A) and (B) each illustrate an example in which separation occurs at the interface between the silicon layer 25 and the conductive layer 43c. At this time, the conductive layer 43c is exposed on the insulating layer 31 side and the silicon layer 25 remains over the formation substrate 14. FIG. 16(A) illustrates an example in which separation occurs at the interface between the formation substrate 14 and the resin layer 23. FIG. 16(B) illustrates an example in which separation occurs in the resin layer 23.

Note that the formation substrate 14 can be reused by removing the resin layer 23a and the silicon layer 25a remaining on the formation substrate 14 side.

The formation substrate 14 can be peeled by applying a perpendicular tensile force to the resin layer 23 and the silicon layer 25, for example. Specifically, the protective layer 75 can be peeled from the formation substrate 14 by adsorbing part of the top surface of the protective layer 75 and pulling it upward.

The separation trigger is preferably formed by inserting a sharp instrument such as a knife between the formation substrate 14 and the insulating layer 31.

Figure 17A:
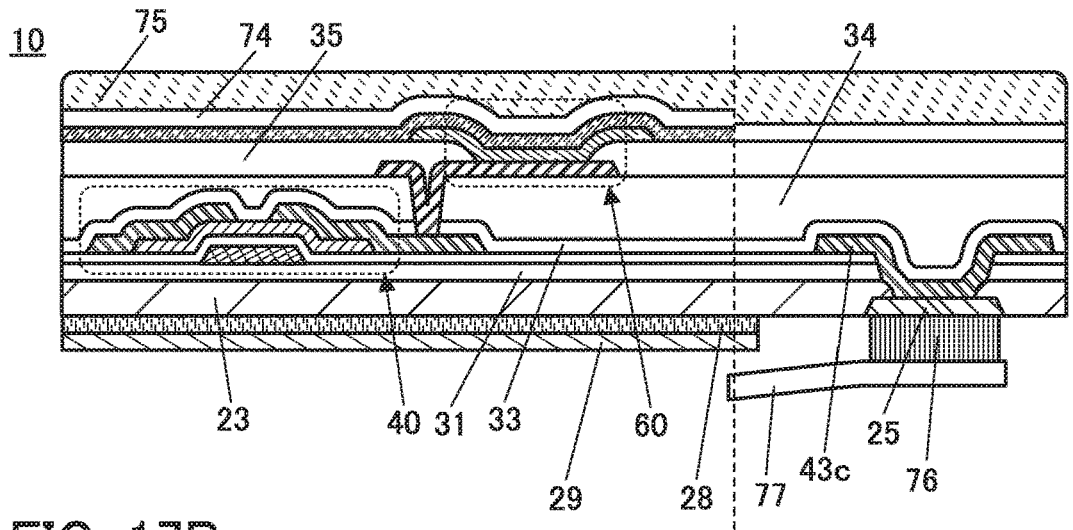
FIG. 17 Drawings illustrating examples of a flexible device.
Figure 17B:
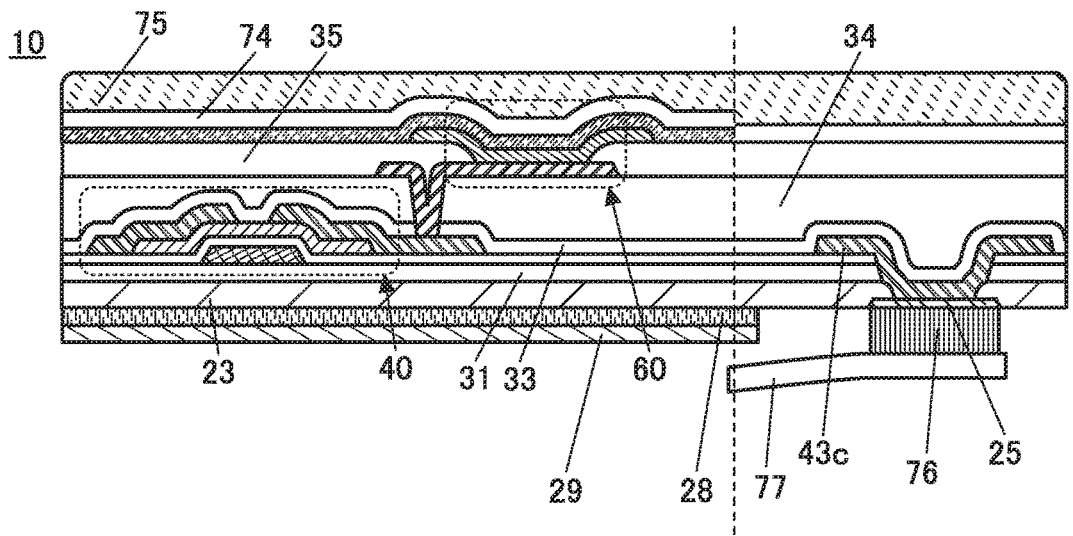
Figure 17C:
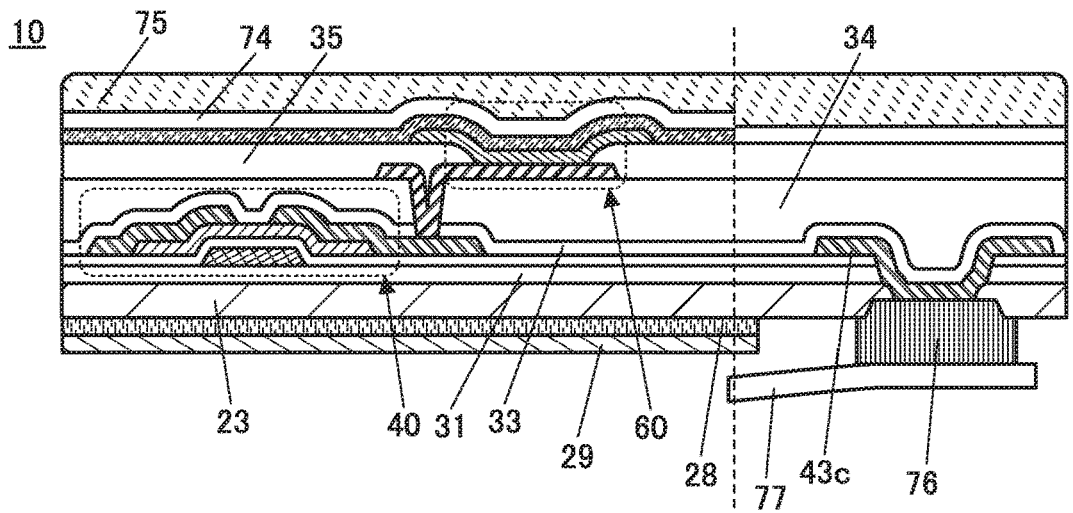

By the separation of the formation substrate 14 and the transistor 40, the display device 10 can be manufactured. FIG. 17(A) illustrates the display device 10 that can be manufactured in the case where separation occurs at the interface indicated in FIG. 15(B). FIG. 17(B) illustrates the display device 10 that can be manufactured in the case where separation occurs at the interface indicated in FIG. 15(C). FIG. 17(C) illustrates the display device 10 that can be manufactured in the case where separation occurs at the interface indicated in FIG. 16(A). The display device 10 can remain being bent or can be bent repeatedly, for example.

As illustrated in FIGS. 17(A) to 17(C), the substrate 29 may be attached to the surface of the resin layer 23 that is exposed by the separation, with the bonding layer 28. Note that the substrate 29 and the bonding layer 28 are positioned so as not to overlap with the silicon layer 25. The substrate 29 can function as a supporting substrate of the flexible device.

The material that can be used for the substrate 75a can be used for the substrate 29.

Then, the silicon layer 25 and the FPC 77 are electrically connected to each other through the connector 76 (FIGS. 17(A) and (B)). Accordingly, the conductive layer 43c and the FPC 77 can be electrically connected to each other. Alternatively, the conductive layer 43c and the FPC 77 are electrically connected to each other through the connector 76 as illustrated in FIG. 17(C).

In this embodiment, an example using a top-emission light-emitting element is shown. In the case where an external connection terminal is exposed from the protective layer 75 side and electrically connected to the FPC 77, a display region cannot overlap with the FPC 77 because the protective layer 75 is on the display surface side, and thus a region of the display device that overlaps with the FPC 77 is limited. In contrast, in one embodiment of the present invention, the conductive layer 43c and the silicon layer 25 can be connected to each other through the opening of the resin layer 23 by using the photosensitive material for the resin layer 23. Then, the silicon layer 25 or the conductive layer 43c can be exposed from the side opposite to the display surface by peeling the formation substrate 14 and, after that, the FPC 77 can be electrically connected to the silicon layer 25 or the conductive layer 43c. That is, the conductive layer 43c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

Through the above steps, the display device using an oxide semiconductor for the transistor and a separate coloring method for an EL element can be manufactured (FIG. 17).

[Manufacturing Method Example 2B]

Figure 18A:
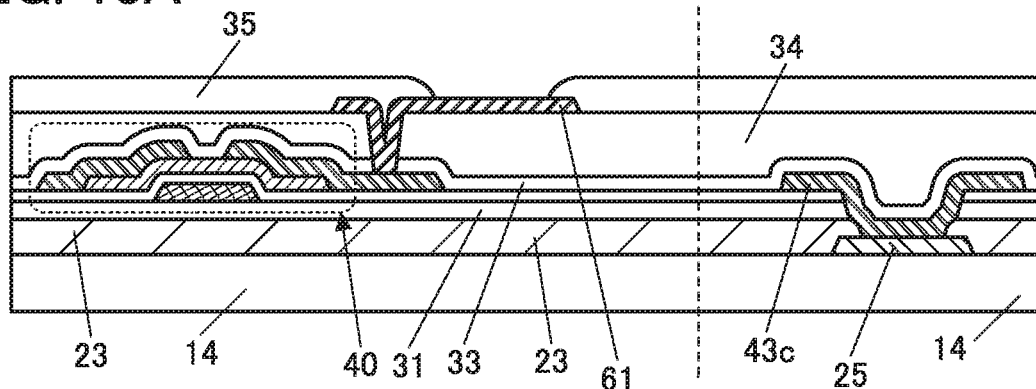
FIG. 18 Drawings illustrating an example of a manufacturing method of a flexible device.

First, components from the silicon layer 25 to the insulating layer 35 are formed in this order over the formation substrate 14 in a manner similar to that in the manufacturing method example 1B (FIG. 18(A)).

Figure 18B:
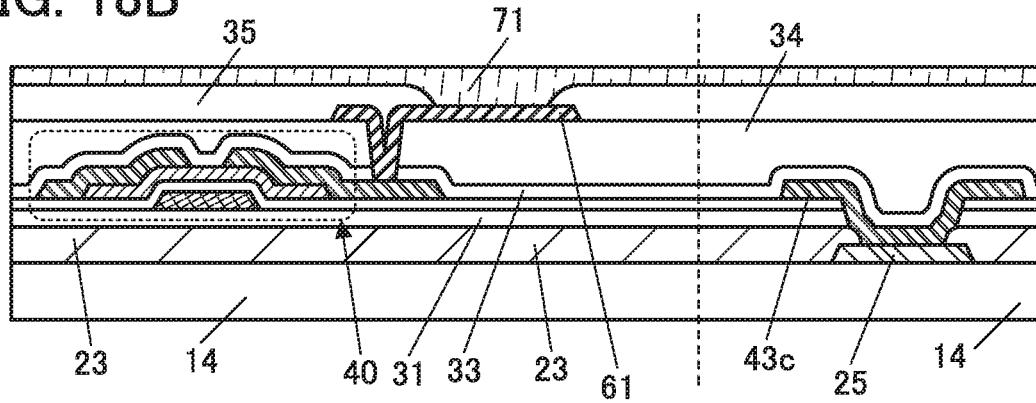

Then, the protective layer 71 is formed as illustrated in FIG. 18(B). For the material and formation method of the protective layer 71, the manufacturing method example 1B in Embodiment 1 can be referred to.

Figure 18C:
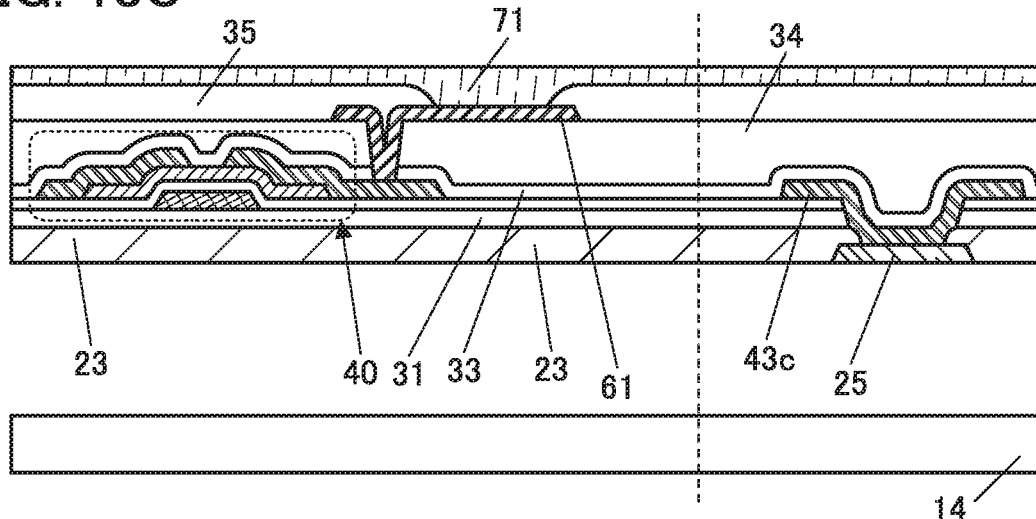

Next, the formation substrate 14 and the transistor 40 are separated from each other in a manner similar to that in the manufacturing method example 1B (FIG. 18(C)). FIG. 18(C) illustrates an example in which separation occurs at the interface between the formation substrate 14 and the silicon layer 25 and the interface between the formation substrate 14 and the resin layer 23. The resin layer 23 and the silicon layer 25 are exposed by the separation.

After the formation substrate 14 and transistor 40 are separated from each other, the protective layer 71 is removed.

Then, the EL layer 62 and the conductive layer 63 are formed, whereby the display element 60 is manufactured. Thus, by sealing the display element 60, the display device 10 can be manufactured. For sealing of the display element 60, one or more of the insulating layer 74, the protective layer 75, the substrate 75a, the bonding layer 75b, and the like can be used.

The EL layer 62 and the conductive layer 63 may be formed while the resin layer 23 and the conductive layer 43c are fixed to a stage, but are preferably formed while the resin layer 23 and the conductive layer 43c are fixed to a supporting substrate by a tape or the like and the supporting substrate is placed on the stage of a deposition apparatus. Fixing the resin layer 23 and the conductive layer 43c to the supporting substrate facilitates the transfer of the stacked-layer structure including the resin layer 23.

In the manufacturing method example 2B, after the formation substrate 14 is peeled, the EL layer 62 and the conductive layer 63 can be formed. In the case where a region having low adhesion is generated in a stack including the EL layer 62 and the like, the stack is formed after peeling so that a decrease in the yield of peeling can be suppressed. With the use of the manufacturing method example 2B, a material can be selected more freely, leading to fabrication of a highly reliable display device at lower cost.

[Manufacturing Method Example 3B]

Next, the case of manufacturing a display device that includes an oxide semiconductor in a transistor and uses a color filter method will be described as an example. A flexible device of one embodiment of the present invention and a manufacturing method thereof will be specifically described below with reference to FIG. 19-FIG. 25.

Figure 19A:
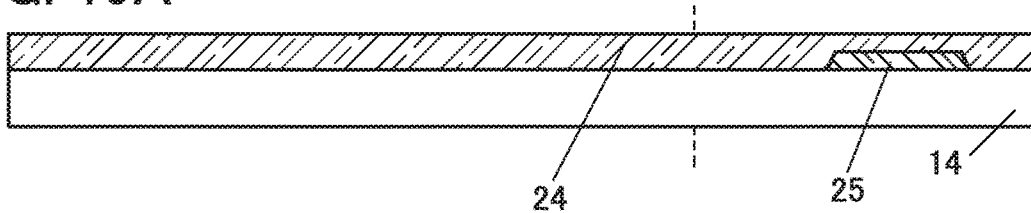
FIG. 19 Drawings illustrating an example of a manufacturing method of a flexible device.

First, the island-shaped silicon layer 25 is formed over the formation substrate 14 in a manner similar to that in the manufacturing method example 1B (FIG. 19(A)).

Next, the first layer 24 is formed using a photosensitive material in a manner similar to that in the manufacturing method example 1B (FIG. 19(A)).

Figure 19B:
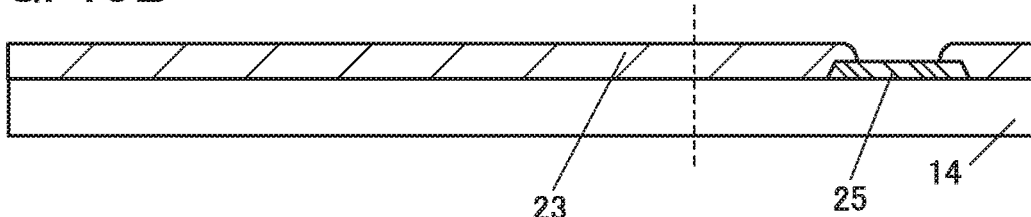

Next, the first layer 24 processed into a desired shape is heated in a manner similar to that in the manufacturing method example 1B, whereby the resin layer 23 is formed (FIG. 19(B)). FIG. 19(B) illustrates an example in which the opening that reaches the silicon layer 25 is provided in the resin layer 23.

Figure 19C:
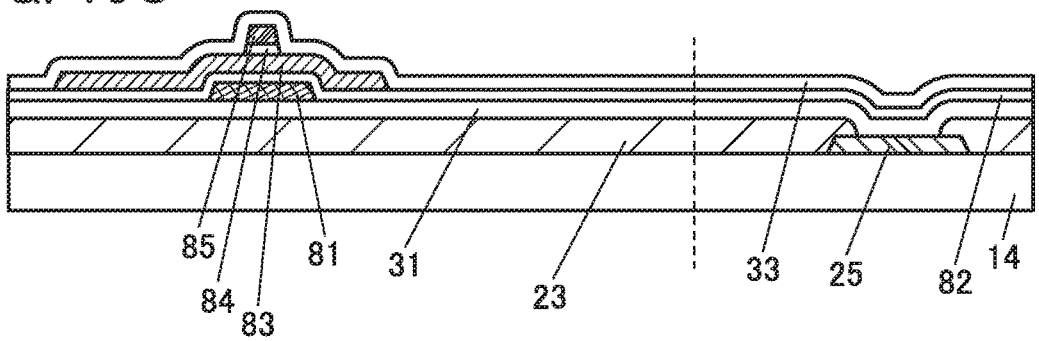

Next, the insulating layer 31 is formed over the resin layer 23 in a manner similar to that in the manufacturing method example 1B (FIG. 19(C)).

Figure 19D:
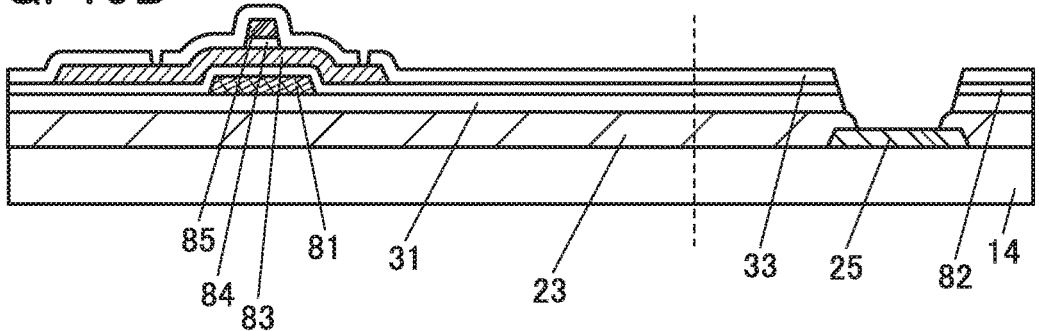
Figure 19E:
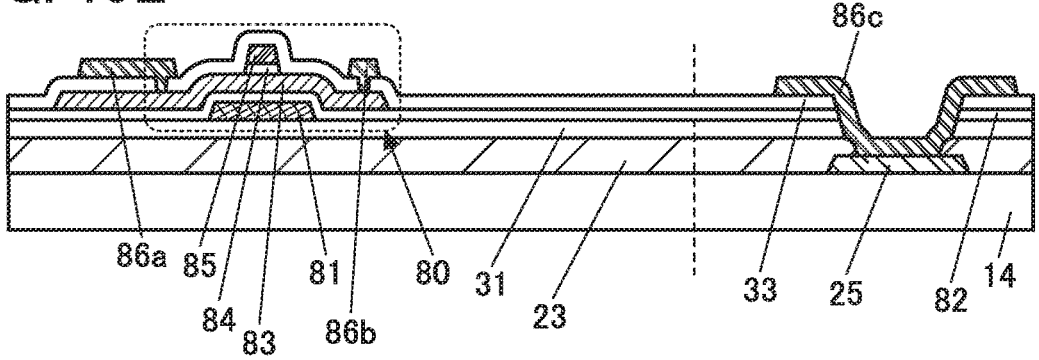

Next, the transistor 80 is formed over the insulating layer 31 (FIGS. 19(C)-(E)). For the material and formation method of the transistor 80, the description of the manufacturing method example 3A in Embodiment 1 can be referred to.

Specifically, first, the conductive layer 81 is formed over the insulating layer 31 (FIG. 19(C)).

Next, the insulating layer 82 is formed (FIG. 19(C)).

Then, the oxide semiconductor layer 83 is formed (FIG. 19(C)).

Then, the insulating layer 84 and the conductive layer 85 are formed (FIG. 19(C)).

Next, the insulating layer 33 that covers the oxide semiconductor layer 83, the insulating layer 84, and the conductive layer 85 is formed (FIG. 19(C)).

An opening is provided in each of the portions of the insulating layer 31, the insulating layer 82, and the insulating layer 33 which overlap with the opening of the resin layer 23 (FIG. 19(D)). The silicon layer 25 is exposed by providing the openings. Here, an example in which the openings of the insulating layer 31, the insulating layer 82, and the insulating layer 33 are formed at a time is shown.

Next, the conductive layers 86a, 86b, and 86c are formed (FIG. 19(E)). The conductive layers 86a and 86b are each electrically connected to the oxide semiconductor layer 83 through the opening of the insulating layer 33. The conductive layer 86c is connected to the silicon layer 25 through the openings provided in the resin layer 23, the insulating layer 31, the insulating layer 82, and the insulating layer 33.

In the above manner, the transistor 80 can be manufactured (FIG. 19(E)).

Figure 20A:
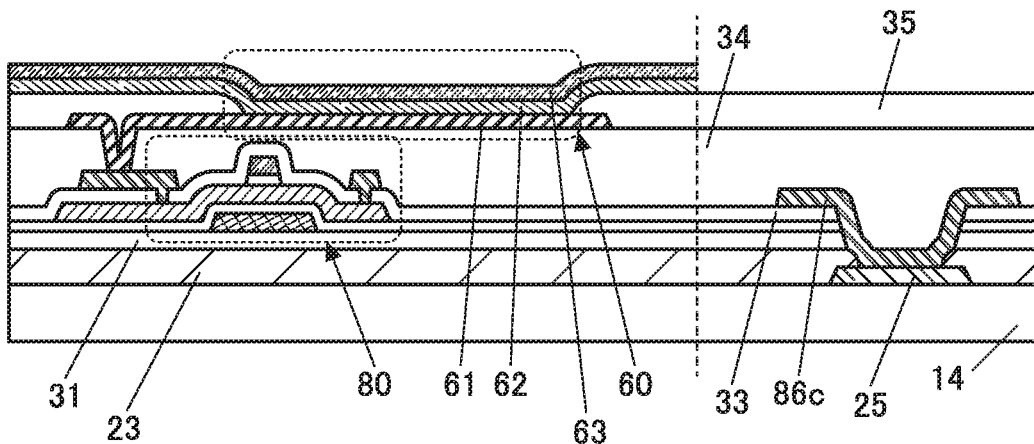
FIG. 20 Drawings illustrating an example of a manufacturing method of a flexible device.

Next, components from the insulating layer 34 to the display element 60 are formed over the insulating layer 33 (FIG. 20(A)). For these steps, the manufacturing method example 1A can be referred to.

Figure 20B:
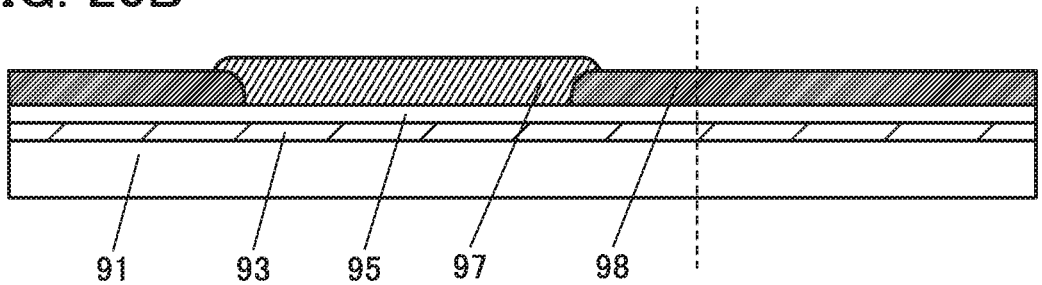

In a manner similar to that in the manufacturing method example 3A, the resin layer 93, the insulating layer 95, the coloring layer 97, and the light-blocking layer 98 are formed over the formation substrate 91 (FIG. 20(B)).

Figure 20C:
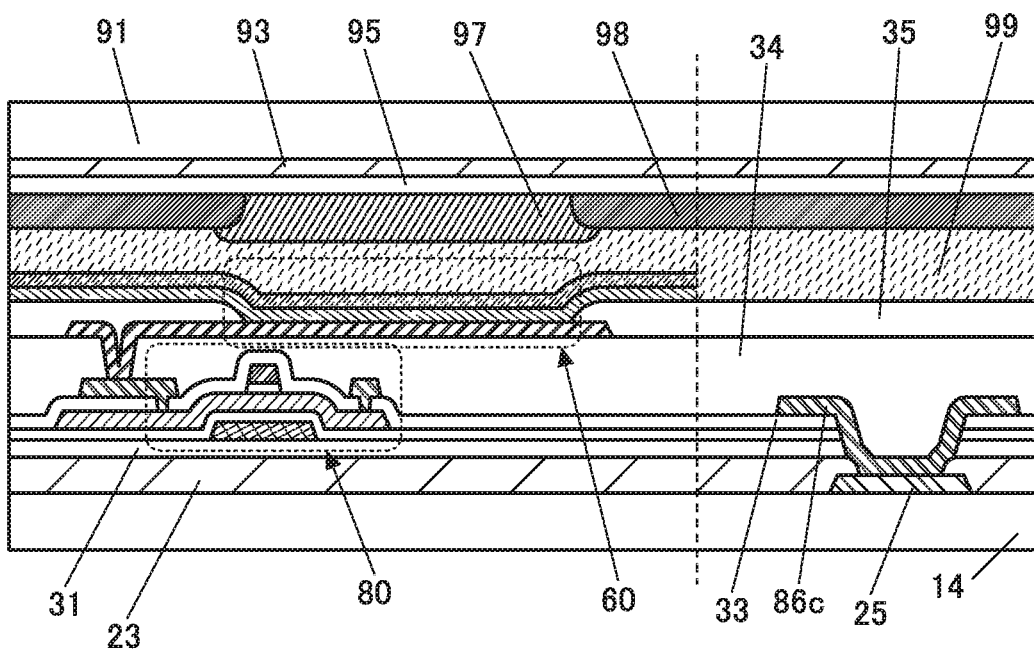

Then, a surface of the formation substrate 14 on which the silicon layer 25 and the like are formed and a surface of the formation substrate 91 on which the resin layer 93 and the like are formed are attached to each other with the bonding layer 99 (FIG. 20(C)).

Figure 21A:
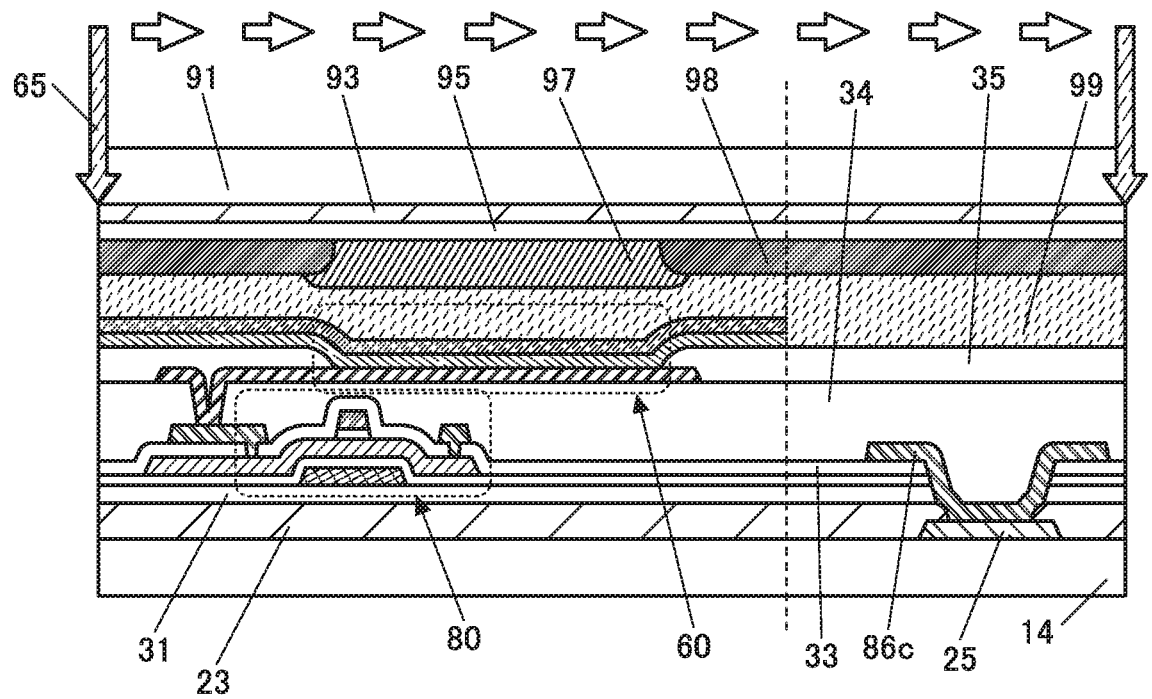
FIG. 21 Drawings illustrating an example of a manufacturing method of a flexible device.

Next, the resin layer 93 is irradiated with the laser light 65 through the formation substrate 91 (FIG. 21(A)). Here, an example in which the formation substrate 91 is separated ahead of the formation substrate 14 is shown.

With irradiation with the laser light 65, the resin layer 93 is embrittled. Alternatively, with irradiation with the laser light 65, the adhesion between the resin layer 93 and the formation substrate 91 is decreased.

Figure 21B:
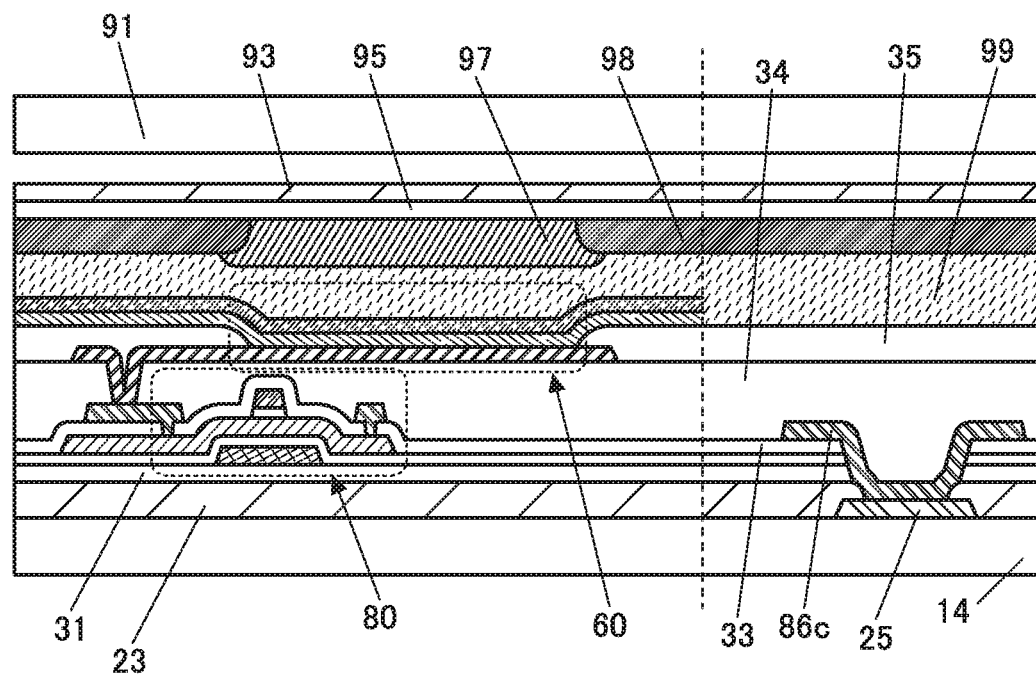

Then, the formation substrate 91 and the insulating layer 95 are separated from each other (FIG. 21(B)). FIG. 21(B) illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 21(A).

Figure 22A:
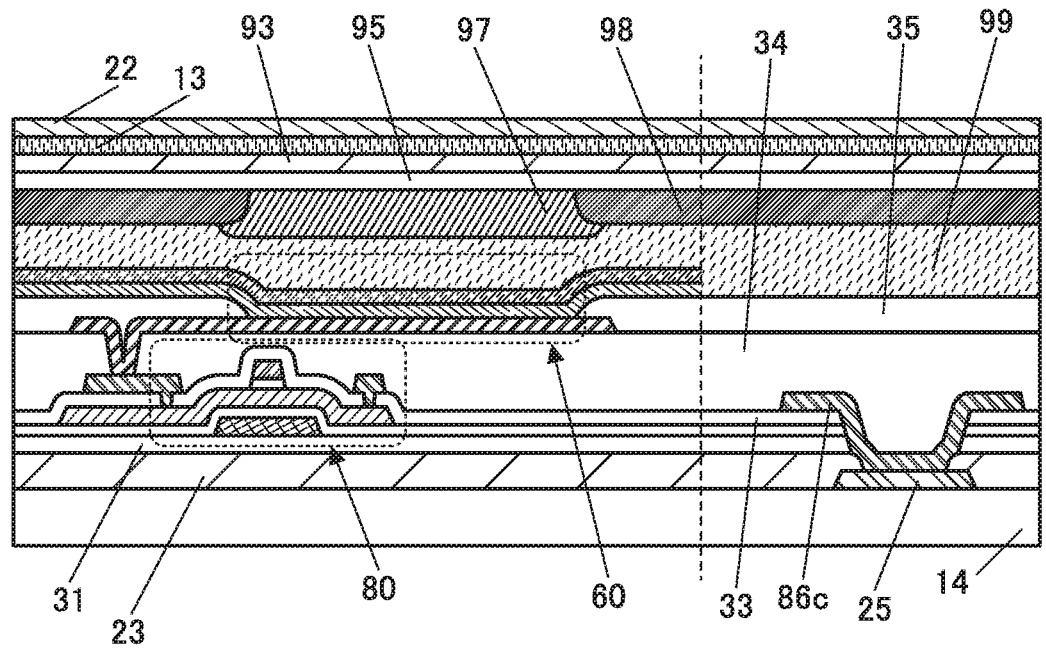
FIG. 22 Drawings illustrating an example of a manufacturing method of a flexible device.

Then, the exposed resin layer 93 (or the insulating layer 95) and the substrate 22 are attached to each other with the bonding layer 13 (FIG. 22(A)).

In FIG. 22(A), light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the bonding layer 13.

Figure 22B:
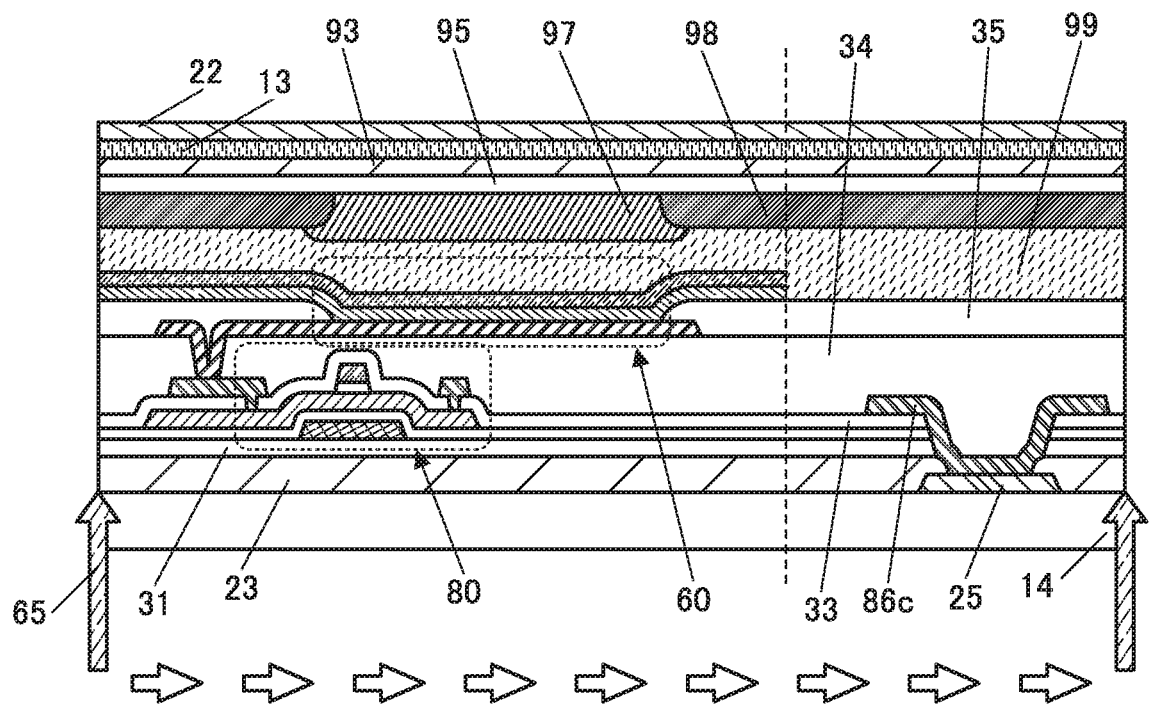

Next, the resin layer 23 and the silicon layer 25 are irradiated with the laser light 65 through the formation substrate 14 (FIG. 22(B)).

With irradiation with the laser light 65, the resin layer 23 is embrittled. Alternatively, with irradiation with the laser light 65, the adhesion between the resin layer 23 and the formation substrate 14 is decreased.

With irradiation with the laser light 65, the silicon layer 25 is embrittled. Alternatively, with irradiation with the laser light 65, the adhesion between the silicon layer 25 and the conductive layer 86c or the adhesion between the silicon layer 25 and the formation substrate 14 is decreased.

Figure 23A:
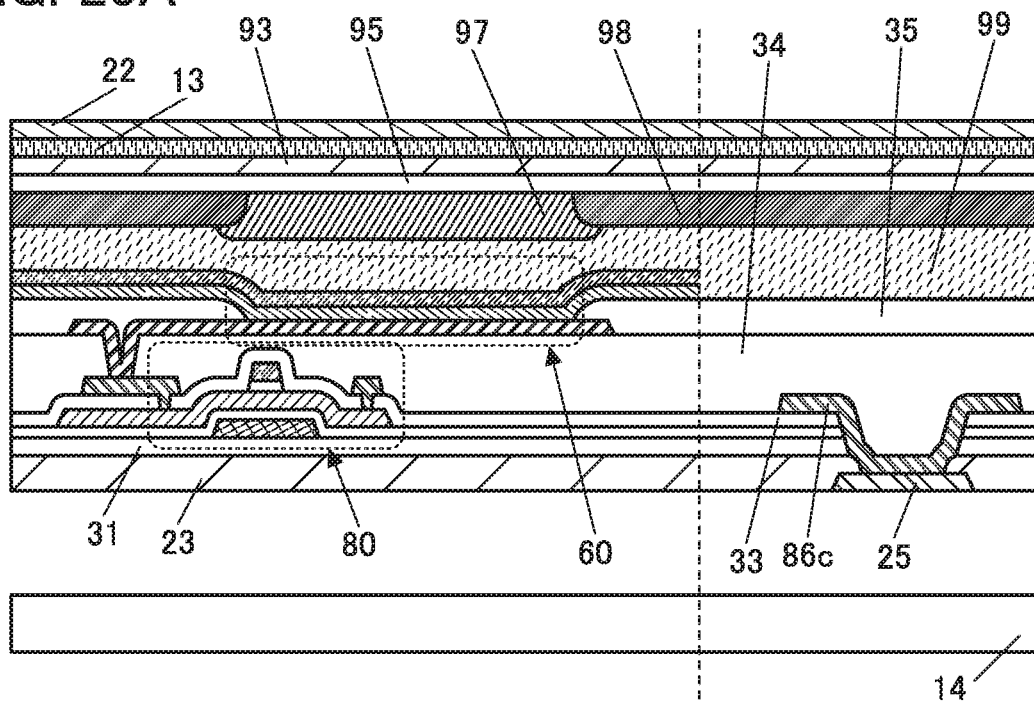
FIG. 23 Drawings illustrating examples of a manufacturing method of a flexible device.
Figure 23B:
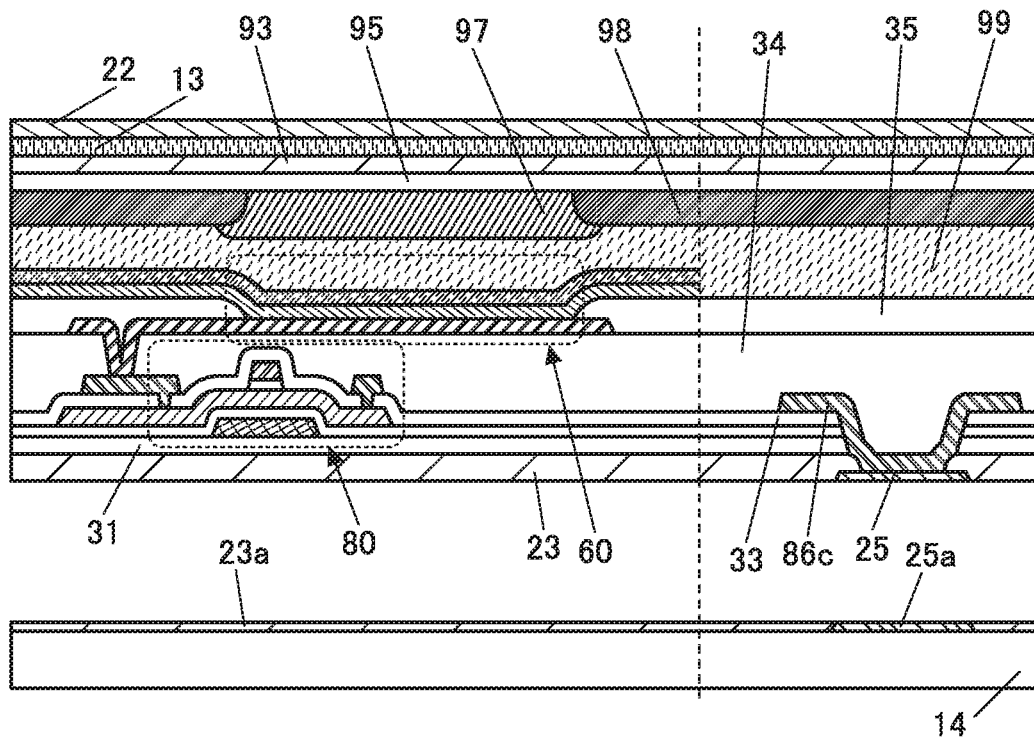

Then, the formation substrate 14 and the insulating layer 31 are separated from each other (FIG. 23(A) or FIG. 23(B)).

FIG. 23(A) illustrates an example in which separation occurs at the interface between the formation substrate 14 and the silicon layer 25 and the interface between the formation substrate 14 and the resin layer 23. The resin layer 23 and the silicon layer 25 are exposed by the separation.

FIG. 23(B) illustrates an example in which separation occurs in the resin layer 23 and the silicon layer 25. Part of the resin layer (the resin layer 23a) and part of the silicon layer (the silicon layer 25a) remain over the formation substrate 14. The thicknesses of the resin layer 23 and the silicon layer 25 remaining on the insulating layer 31 side are reduced as compared with these in FIG. 22(B).

Note that separation might occur at the interface between the silicon layer 25 and the conductive layer 86c in a manner similar to that in the manufacturing method example 1B (see FIGS. 16(A) and (B)).

Figure 24A:
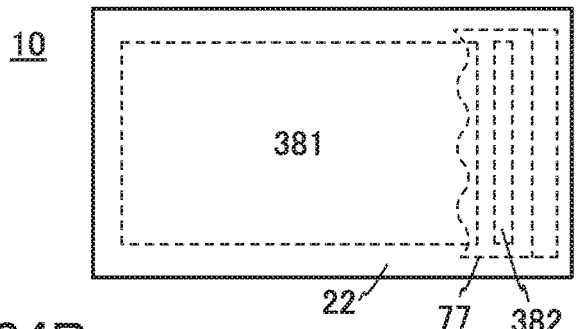
FIG. 24 Drawings illustrating examples of a flexible device.

By the separation of the formation substrate 14 and the transistor 80, the display device 10 can be manufactured (FIGS. 24(A) and (C)). The display device 10 can remain being bent or can be bent repeatedly, for example.

Figure 24B:
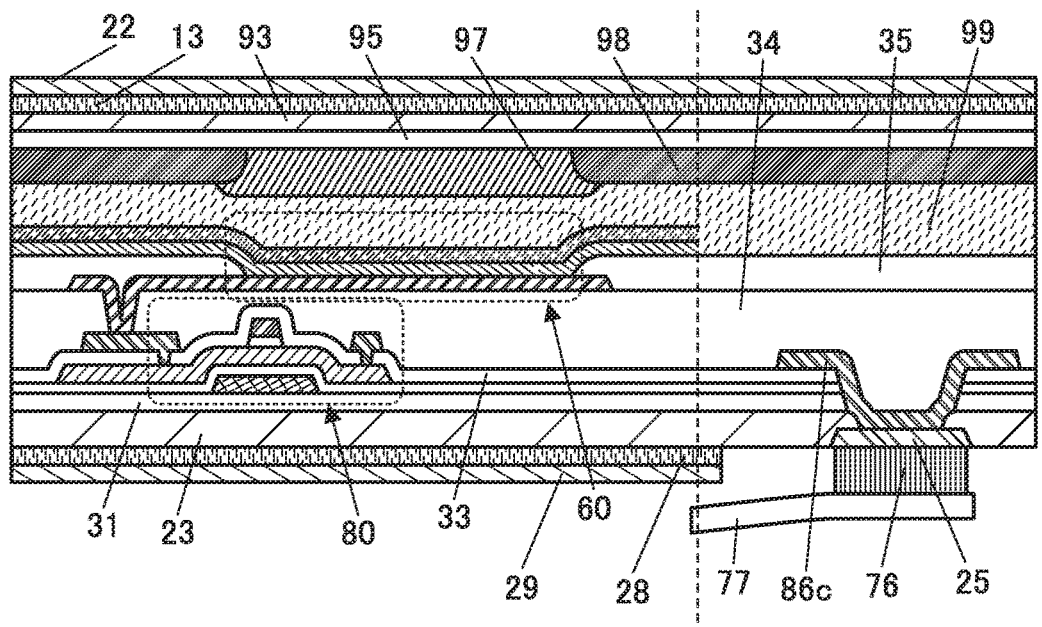
Figure 24C:
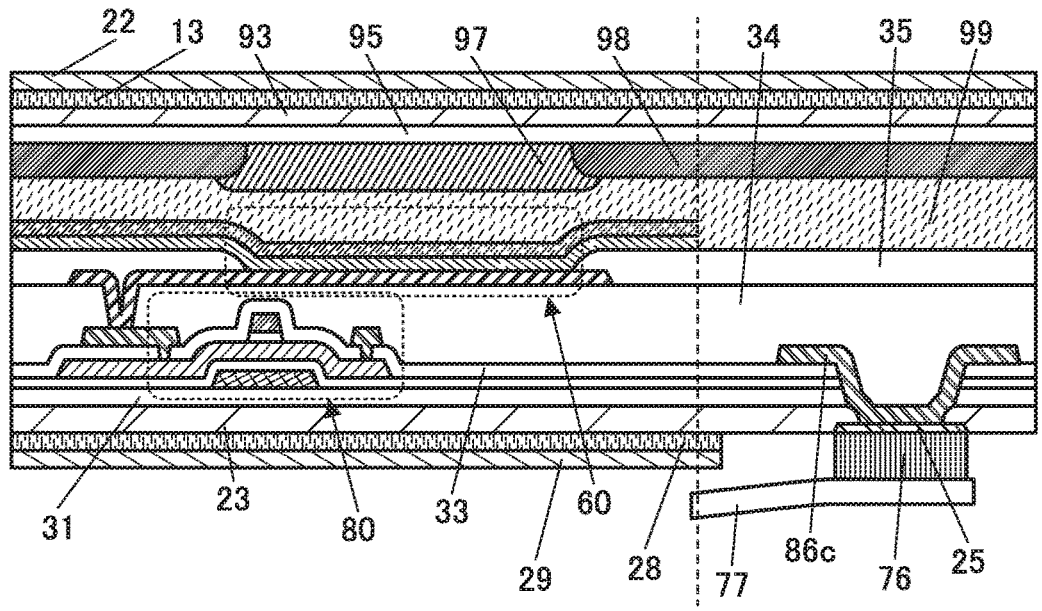

FIG. 24(A) is a top view of the display device 10. FIGS. 24(B) and (C) are each a cross-sectional view of the display portion 381 of the display device 10 and a cross-sectional view of a connection portion for connection to the FPC 77. FIG. 24(B) illustrates the display device 10 that can be manufactured in the case where separation occurs at the interface indicated in FIG. 23(A). FIG. 24(C) illustrates the display device 10 that can be manufactured in the case where separation occurs at the interface indicated in FIG. 23(B).

The display device 10 includes a pair of substrates (the substrate 22 and the substrate 29). The substrate 22 side is to a display surface side. The display device includes the display portion 381 and the driver circuit portion 382. The FPC 77 is attached to the display device.

As illustrated in FIGS. 24(B) and (C), the substrate 29 may be attached to the surface of the resin layer 23 which is exposed by the separation, with the bonding layer 28. Note that the substrate 29 and the bonding layer 28 are placed not to overlap with the silicon layer 25.

Then, the silicon layer 25 and the FPC 77 are electrically connected to each other through the connector 76 (FIGS. 24(B) and (C)). Accordingly, the conductive layer 86c and the FPC 77 can be electrically connected to each other.

In this embodiment, an example using a top-emission light-emitting element is described. In the case where an external connection terminal is exposed from the substrate 22 side and electrically connected to the FPC 77, a display region cannot overlap with the FPC 77 because the substrate 22 side is the display surface side, and thus a region of the display device that overlaps with the FPC 77 is limited. By contrast, in one embodiment of the present invention, the conductive layer 86c and the silicon layer 25 can be connected to each other through the opening of the resin layer 23 by using the photosensitive material for the resin layer 23. Then, the silicon layer 25 or the conductive layer 86c can be exposed from the side opposite to the display surface by peeling the formation substrate 14 and, after that, the FPC 77 can be electrically connected to the silicon layer 25 or the conductive layer 86c. Therefore, the conductive layer 86c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 3B is an example in which the peeling method of one embodiment of the present invention is performed twice to manufacture a flexible device. In one embodiment of the present invention, each of the functional elements and the like included in the flexible device is manufactured over the formation substrate; thus, even in the case where a high-resolution display device is manufactured, high alignment accuracy of the flexible substrate is not required. It is thus easy to attach the flexible substrate.

Modification Example 1B

With use of one embodiment of the present invention, a display device having a bottom-emission structure can be manufactured.

Figure 25A:
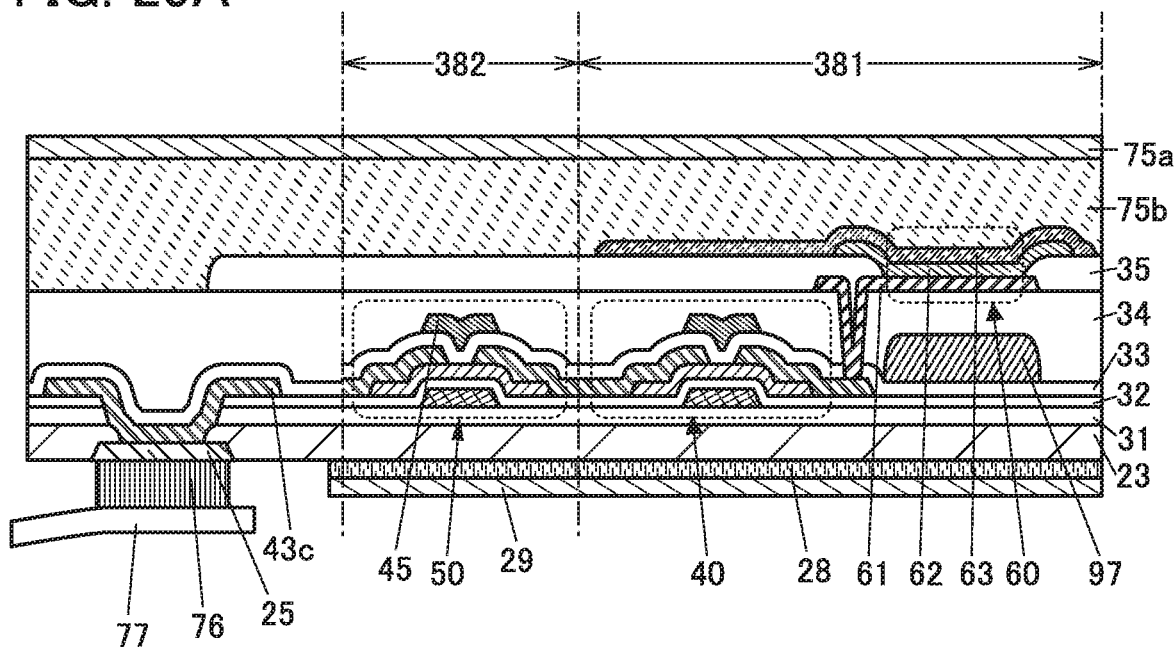
FIG. 25 Drawings illustrating an example of a flexible device.

The display device in FIG. 25(A) is a bottom-emission display device using a color filter method. FIG. 25(A) is a cross-sectional view of the display portion 381 of the display device, a cross-sectional view of the driver circuit portion 382, and a cross-sectional view of a connection portion with the FPC 77.

The display device in FIG. 25(A) includes the substrate 29, the bonding layer 28, the resin layer 23, the silicon layer 25, the insulating layer 31, the transistor 40, the transistor 50, the conductive layer 43c, the insulating layer 33, the insulating layer 34, the insulating layer 35, the display element 60, the bonding layer 75*b*, the substrate 75*a*, and the coloring layer 97.

FIG. 25(A) is an example including the transistor 40 and the transistor 50 which are each a transistor in which the conductive layer 45 functioning as a gate is added to the components of the transistor 40 in FIG. 17(A).

The display element 60 emits light to the coloring layer 97 side.

The FPC 77 and the silicon layer 25 are electrically connected to each other through the connector 76. In the cross-sectional view of the connection portion for connection to the FPC 77, an example in which the end portion of the insulating layer 35 is not exposed at the end portion of the display device is shown.

Modification Example 2B

Figure 25B:
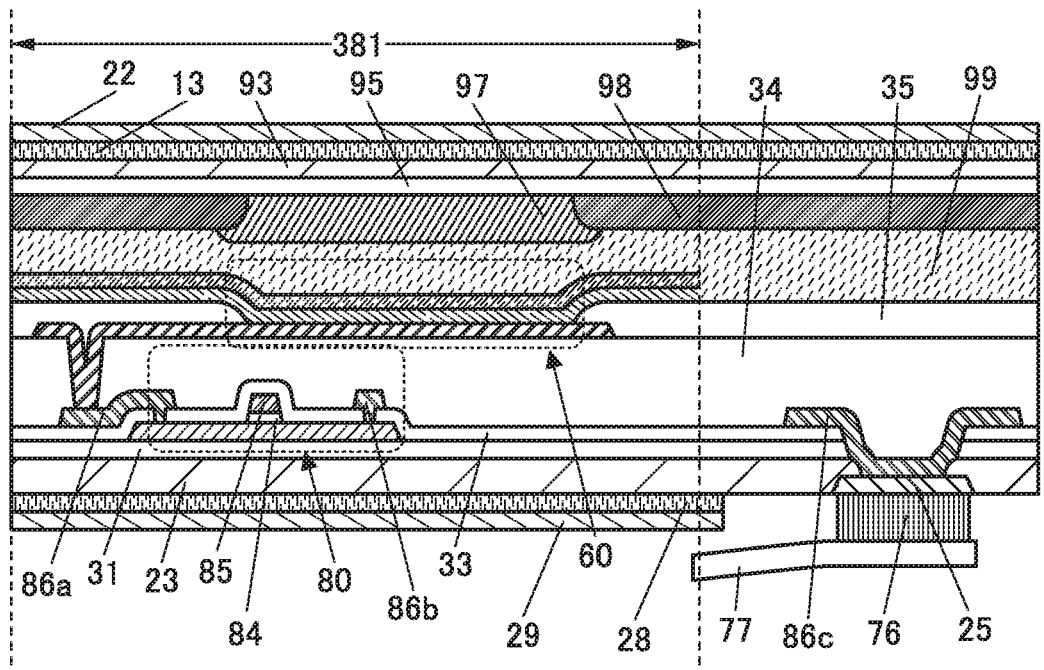

The display device in FIG. 25(B) is different from the display device in FIG. 24(B) in that the conductive layer 81 and the insulating layer 82 are not provided in the transistor 80.

As described above, in one embodiment of the present invention, a flexible device can be manufactured by separating the transistor or the like from the formation substrate using the resin layer and the silicon layer.

In one embodiment of the present invention, the resin layer is formed using the photosensitive material; thus, the resin layer with a desired shape can be easily formed. When the conductive layer electrically connected to the silicon layer through the opening of the resin layer is provided, the conductive layer can be electrically connected to the circuit board. The external connection terminal and the circuit board can be electrically connected to each other on the surface opposite to the display surface. Thus, a space for bending the FPC and the like in incorporating the display device in an electronic device can be saved, which enables the electronic device to be smaller.

In one embodiment of the present invention, the manufacturing process of the transistor can be performed at a low temperature with the use of an oxide semiconductor in the channel formation region of the transistor. Furthermore, the resin layer can have a small thickness and low heat resistance. Thus, there are advantages in that a wide choice of materials is offered for the resin layer, high mass productivity can be obtained at low cost, and peeling and fabrication of a flexible device can be performed using a large-sized substrate, for example.

This embodiment can be combined with the other embodiments as appropriate.

Embodiment 3

In this embodiment, a display module and electronic devices that can be manufactured using one embodiment of the present invention will be described with reference to FIG. 26 and FIG. 27.

Figure 26:
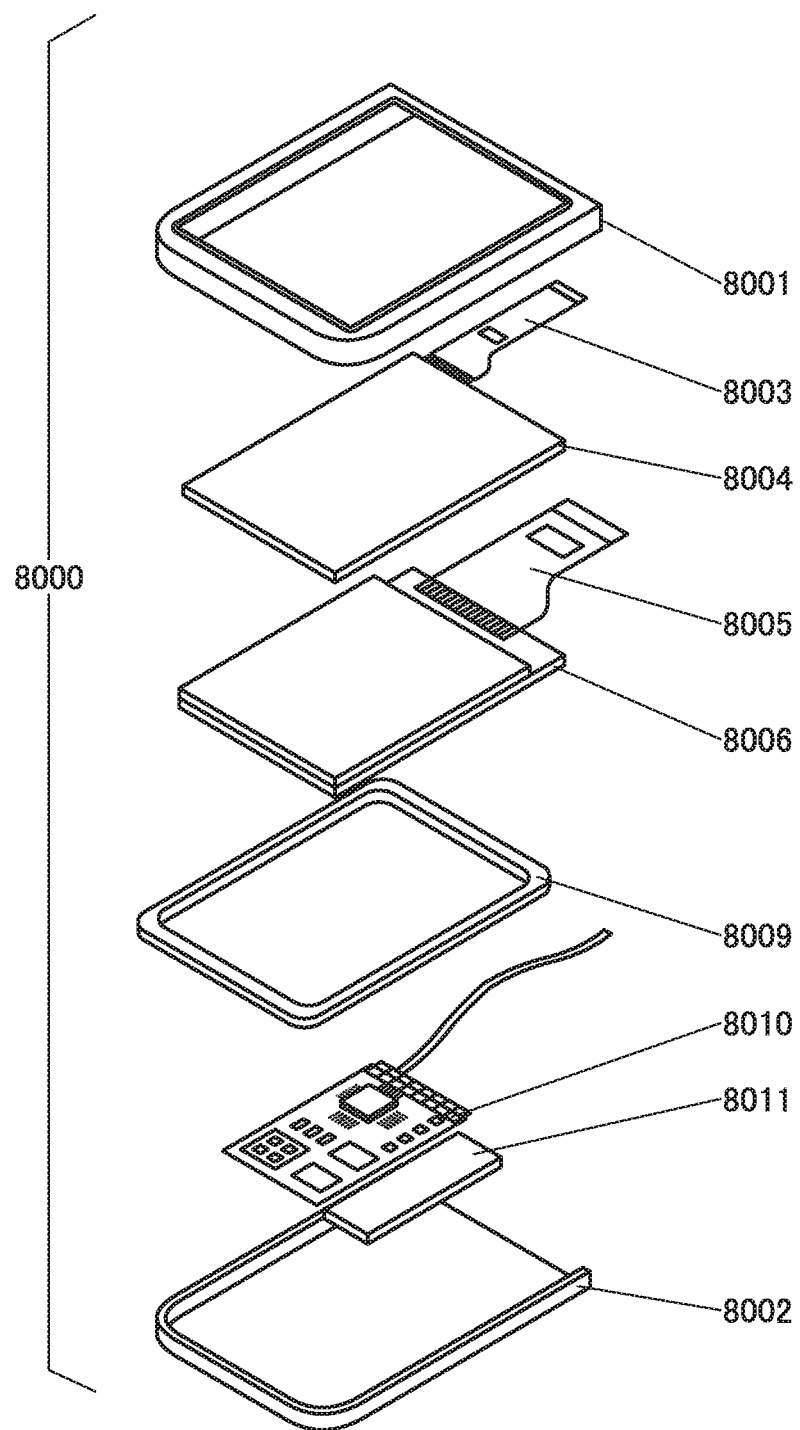
FIG. 26 A drawing illustrating an example of a display module.

A display module 8000 in FIG. 26 includes a touch panel 8004 connected to an FPC 8003, a display panel 8006 connected to an FPC 8005, a frame 8009, a printed circuit board 8010, and a battery 8011 between an upper cover 8001 and a lower cover 8002.

The display device manufactured using one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 has a function of protecting the display panel 8006 and also functions as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Highly reliable electronic devices with curved surfaces can be manufactured by one embodiment of the present invention. In addition, flexible and highly reliable electronic devices can be manufactured by one embodiment of the present invention.

Examples of electronic devices include a television set, a desktop or notebook personal computer, a monitor for a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions, for example, a function of displaying all kinds of information (e.g., a still image, a moving image, and a text image) on a display portion, a touch panel function, a function of displaying a calendar, date, time, and the like, a function of executing all kinds of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on the plurality of display portions, or the like. Furthermore, the electronic device including an image receiving portion can have a function of taking a still image or a moving image, a function of automatically or manually correcting the taken image, a function of storing the taken image in a recording medium (an external recording medium or a recording medium incorporated in the electronic device), a function of displaying the taken image on a display portion, or the like. Note that the functions of the electronic device of one embodiment of the present invention are not limited thereto, and the electronic devices can have a variety of functions.

Figure 27A:
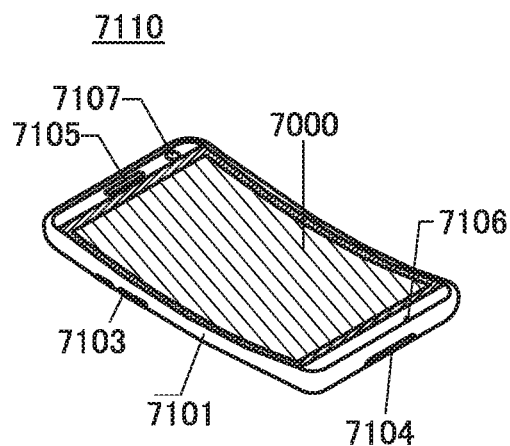
FIG. 27 Drawings illustrating examples of an electronic device.
Figure 27B:
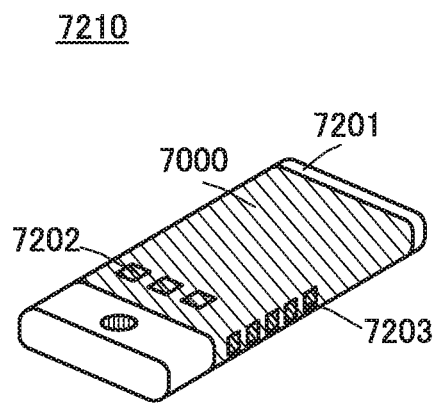
Figure 27C:
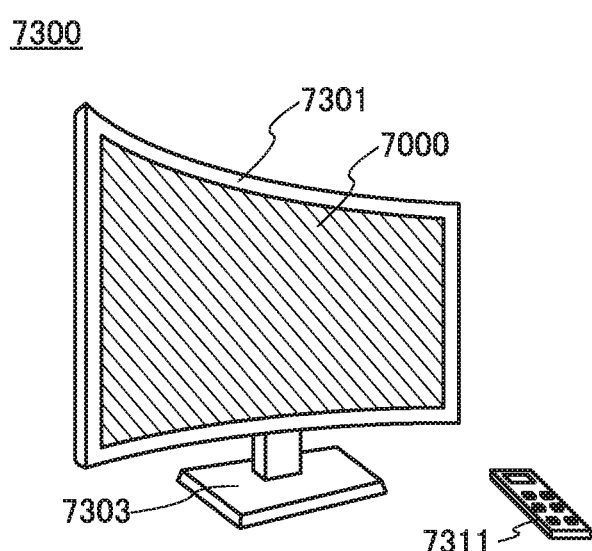

FIGS. 27(A)-(C) illustrate examples of an electronic device including a curved display portion 7000. The display surface of the display portion 7000 is bent, and images can be displayed on the curved display surface. The display portion 7000 may have flexibility.

The display portion 7000 can be manufactured using the display device of one embodiment of the present invention. A highly reliable electronic device having a curved display portion can be provided by one embodiment of the present invention.

FIG. 27(A) illustrates an example of a mobile phone. A mobile phone 7110 illustrated in FIG. 27(A) includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. A variety of operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the (vertical or horizontal) orientation of the mobile phone. Furthermore, the direction of display on the screen can be changed by touch on the display portion 7000, operation with the operation button 7103, sound input using the microphone 7106, or the like.

FIG. 27(B) illustrates an example of a portable information terminal. A portable information terminal 7210 illustrated in FIG. 27(B) includes a housing 7201 and the display portion 7000. The portable information terminal 7210 may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

The portable information terminals illustrated in this embodiment functions as, for example, one or more of a telephone set, a notebook, and an information browsing device. Specifically, the portable information terminals each can be used as a smartphone. The portable information terminal illustrated in this embodiment is capable of executing, for example, a variety of applications such as mobile phone calls, e-mailing, reading and editing texts, music reproduction, Internet communication, and a computer game.

The portable information terminal 7210 can display text, image information, and the like on its plurality of surfaces. For example, three operation buttons 7202 can be displayed on one surface, and information 7203 indicated by a rectangle can be displayed on another surface. FIG. 27B illustrates an example in which the operation buttons 7202 are displayed on the upper side of the portable information terminal 7210 and the information 7203 is displayed on the side of the portable information terminal 7210. Note that the operation buttons 7202 may be displayed on the side of the portable information terminal 7210 and the information 7203 may be displayed at the top of the portable information terminal 7210, for example. Information may be displayed on three or more surfaces of the portable information terminal 7210.

Examples of the information 7203 include notification from an SNS (social networking service), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 27(C) illustrates an example of a television set. In a television set 7300, the display portion 7000 is incorporated into a housing 7301. Here, the housing 7301 is supported by a stand 7303.

The television set 7300 illustrated in FIG. 27(C) can be operated with an operation switch of the housing 7301 or a separate remote controller 7311. Alternatively, the display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be operated and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 27D:
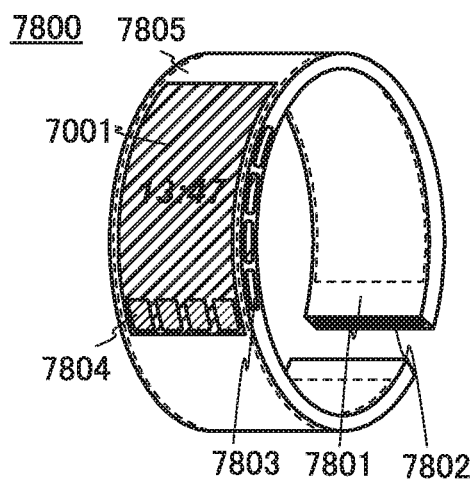
Figure 27E:
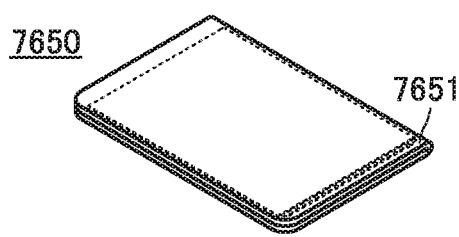
Figure 27F:
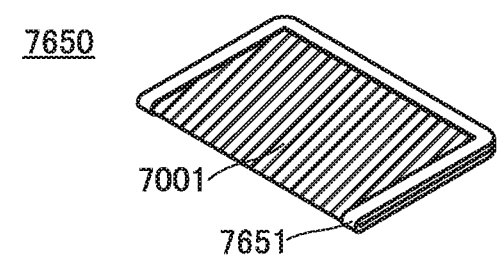

FIGS. 27(D)-(F) each illustrate an example of a portable information terminal including a flexible and bendable display portion 7001.

The display portion 7001 is manufactured using the display device or the like of one embodiment of the present invention. For example, a display device that can be bent with a radius of curvature greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a flexible display portion.

FIG. 27(D) illustrates an example of a wrist-watch-type portable information terminal. A portable information terminal 7800 includes a band 7801, the display portion 7001, an input/output terminal 7802, operation buttons 7803, and the like. The band 7801 functions as a housing. A flexible battery 7805 can be mounted on the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

The operation buttons 7803 can give a variety of functions such as time setting, turning on or off of the power, turning on or off of wireless communication, setting and cancellation of silent mode, and setting and cancellation of power saving mode. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can execute near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included, data can be directly transmitted to and received from another information terminal via a connector. Charging through the input/output terminal 7802 is also possible. Note that charging operation of the portable information terminal described as an example in this embodiment can be performed by contactless power transmission without using the input/output terminal.

FIGS. 27(E) and (F) illustrate an example of a foldable portable information terminal. FIG. 27(E) illustrates a portable information terminal 7650 in the folded state in which the display portion 7001 is on the inside. FIG. 27(F) illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged. Note that although FIGS. 27(E) and (F) illustrate a structure of the portable information terminal 7650 that is folded in two, the portable information terminal 7650 may be folded in three, four, or more. The portable information terminal 7650 may include an operation button, an external connection port, a speaker, a microphone, an antenna, a camera, a battery, or the like.

This embodiment can be combined with the other embodiments as appropriate.

REFERENCE NUMERALS

10: display device
13: bonding layer
14: formation substrate
22: substrate
23: resin layer
23a: resin layer
24: first layer
25: silicon layer
25a: silicon layer
28: bonding layer
29: substrate
31: insulating layer
32: insulating layer
33: insulating layer
34: insulating layer
35: insulating layer
40: transistor
41: conductive layer
43a: conductive layer
43b: conductive layer
43c: conductive layer
44: oxide semiconductor layer
45: conductive layer
50: transistor
60: display element
61: conductive layer
62: EL layer
63: conductive layer
65: laser light
71: protective layer
74: insulating layer
75: protective layer
75a: substrate
75b: bonding layer
76: connector
77: FPC
80: transistor
81: conductive layer
82: insulating layer
83: oxide semiconductor layer
84: insulating layer
85: conductive layer
86a: conductive layer
86b: conductive layer
86c: conductive layer
91: formation substrate
93: resin layer
95: insulating layer
97: coloring layer
98: light-blocking layer
99: bonding layer
381: display portion
382: driver circuit portion
7000: display portion
7001: display portion
7101: housing
7103: operation button
7104: external connection port
7105: speaker
7106: microphone
7107: camera
7110: mobile phone
7201: housing
7202: operation button
7203: information
7210: portable information terminal
7300: television set
7301: housing
7303: stand
7311: remote controller
7650: portable information terminal
7651: non-display portion
7800: portable information terminal
7801: band 7802: input/output terminal
7803: operation button
7804: icon
7805: battery
8000: display module
8001: upper cover
8002: lower cover
8003: FPC
8004: touch panel
8005: FPC
8006: display panel
8009: frame
8010: printed circuit board
8011: battery

The invention claimed is:

1. A peeling method comprising:
forming a silicon layer configured to release hydrogen by irradiation with light over a formation substrate;
forming a first layer using a photosensitive material over the silicon layer;
forming a resin layer having an opening by forming the opening in a portion of the first layer which overlaps with the silicon layer by a photolithography method;
forming a transistor including an oxide semiconductor in a channel formation region over the resin layer;
forming a conductive layer to overlap with the opening of the resin layer and the silicon layer;
irradiating the silicon layer with light using a laser; and
separating the transistor and the formation substrate from each other.

2. A peeling method comprising:
forming a silicon layer having an island shape configured to release hydrogen by irradiation with light over a formation substrate;
forming a first layer using a photosensitive material over the formation substrate and the silicon layer;
forming a resin layer having an opening by forming the opening in a portion of the first layer which overlaps with the silicon layer by a photolithography method;
forming a transistor including an oxide semiconductor in a channel formation region over the resin layer;
forming a conductive layer to overlap with the opening of the resin layer and the silicon layer;
irradiating the silicon layer and the resin layer with light using a laser; and
separating the transistor and the formation substrate from each other.

3. The peeling method according to claim 2, wherein the resin layer is formed to a thickness greater than a thickness of the silicon layer and a thickness less than or equal to 3 µm.

4. The peeling method according to claim 1, wherein a hydrogenated amorphous silicon layer is formed as the silicon layer.

5. The peeling method according to claim 1, wherein a linear laser is used as the laser.

6. The peeling method according to claim 1, wherein the conductive layer is formed using a same material and a same step as an electrode included in the transistor.

7. The peeling method according to claim 1, wherein the first layer is formed using a solution having a viscosity greater than or equal to 5 cP and less than 100 cP.

8. The peeling method according to claim 1, wherein the first layer is formed with a spin coater.

9. The peeling method according to claim 1, wherein the first layer is formed using a thermosetting material.

10. The peeling method according to claim 9,
wherein the resin layer is formed by heating the first layer at a first temperature, and
wherein the transistor is formed at a temperature lower than the first temperature.

11. The peeling method according to claim 1,
wherein the resin layer is formed to have a thickness greater than or equal to 0.1 µm and less than or equal to 3 µm.

12. The peeling method according to claim 1,
wherein the silicon layer is irradiated with light from the formation substrate side using the laser.

13. A method for manufacturing a flexible device comprising:
separating the transistor and the formation substrate from each other using the peeling method according to claim 1, to expose the conductive layer; and
electrically connecting the conductive layer and a circuit board to each other through the opening of the resin layer.

14. A method for manufacturing a flexible device comprising:
separating the transistor and the formation substrate from each other using the peeling method according to claim 1, to expose the silicon layer;
removing the silicon layer by etching to expose the conductive layer; and
electrically connecting the conductive layer and a circuit board to each other through the opening of the resin layer.

15. A method for manufacturing a flexible device comprising:
separating the transistor and the formation substrate from each other using the peeling method according to claim 2, to expose the silicon layer; and
electrically connecting the silicon layer and a circuit board to each other.

16. The peeling method according to claim 2,
wherein the first layer is formed using a thermosetting material.

17. The peeling method according to claim 16,
wherein the resin layer is formed by heating the first layer at a first temperature, and
wherein the transistor is formed at a temperature lower than the first temperature.

18. The peeling method according to claim 2,
wherein the resin layer is formed to have a thickness greater than or equal to 0.1 µm and less than or equal to 3 µm.

19. The peeling method according to claim 2,
wherein the silicon layer is irradiated with light from the formation substrate side using the laser.

20. A method for manufacturing a flexible device comprising:
separating the transistor and the formation substrate from each other using the peeling method according to claim 2, to expose the conductive layer; and
electrically connecting the conductive layer and a circuit board to each other through the opening of the resin layer.

21. A method for manufacturing a semiconductor device comprising:
forming a silicon layer over a substrate;
forming a resin layer over the silicon layer;
forming an opening in a portion of the resin layer, the portion overlapping with the silicon layer;
forming a transistor including an oxide semiconductor over the resin layer;

forming a conductive layer in the opening of the resin layer;

irradiating the resin layer with light using a laser from a substrate side; and separating at least the transistor and the substrate from each other.

22. The method for manufacturing a semiconductor device according to claim 21, wherein the resin layer is formed to a thickness greater than a thickness of the silicon layer.

23. The method for manufacturing a semiconductor device according to claim 21, wherein a linear laser is used as the laser.

24. The method for manufacturing a semiconductor device according to claim 21, wherein the conductive layer is formed using a same material as a source electrode or a drain electrode included in the transistor.

25. The method for manufacturing a semiconductor device according to claim 21, wherein the resin layer is formed using a thermosetting material.

26. The method for manufacturing a semiconductor device according to claim 25, wherein the resin layer is formed by heating at a first temperature, and wherein the transistor is formed at a second temperature lower than the first temperature.

\* \* \* \* \*